(12) United States Patent
Chen et al.

(10) Patent No.: US 12,283,485 B2
(45) Date of Patent: Apr. 22, 2025

(54) CUT METAL GATE REFILL WITH VOID

(71) Applicant: Taiwan Semiconductor Manufacturing Co., Ltd., Hsinchu (TW)

(72) Inventors: Ting-Gang Chen, Taipei (TW); Wan-Hsien Lin, Hsinchu (TW); Chieh-Ping Wang, Taichung (TW); Tai-Chun Huang, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 148 days.

(21) Appl. No.: 17/872,623

(22) Filed: Jul. 25, 2022

(65) Prior Publication Data
US 2022/0359206 A1    Nov. 10, 2022

Related U.S. Application Data

(62) Division of application No. 16/837,607, filed on Apr. 1, 2020, now Pat. No. 11,532,479.

(51) Int. Cl.
| H01L 27/088 | (2006.01) |
| H01L 21/28 | (2006.01) |
| H01L 21/764 | (2006.01) |
| H01L 21/8238 | (2006.01) |
| H01L 23/535 | (2006.01) |
| H01L 27/092 | (2006.01) |

(Continued)

(52) U.S. Cl.
CPC ...... *H01L 21/28123* (2013.01); *H01L 21/764* (2013.01); *H01L 21/823821* (2013.01); *H01L 21/823828* (2013.01); *H01L 21/823871* (2013.01); *H01L 21/823878* (2013.01); *H01L 23/535* (2013.01); *H01L 27/0924* (2013.01); *H01L 29/0653* (2013.01); *H01L 29/66545* (2013.01)

(58) Field of Classification Search
None
See application file for complete search history.

(56) References Cited

U.S. PATENT DOCUMENTS

| 9,496,372 B2 | 11/2016 | Lin et al. |
| 10,854,514 B2 | 12/2020 | Wu et al. |

(Continued)

FOREIGN PATENT DOCUMENTS

| DE | 102018124814 A1 | 5/2019 |
| DE | 102018115901 A1 | 1/2020 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A gate stack can be etched to form a trench extending through the gate stack, the trench removing a portion of the gate stack to separate the gate stack into a first gate stack portion and a second gate stack portion. A dielectric material is deposited in the trench to form a dielectric region, the dielectric region having an air gap in the dielectric material. The air gap may extend upward from beneath the gate stack to an area interposed between the end of the first gate stack portion and the end of the second gate stack portion. Contacts to the first gate stack portion and contacts to the second gate stack portion may be formed which are electrically isolated from each other by the dielectric material and air gap formed therein.

18 Claims, 49 Drawing Sheets

(51) Int. Cl.
  *H01L 29/06* (2006.01)
  *H01L 29/66* (2006.01)

(56) References Cited

U.S. PATENT DOCUMENTS

| | | |
|---|---|---|
| 12,094,877 B2 | 9/2024 | Hsueh et al. |
| 2017/0040318 A1 | 2/2017 | Hung et al. |
| 2017/0125411 A1 | 5/2017 | Yu et al. |
| 2018/0097059 A1 | 4/2018 | Bi et al. |
| 2019/0103284 A1 | 4/2019 | Yu et al. |
| 2019/0131298 A1 | 5/2019 | Chen et al. |
| 2019/0148215 A1 | 5/2019 | Chang et al. |
| 2019/0252245 A1 | 8/2019 | Chen et al. |
| 2019/0305099 A1 | 10/2019 | Jo et al. |
| 2019/0334008 A1 | 10/2019 | Chen et al. |
| 2019/0378903 A1 | 12/2019 | Jeon et al. |
| 2020/0013875 A1 | 1/2020 | Chen et al. |
| 2020/0027981 A1 | 1/2020 | Park et al. |
| 2020/0043796 A1 | 2/2020 | Yeong et al. |
| 2020/0075423 A1 | 3/2020 | Kwok et al. |
| 2021/0035971 A1 | 2/2021 | Park et al. |
| 2021/0035972 A1 | 2/2021 | Park et al. |
| 2021/0242192 A1 | 8/2021 | Wang et al. |
| 2021/0280469 A1 | 9/2021 | Lee et al. |
| 2023/0261112 A1 | 8/2023 | Yang et al. |

FOREIGN PATENT DOCUMENTS

| | | |
|---|---|---|
| DE | 102019115481 A1 | 1/2020 |
| KR | 20160038673 A | 4/2016 |
| KR | 20180053803 A | 5/2018 |
| KR | 20190002301 A | 1/2019 |
| KR | 20190013404 A | 2/2019 |
| KR | 20190049339 A | 5/2019 |
| KR | 20190112910 A | 10/2019 |
| KR | 20190140647 A | 12/2019 |
| TW | 201725701 | 7/2017 |
| TW | 202002280 A | 1/2020 |

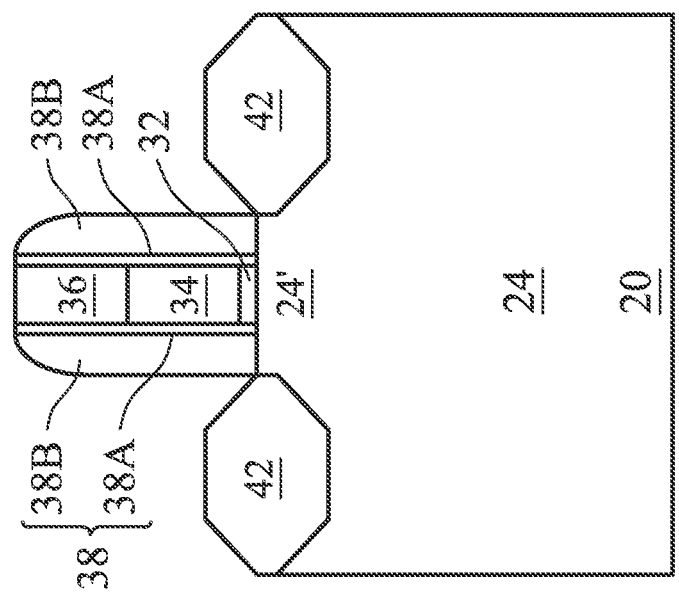
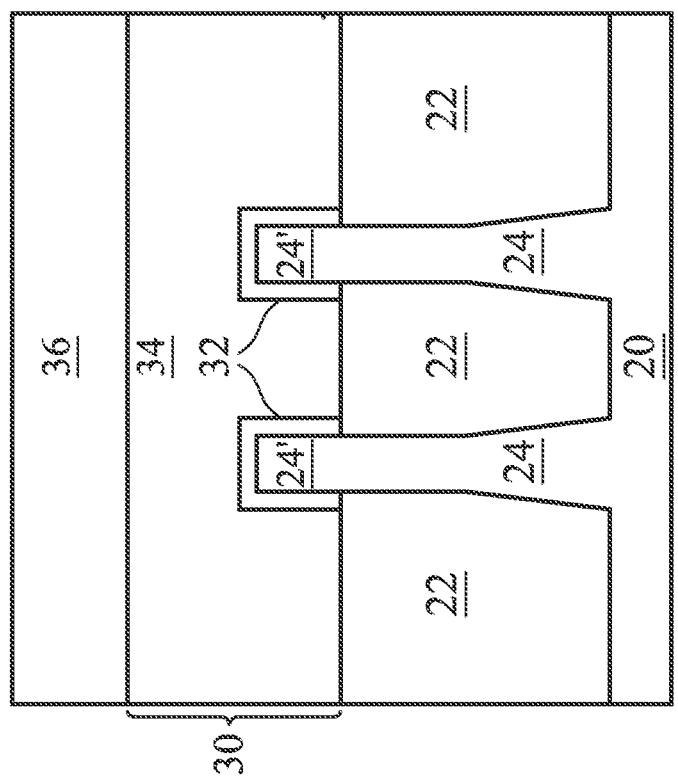
Figure 12B
Figure 12A

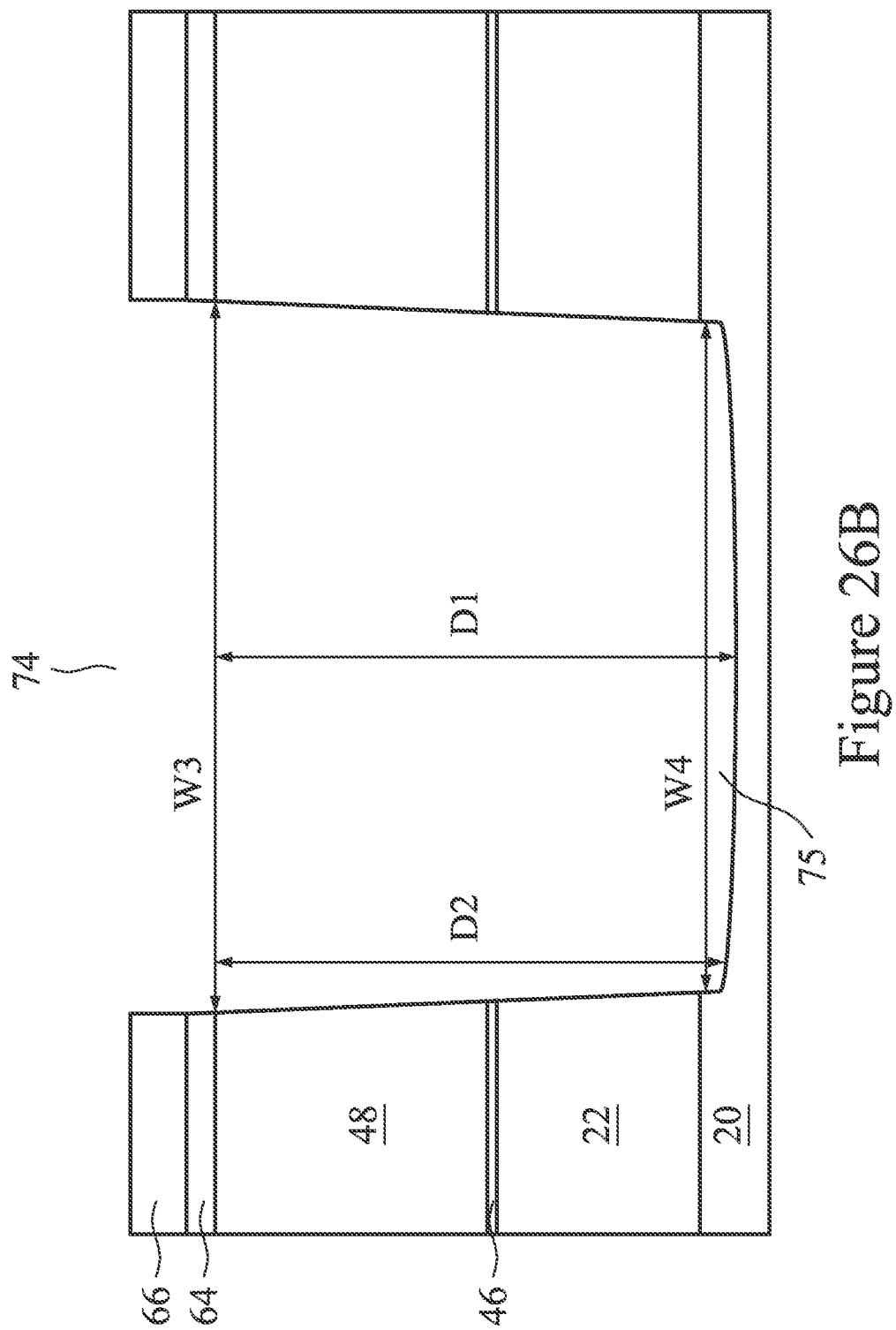

CUT METAL GATE REFILL WITH VOID

PRIORITY CLAIM AND CROSS-REFERENCE

This patent is a divisional of U.S. application Ser. No. 16/837,607, filed on Apr. 1, 2020, which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 9, 10A through 13B, 14, 15A, 15B, 16, 17A, 17B, 18, 19A, 19B, 20, 21A, 21B, 22, 23, 24A through 27C, 28, 29A through 30D, 31B, 31C, and 32 through 34 illustrate various views of intermediate stages in the manufacturing of FinFETs, in accordance with some embodiments.

DETAILED DESCRIPTION

Figure 1:
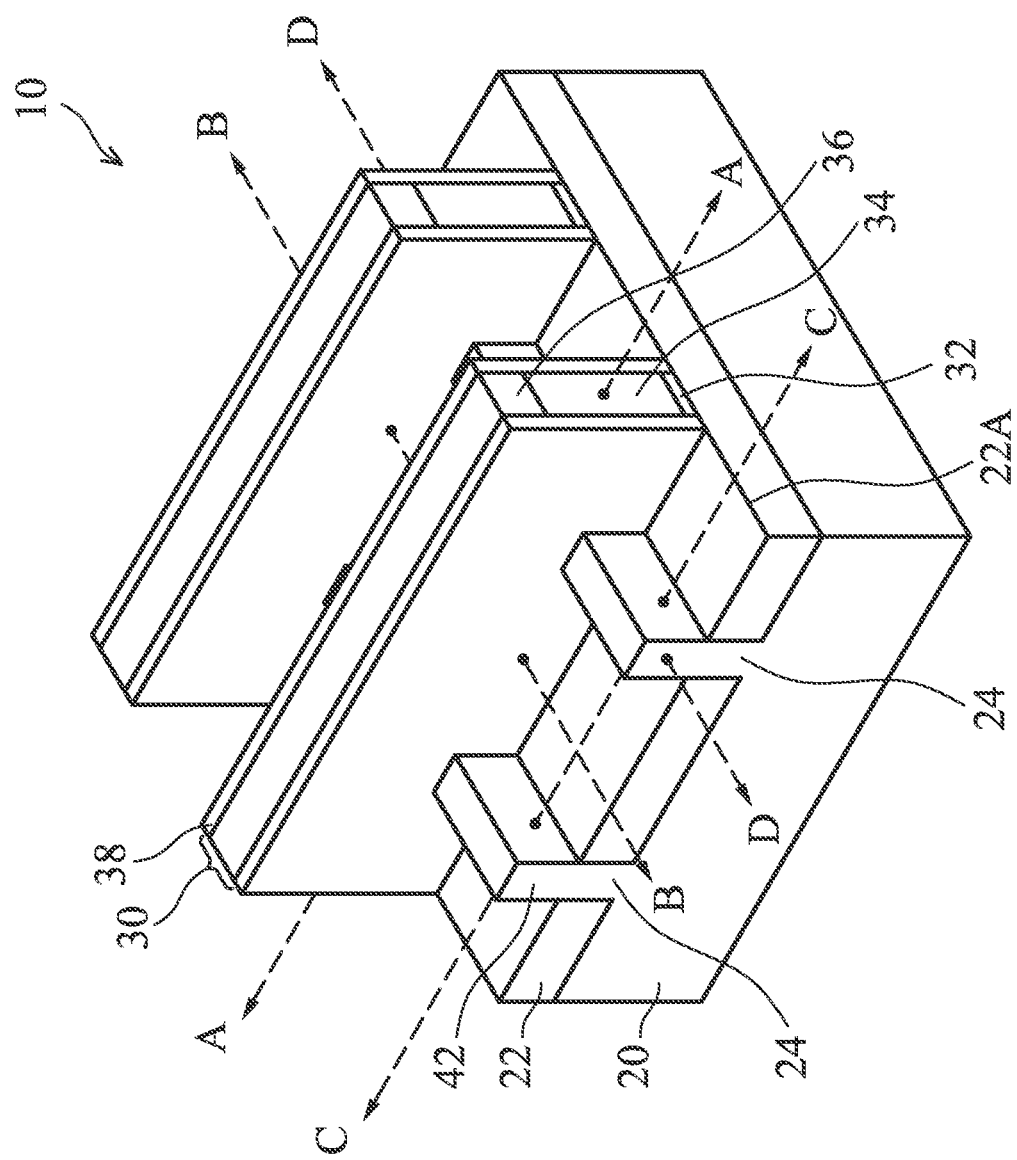
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FinFET devices can be formed by forming semiconductor strips (i.e., fins) from a substrate and forming a gate over and perpendicular to the semiconductor strips. These semiconductor strips or gates may subsequently be cut into various lengths or sizes to provide different FinFET transistors based on particular design needs. Rather than cut a dummy gate prior to replacing the dummy gate with a replacement gate, embodiment processes use a gate cutting technique which cuts a replacement gate (e.g., a metal gate) to form distinct gates over different adjacent FinFET transistors. As technology advances and the sizes of the FinFET structures decrease, leakage between the cut replacement gates may become more problematic due to the decreased spacing between the cut ends of the gate. To help prevent or to reduce current leakage from one gate to another, embodiments form a dielectric material between the two cut gates which has an air gap or void disposed between the ends of the cut gates. The air gap provides enhanced insulating capabilities over the dielectric material and as a result the leakage current from one gate to the other gate is reduced.

FIG. 1 illustrates an example of a FinFET in a three-dimensional view, in accordance with some embodiments. The FinFET comprises a fin 24 on a substrate 20 (e.g., a semiconductor substrate). Isolation regions 22 are disposed in the substrate 20, and the fin 24 protrudes above and from between neighboring isolation regions 22. Although the isolation regions 22 are described/illustrated as being separate from the substrate 20, as used herein the term "substrate" may be used to refer to just the semiconductor substrate or a semiconductor substrate inclusive of isolation regions. Additionally, the fin 24 may be a single continuous material, or the fin 24 and/or the substrate 20 may comprise a plurality of materials. In this context, the fin 24 refers to the portion extending between the neighboring isolation regions 22.

A gate dielectric layer 32 is along sidewalls and over a top surface of the fin 24, and a gate electrode 34 is over the gate dielectric layer 32. In this illustration, the gate electrode 34 and gate dielectric layer 32 may be dummies, and may be replaced in with a replacement gate in a subsequent process. A mask 36 is over the gate electrode 34. Epitaxial source/drain regions 42 are disposed in opposite sides of the fin 24 with respect to the gate dielectric layer 32 and gate electrode 34. The gate dielectric layer 32 and gate electrode 34, along with any interfacial layers (not shown) are taken together as the gate stack 30. A gate spacer 38 disposed on either side of the gate stack 30 between the gate stack 30 and the epitaxial source/drain regions 42. FIG. 1 further illustrates reference cross-sections that are used in later figures. Cross-section A-A is along a longitudinal axis of the gate electrode 34 and in a direction, for example, perpendicular to the direction of current flow between the epitaxial source/drain regions 42 of the FinFET. Cross-section B-B is perpendicular to cross-section A-A and is along a longitudinal axis of the fin 24 and in a direction of, for example, a current flow between the epitaxial source/drain regions 42 of the FinFET. Cross-section C-C is parallel to cross-section A-A and extends through an epitaxial source/drain region 42 of the FinFET. Cross section D-D is parallel to cross-section B-B and extends across gate stacks 30 but between neighboring epitaxial source/drain regions 42 of the FinFET on the same side of the gate electrode 34. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 3:
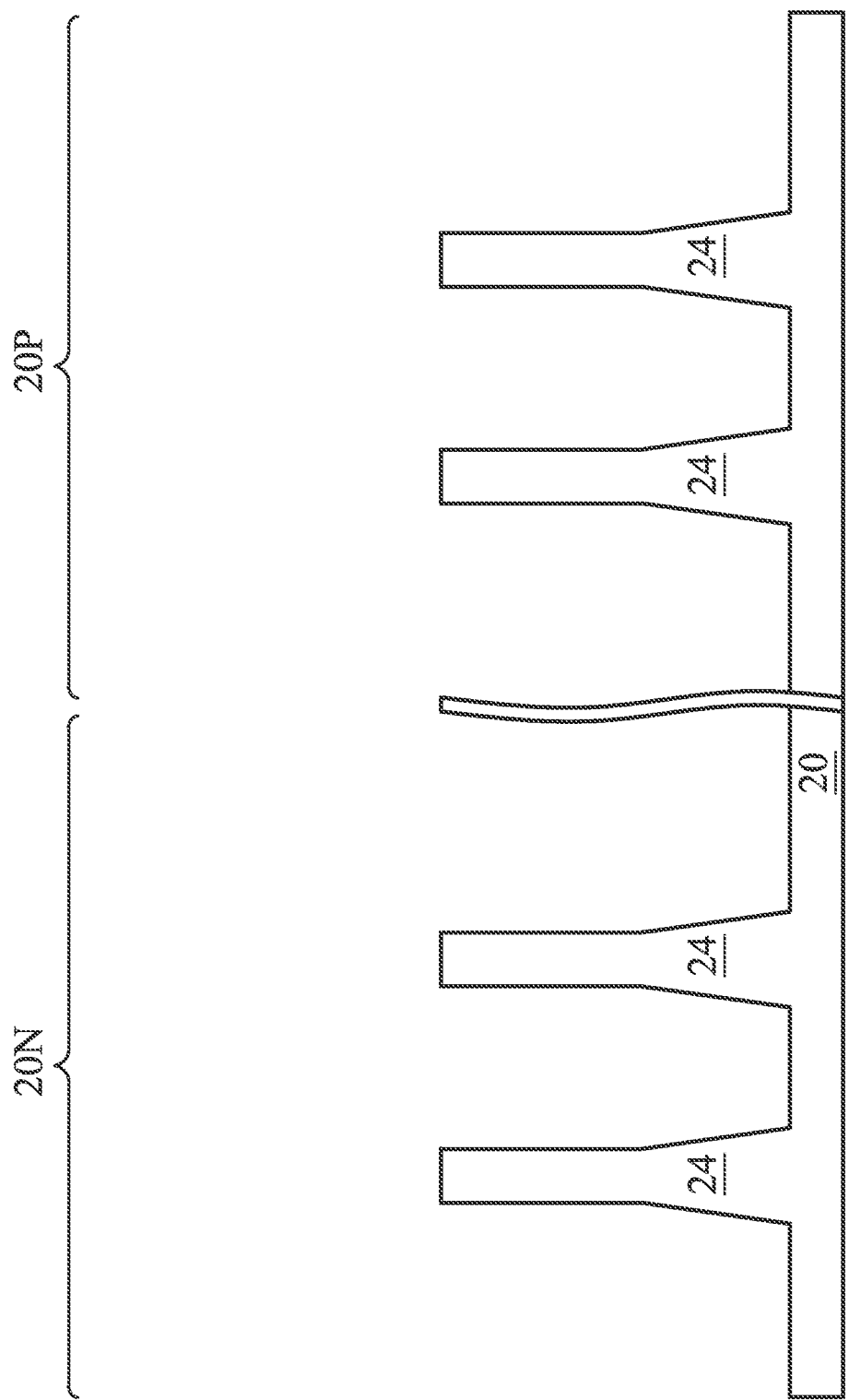
Figure 4:
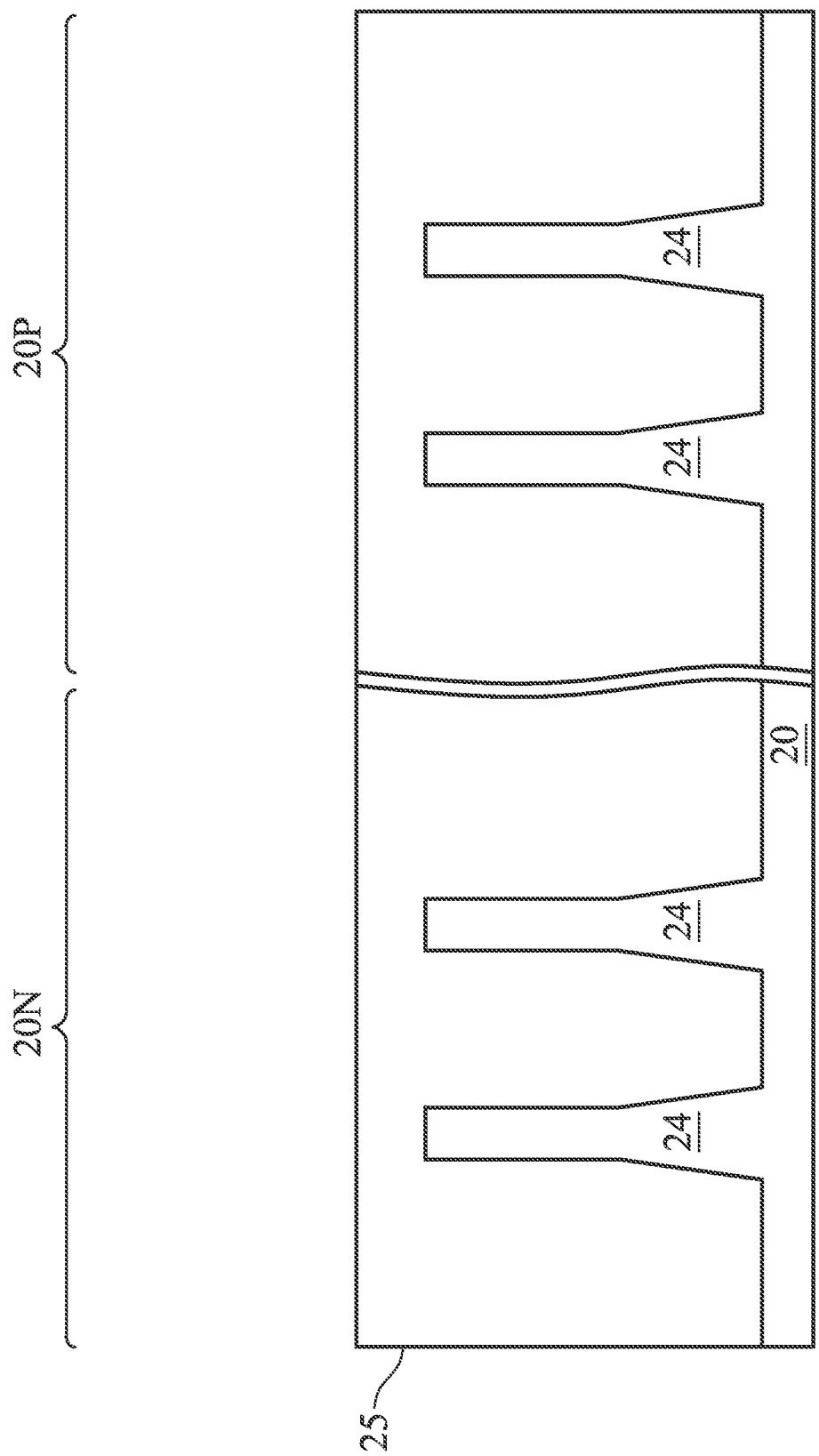
Figure 5:
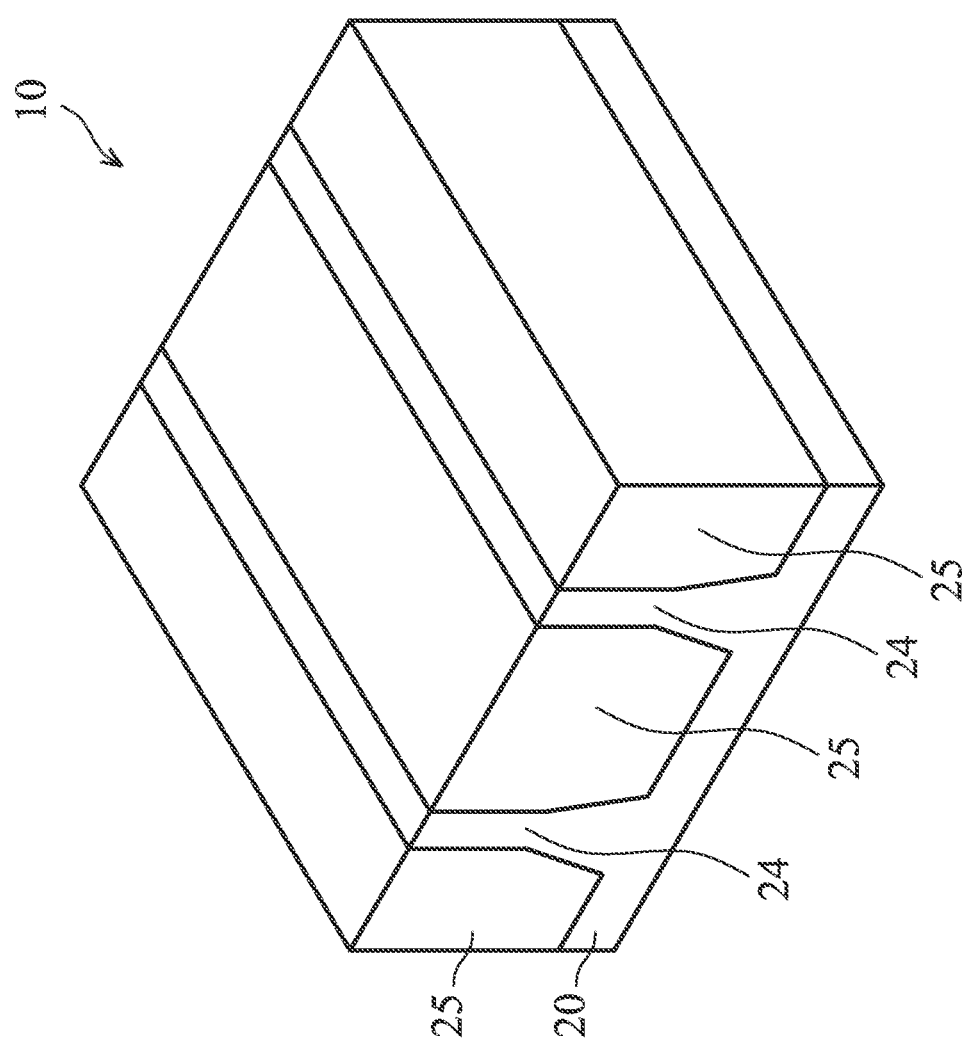
Figure 6:
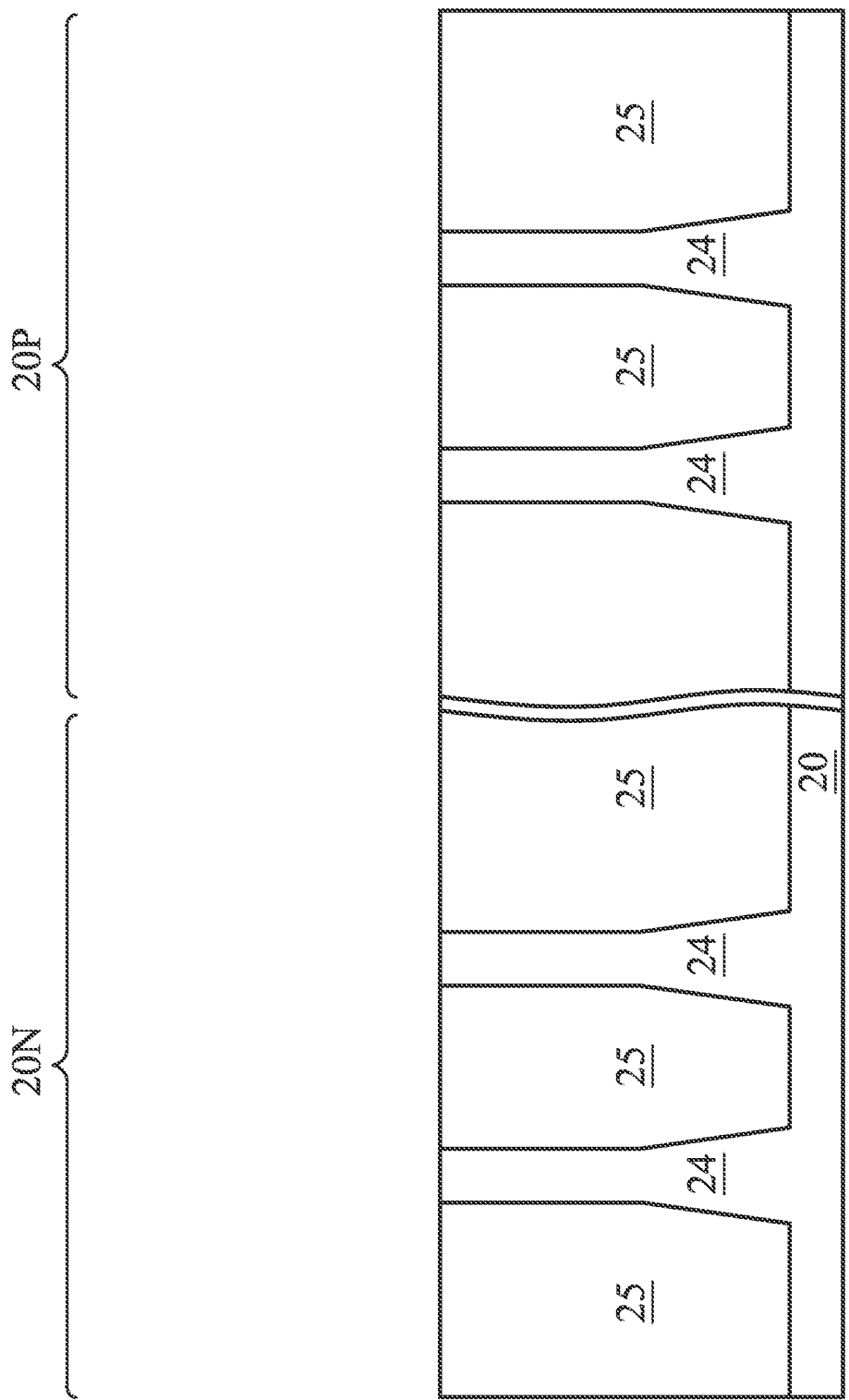
Figure 7:
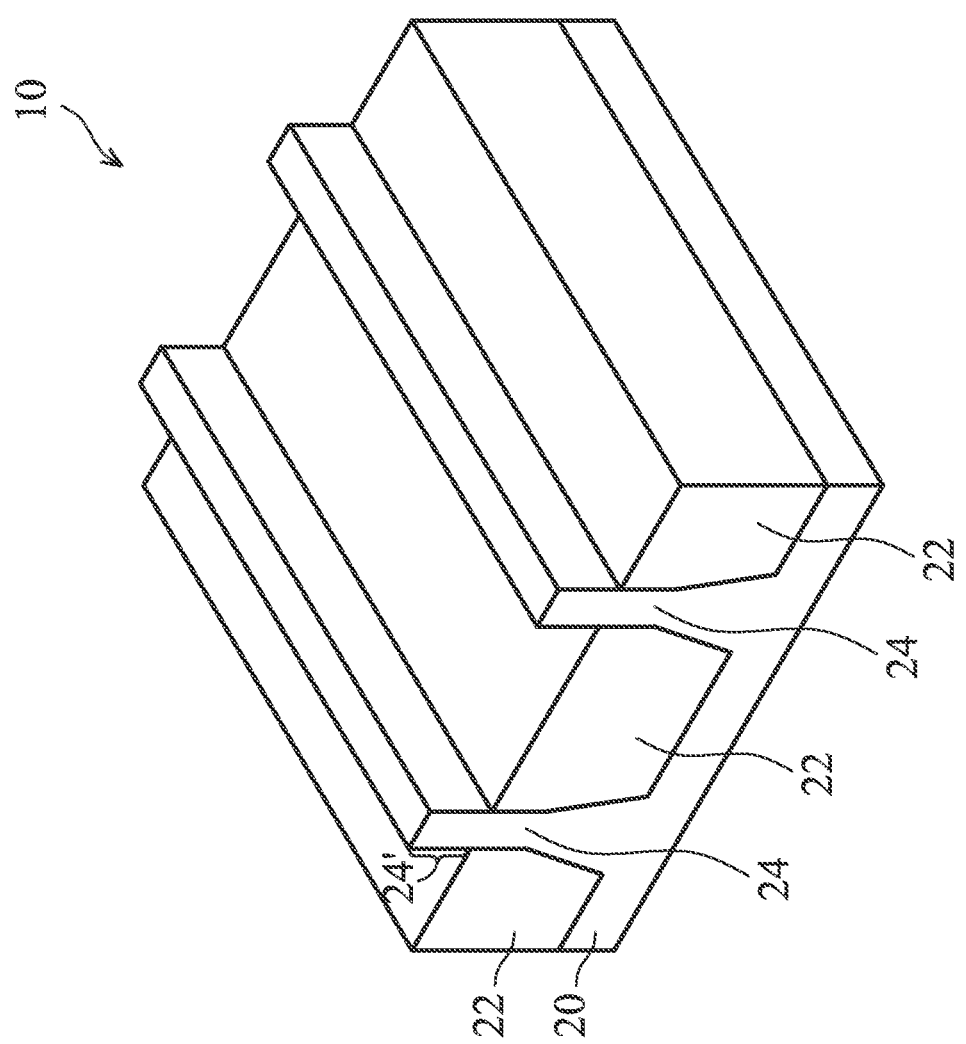

FIGS. 2 through 8 are various views of intermediate stages in the manufacturing of FinFETs through a the process forming fins in a substrate, in accordance with some embodiments. With reference to FIG. 1 for the cross-section defined by the line A-A, FIGS. 2, 3, 4, 6, and 8 illustrate a cross-section along the line A-A. FIGS. 5 and 7 are perspective views.

Figure 2:
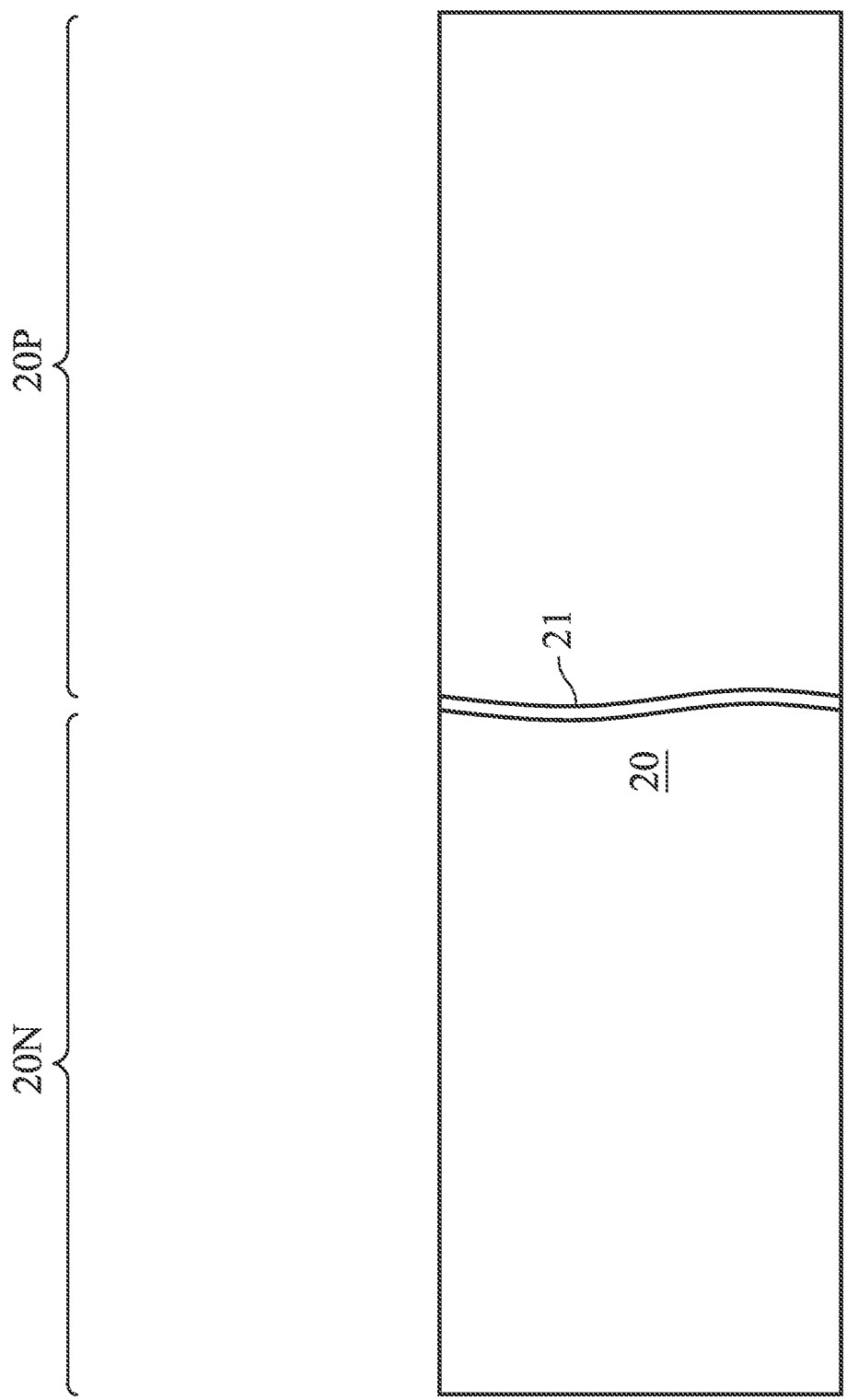

In FIG. 2, a substrate 20 is provided. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 20 has a region 20N and a region 20P. The region 20N can be for forming n-type devices, such as NMOS transistors, e.g., n-type FinFETs. The region 20P can be for forming p-type devices, such as PMOS transistors, e.g., p-type FinFETs. The region 20N may be physically separated from the region 20P (as illustrated by divider 21), and any number of device features (e.g., other active devices, doped regions, isolation structures, etc.) may be disposed between the region 20N and the region 20P.

In FIG. 3, fins 24 are formed in the substrate 20. The fins 24 are semiconductor strips. In some embodiments, the fins 24 may be formed in the substrate 20 by etching trenches in the substrate 20. The etching may be any acceptable etch process, such as a reactive ion etch (RIE), neutral beam etch (NBE), the like, or a combination thereof. The etch may be anisotropic.

The fins 24 may be patterned by any suitable method. For example, the fins 24 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 24.

In FIG. 4, an insulation material 25 is formed over the substrate 20 and between neighboring fins 24. The insulation material 25 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 25 is silicon oxide formed by a FCVD process. An anneal process may be performed once the insulation material is formed. In an embodiment, the insulation material 25 is formed such that excess insulation material 25 covers the fins 24. Although the insulation material 25 is illustrated as a single layer, some embodiments may utilize multiple layers. For example, in some embodiments a liner (not shown) may first be formed along a surface of the substrate 20 and the fins 24. Thereafter, a fill material, such as those discussed above may be formed over the liner.

FIG. 5 illustrates a perspective view which may be applicable for either region 20N or region 20P. FIG. 6 illustrates a cross-sectional view of the structure shown in FIG. 5, with the cross-sectional view obtained from the plane containing line A-A as illustrated in FIG. 1. In FIGS. 5 and 6, a removal process is applied to the insulation material 25 to remove excess insulation material 25 over the fins 24. In some embodiments, a planarization process such as a chemical mechanical polish (CMP), an etch-back process, combinations thereof, or the like may be utilized. The planarization process exposes the fins 24 such that top surfaces of the fins 24 and the insulation material 25 are level after the planarization process is complete. In embodiments in which a mask remains on the fins 24, the planarization process may expose the mask or remove the mask such that top surfaces of the mask or the fins 24, respectively, and the insulation material 25 are level after the planarization process is complete.

Figure 8:
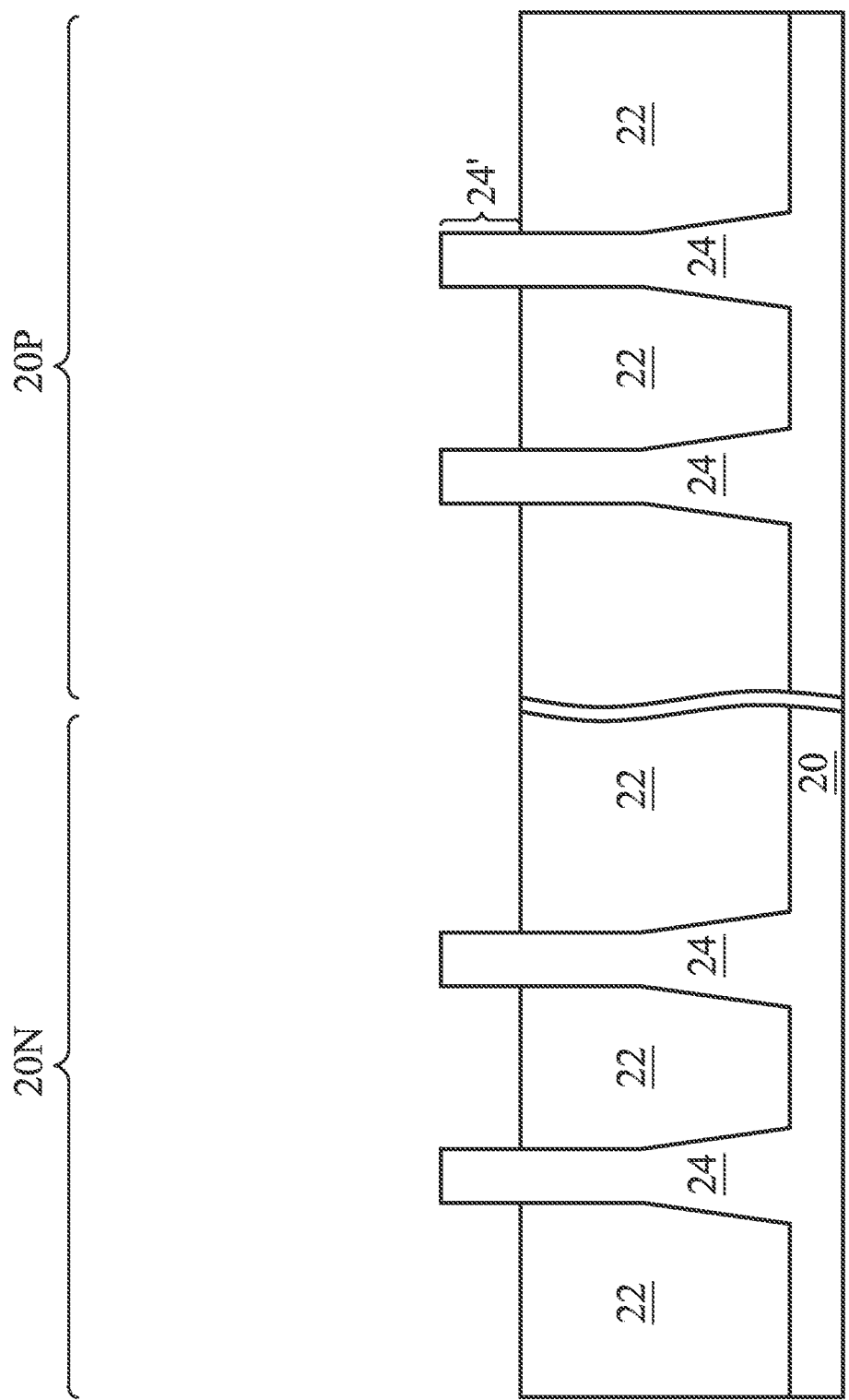

FIG. 7 illustrates a perspective view which may be applicable for either region 20N or region 20P. FIG. 8 illustrates a cross-sectional view of the structure shown in FIG. 7, with the cross-sectional view obtained from the plane containing line A-A as illustrated in FIG. 1. In FIGS. 7 and 8, the insulation material 25 is recessed to form Shallow Trench Isolation (STI) regions (isolation regions 22). The insulation material 25 is recessed such that upper portions (channel region 24') of fins 24 in the region 50N and in the region 50P protrude from between neighboring isolation regions 22. Further, the top surfaces of the isolation regions 22 may have a flat surface as illustrated, a convex surface, a concave surface (such as dishing), or a combination thereof. The top surfaces of the isolation regions 22 may be formed flat, convex, and/or concave by an appropriate etch. The isolation regions 22 may be recessed using an acceptable etching process, such as one that is selective to the material of the insulation material 25 (e.g., etches the material of the insulation material 25 at a faster rate than the material of the fins 24). For example, an oxide removal using, for example, dilute hydrofluoric (dHF) acid may be used.

The process described with respect to FIGS. 2 through 8 is just one example of how the fins 24 may be formed. In some embodiments, the fins 24 may be formed by an epitaxial growth process. For example, a dielectric layer can be formed over a top surface of the substrate 20, and trenches can be etched through the dielectric layer to expose the underlying substrate 20. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 24. For example, the fins 24 in FIGS. 7 through 8 can be recessed, and a material different from the fins 24 may be epitaxially grown over the recessed fins 24. In such embodiments, the fins 24 comprise the recessed material as well as the epitaxially grown material disposed over the recessed material. In an even further embodiment, a dielectric layer can be formed over a top surface of the substrate 20, and trenches can be etched through the dielectric layer. Heteroepitaxial structures can then be epitaxially grown in the trenches using a material different from the substrate 20, and the dielectric layer can be recessed such that the heteroepitaxial structures protrude from the dielectric layer to form the fins 24. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 20N (e.g., an NMOS region) different from the material in region 20P (e.g., a PMOS region). In various embodiments, upper portions of the fins 24 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 8, appropriate wells (not shown) may be formed in the fins 24 and/or the substrate 20. In some embodiments, a P well may be formed in the region 20N, and an N well may be formed in the region 20P. In some embodiments, a P well or an N well are formed in both the region 20N and the region 20P.

In the embodiments with different well types, the different implant steps for the region 20N and the region 20P may be achieved using a photoresist or other masks (not shown). For example, a photoresist may be formed over the fins 24 and the isolation regions 22 in the region 20N. The photoresist is patterned to expose the region 20P of the substrate 20, such as a PMOS region. The photoresist can be formed by using a spin-on technique and can be patterned using acceptable photolithography techniques. Once the photoresist is patterned, an n-type impurity implant is performed in the region 20P, and the photoresist may act as a mask to substantially prevent n-type impurities from being implanted into the region 20N, such as an NMOS region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the region 20P, a photoresist is formed over the fins 24 and the isolation regions 22 in the region 20P. The photoresist is patterned to expose the region 20N of the substrate 20, such as the NMOS region. The photoresist can be formed by using a spin-on technique and can be patterned using acceptable photolithography techniques. Once the photoresist is patterned, a p-type impurity implant may be performed in the region 20N, and the photoresist may act as a mask to substantially prevent p-type impurities from being implanted into the region 20P, such as the PMOS region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the region 20N and the region 20P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

FIGS. 9 through 34 illustrate various additional intermediate stages in the manufacturing of FinFET devices, in accordance with some embodiments. FIGS. 9 through 34 illustrate features in either of the region 20N and the region 20P and each will not be separately illustrated. Differences (if any) in the structures of the region 20N and the region 20P are described in the text accompanying each figure. With reference to FIG. 1 for the cross-sections defined by the lines A-A, B-B, C-C, and D-D, FIGS. 10A, 12A, 15A, 17A, 19A, 21A, 24A, 25A, 26A, 27A, 29A, and 30A illustrate a cross-section along the line A-A. FIGS. 24B, 25B, 26B, 27B, 29B, 30B, and 31B illustrate a cross-section along the line B-B. FIGS. 13A, 13B, 24C, 25C, 26C, 27C, 29C, 30C, and 31C illustrate a cross-section along the line C-C. FIGS. 10B, 12B, 15B, 17B, 19B, 21B, and 30D illustrate a cross-section along the line D-D.

Figure 9:
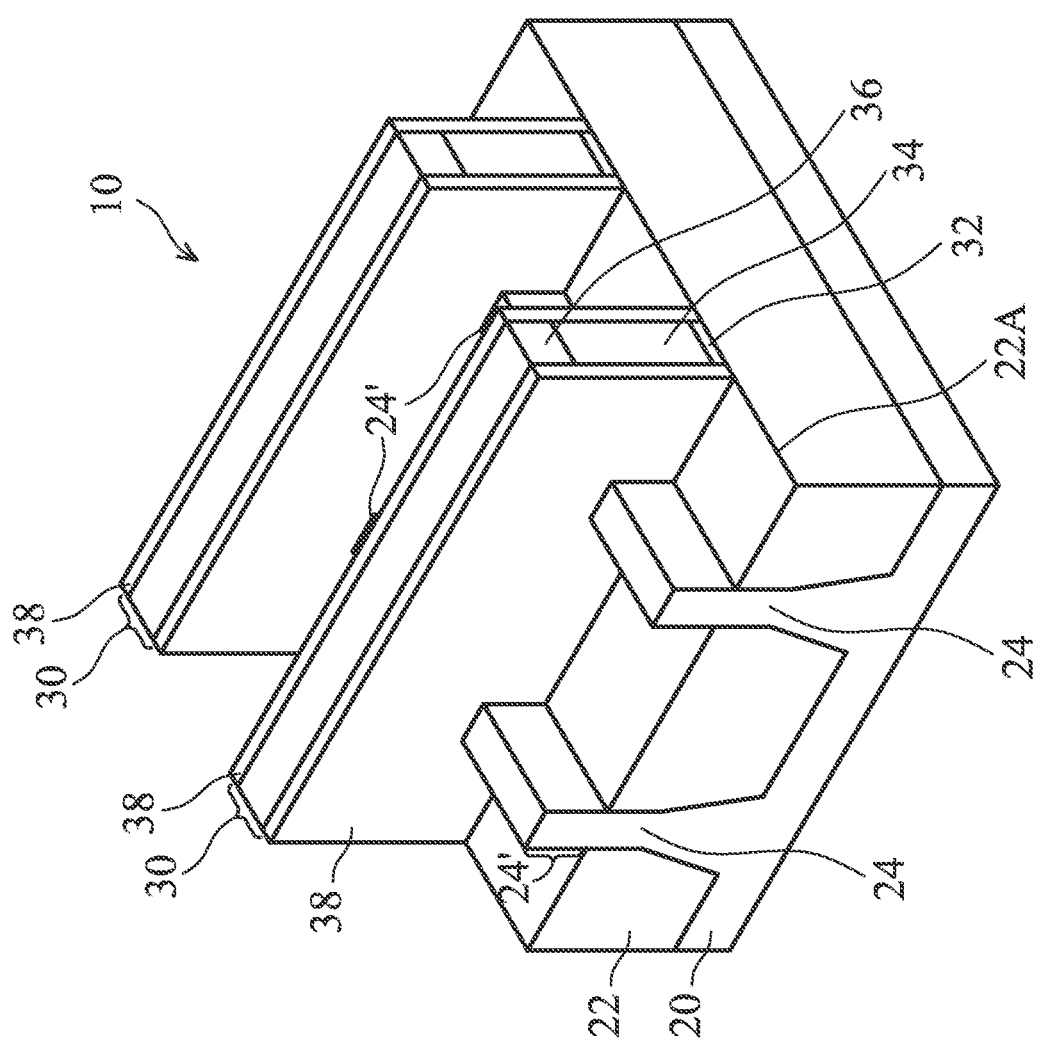
Figure 10B:
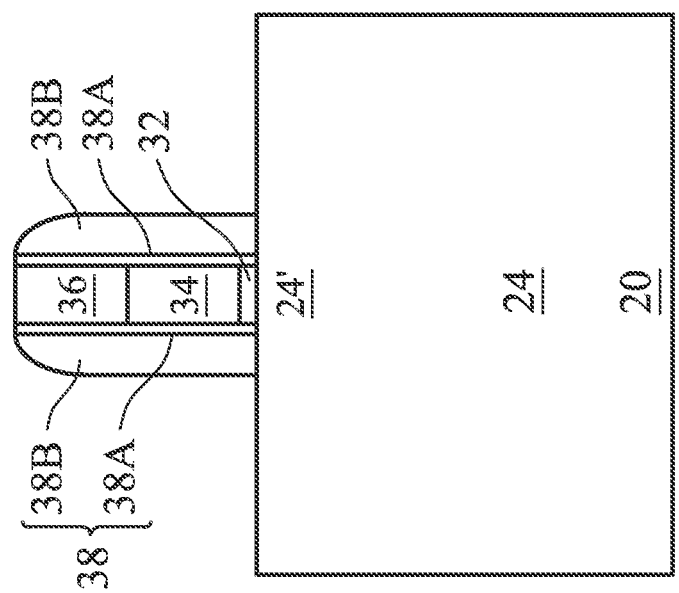
Figure 10A:
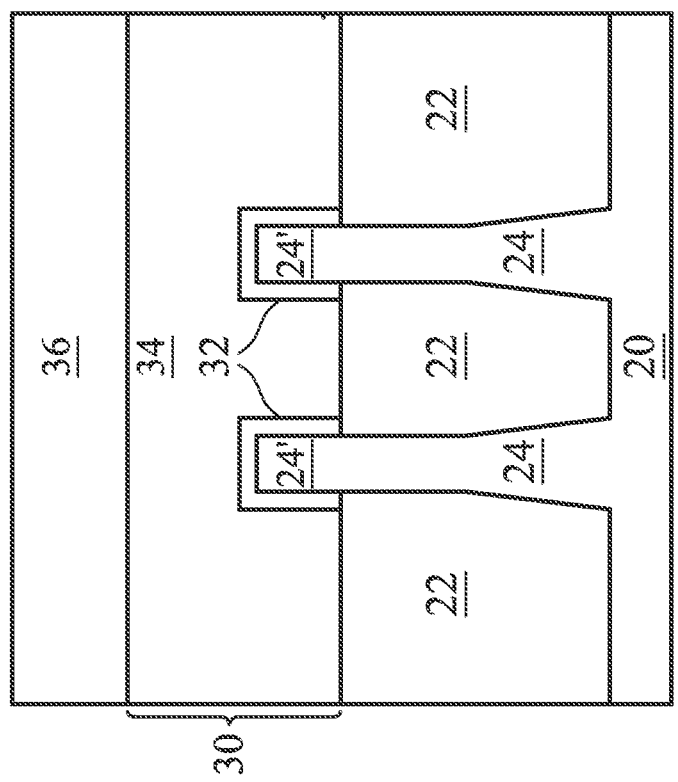

FIG. 10A illustrates a cross-sectional view of the structure shown in FIG. 9, with the cross-sectional view obtained from the plane containing line A-A as illustrated in FIG. 1. FIG. 10B illustrates a cross-sectional view of the structure shown in FIG. 9, with the cross-sectional view obtained from the plane containing line D-D as illustrated in FIG. 1. In FIGS. 9, 10A, and 10B, a dummy dielectric layer is formed on the fins 24. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The mask layer may be patterned using acceptable photolithography and etching techniques to form masks 36. The pattern of the masks 36 then may be transferred to the dummy gate layer to form dummy gates 34. In some embodiments (not illustrated), the pattern of the masks 36 may also be transferred to the dummy dielectric layer by an acceptable etching technique to form gate dielectric layer 32. Together the gate dielectric layer 32 and dummy gates 34 form dummy gate stacks 30. The dummy gate stacks 30 cover respective channel regions 24' of the fins 24. The pattern of the masks 36 may be used to physically separate each of the dummy gate stacks 30 from adjacent dummy gate stacks. The dummy gate stacks 30 may also have a lengthwise direction substantially perpendicular to the lengthwise direction of respective epitaxial fins 24.

The dummy gates 34 may be a conductive or non-conductive material and may be selected from a group including amorphous silicon, polycrystalline-silicon (poly-silicon), poly-crystalline silicon-germanium (poly-SiGe), metallic nitrides, metallic silicides, metallic oxides, and metals. The dummy gates 34 formed from the dummy gate layer may be deposited by physical vapor deposition (PVD), CVD, sputter deposition, or other techniques known and used in the art for depositing the selected material. The dummy gates 34 may be made of other materials that have a high etching selectivity from the etching of isolation regions 22. The mask 36 formed from the mask layer may include, for example, silicon nitride, silicon oxynitride, or the like. In some embodiments, a single dummy gate layer and a single mask layer are formed across the region 20N and the region 20P. In other embodiments, each region 20N and region 20P may have their own independent dummy gate layer and mask layer. It is noted that the gate dielectric layer 32 is shown covering only the fins 24 for illustrative purposes only.

Also in FIGS. 9, 10A, and 10B, gate seal spacers 38A can be formed on exposed surfaces of the dummy gates stacks 30, the masks 36, and/or the fins 24 (the channel regions 24'). A thermal oxidation or a deposition followed by an anisotropic etch may form the gate seal spacers 38A. The gate seal spacers 38A may be formed of silicon oxide, silicon nitride, silicon oxynitride, or the like.

After the formation of the gate seal spacers 38A, implants for lightly doped source/drain (LDD) regions (not explicitly illustrated) may be performed. In the embodiments with different device types, similar to the implants discussed above with respect to FIGS. 7 and 8, a mask, such as a photoresist, may be formed over the region 20N, while exposing the region 20P, and appropriate type (e.g., p-type) impurities may be implanted into the exposed channel regions 24' in the region 20P. The mask may then be removed. Subsequently, a mask, such as a photoresist, may be formed over the region 20P while exposing the region 20N, and appropriate type impurities (e.g., n-type) may be implanted into the exposed channel regions 24' in the region 20N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Also in FIGS. 9, 10A, and 10B, gate spacers 38B are formed on the gate seal spacers 38A along sidewalls of the dummy gates stacks 30 and the masks 36. The gate spacers 38B may be formed by conformally depositing an insulating material and subsequently anisotropically etching the insulating material. The insulating material of the gate spacers 38B may be silicon oxide, silicon nitride, silicon oxynitride, silicon carbonitride, a combination thereof, or the like.

The gate seal spacers 38A and gate spacers 38B may, for simplicity, together be referred to as gate spacers 38. It is noted that the above disclosure generally describes a process of forming spacers and LDD regions. Other processes and sequences may be used. For example, fewer or additional spacers may be utilized, different sequence of steps may be utilized (e.g., the gate seal spacers 38A may not be etched prior to forming the gate spacers 38B, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 38A while the LDD regions for p-type devices may be formed after forming the gate seal spacers 38A.

Figure 11:
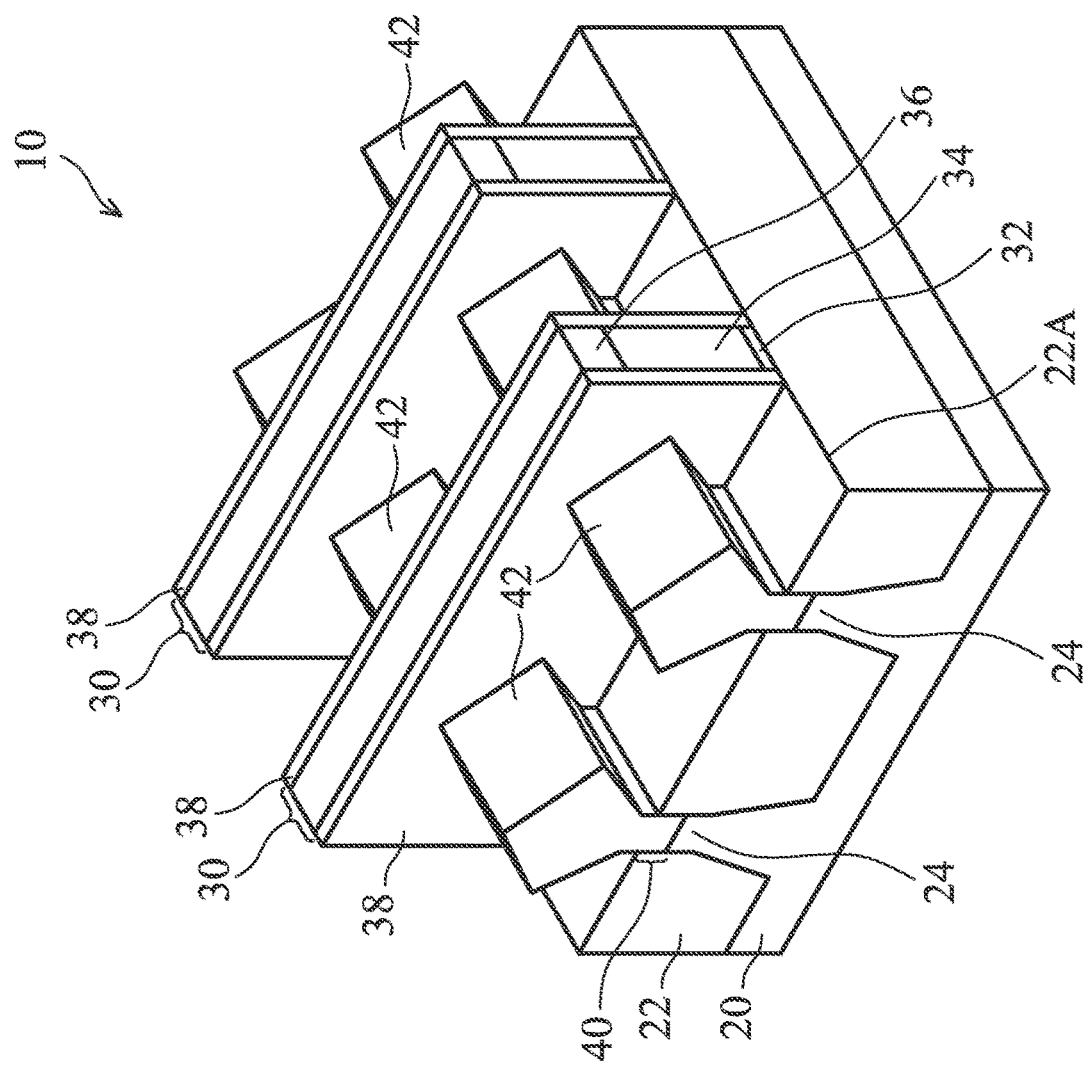
Figure 13B:
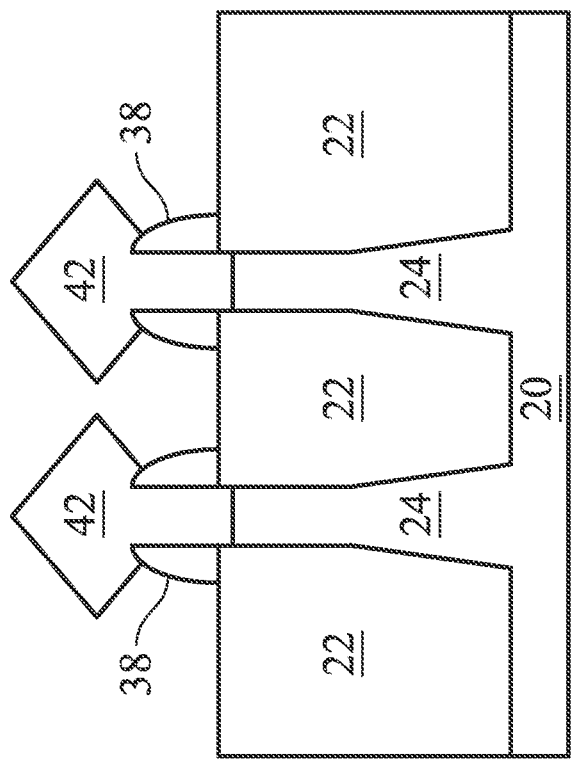
Figure 13A:
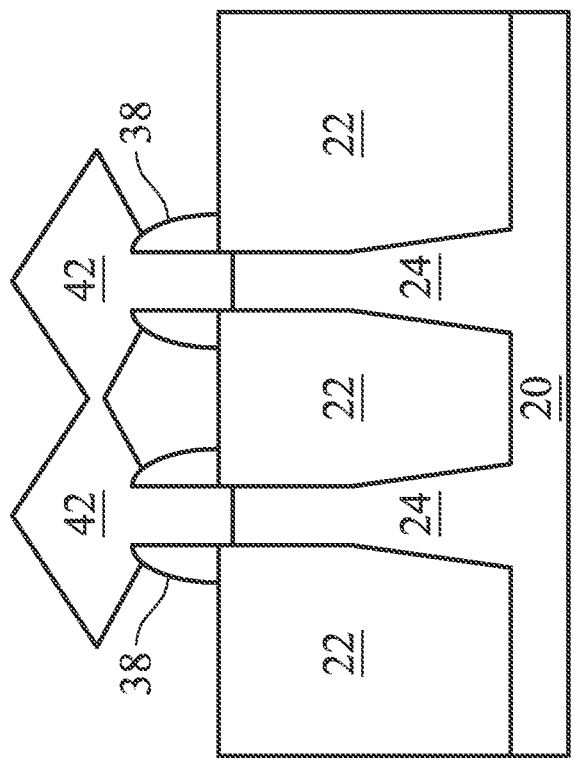

FIG. 12A illustrates a cross-sectional view of the structure shown in FIG. 11, with the cross-sectional view obtained from the plane containing line A-A as illustrated in FIG. 1. FIG. 12B illustrates a cross-sectional view of the structure shown in FIG. 11, with the cross-sectional view obtained from the plane containing line D-D as illustrated in FIG. 1. FIGS. 13A and 13B illustrate cross-sectional views of the structure shown in FIG. 11 obtained from the plane containing line C-C as illustrated in FIG. 1. In FIGS. 11, 12A, 12B, 13A, and 13B epitaxial source/drain regions 42 are formed in the fins 24 to exert stress in the respective channel regions 24', thereby improving performance. The epitaxial source/drain regions 42 are formed in the fins 24 such that each dummy gate stack 30 is disposed between respective neighboring pairs of the epitaxial source/drain regions 42. In some embodiments the epitaxial source/drain regions 42 may extend into, and may also penetrate through, the fins 24. In some embodiments, the gate spacers 38 are used to separate the epitaxial source/drain regions 42 from the dummy gate stacks 30 by an appropriate lateral distance so that the epitaxial source/drain regions 42 do not short out subsequently formed gates of the resulting FinFETs.

The epitaxial source/drain regions 42 in the region 20N, e.g., the NMOS region, may be formed by masking the region 20P, e.g., the PMOS region, and etching source/drain regions of the fins 24 in the region 20N to form recesses in the fins 24. Then, the epitaxial source/drain regions 42 in the region 20N are epitaxially grown in the recesses. The epitaxial source/drain regions 42 may include any acceptable material, such as appropriate for n-type FinFETs. For example, if the fin 24 is silicon, the epitaxial source/drain regions 42 in the region 20N may include materials exerting a tensile strain in the channel region 24', such as silicon, silicon carbide, phosphorous doped silicon carbide, silicon phosphide, or the like. The epitaxial source/drain regions 42 in the region 20N may have surfaces raised from respective surfaces of the fins 24 and may have facets.

The epitaxial source/drain regions 42 in the region 20P, e.g., the PMOS region, may be formed by masking the region 20N, e.g., the NMOS region, and etching source/drain regions of the fins 24 in the region 20P are etched to form recesses in the fins 24. Then, the epitaxial source/drain regions 42 in the region 20P are epitaxially grown in the recesses. The epitaxial source/drain regions 42 may include any acceptable material, such as appropriate for p-type FinFETs. For example, if the fin 24 is silicon, the epitaxial source/drain regions 42 in the region 20P may comprise materials exerting a compressive strain in the channel region 24', such as silicon-germanium, boron doped silicon-germanium, germanium, germanium tin, or the like. The epitaxial source/drain regions 42 in the region 20P may also have surfaces raised from respective surfaces of the fins 24 and may have facets.

The epitaxial source/drain regions 42 and/or the fins 24 may be implanted with dopants to form source/drain regions, similar to the process previously discussed for forming lightly-doped source/drain regions, followed by an anneal. The epitaxial source/drain regions 42 may have an impurity concentration of between about $10^{19}$ cm$^{-3}$ and about $10^{21}$ cm$^{-3}$. The n-type and/or p-type impurities for epitaxial source/drain regions 42 may be any of the impurities previously discussed. In some embodiments, the epitaxial source/drain regions 42 may be in situ doped during growth.

As a result of the epitaxy processes used to form the epitaxial source/drain regions 42 in the region 20N and the region 20P, upper surfaces of the epitaxial source/drain regions have facets which expand laterally outward beyond sidewalls of the fins 24. In some embodiments, these facets cause adjacent epitaxial source/drain regions 42 of a same FinFET to merge as illustrated by FIG. 13A. In other embodiments, adjacent epitaxial source/drain regions 42 remain separated after the epitaxy process is completed as illustrated by FIG. 13B. In the embodiments illustrated in FIGS. 13A and 13B, gate spacers 38 are formed covering a portion of the sidewalls of the fins 24 (the channel region 24') that extend above the STI regions 22 thereby blocking the epitaxial growth. In some other embodiments, the spacer etch used to form the gate spacers 38 may be adjusted to remove the spacer material to allow the epitaxially source/drain regions 42 to extend to the surface of the isolation regions 22.

Figure 14:
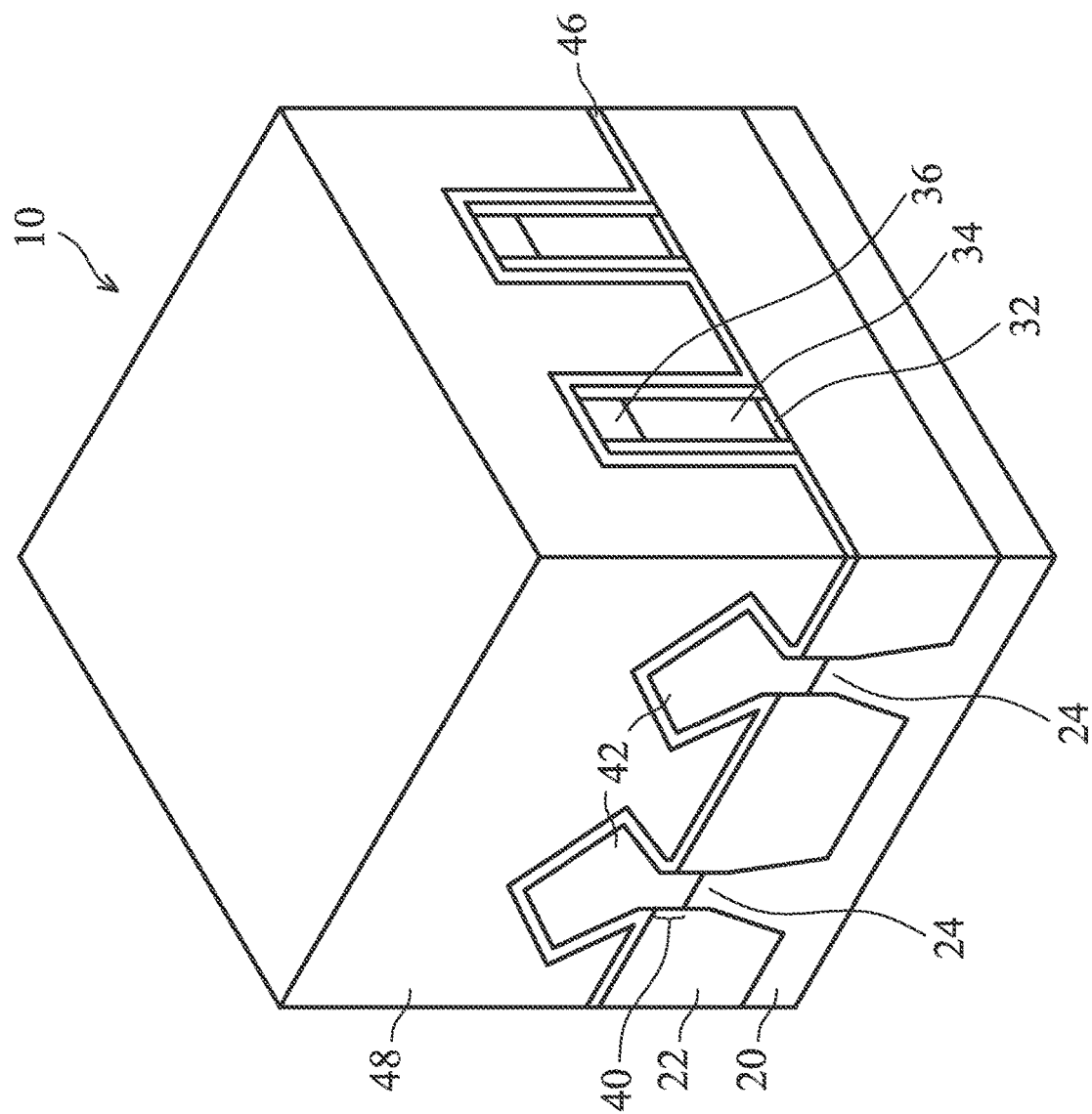
Figure 15B:
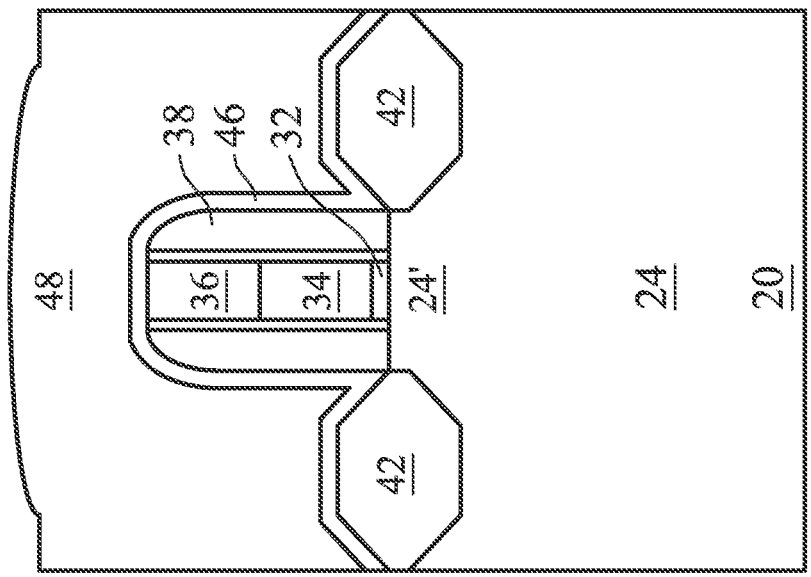
Figure 15A:
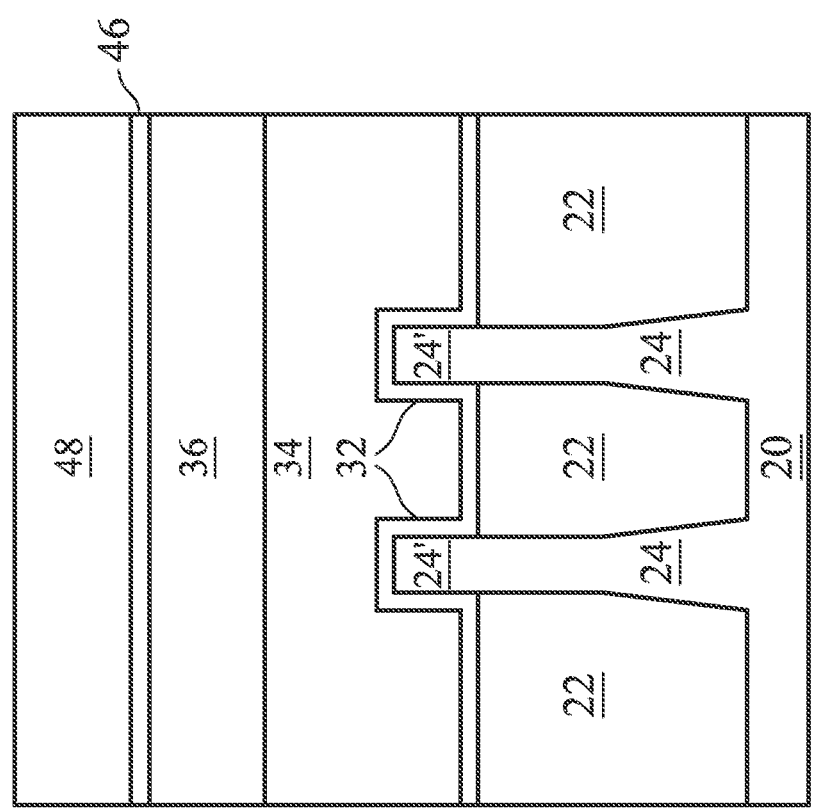

FIG. 15A illustrates a cross-sectional view of the structure shown in FIG. 14, with the cross-sectional view obtained from the plane containing line A-A as illustrated in FIG. 1. FIG. 15B illustrates a cross-sectional view of the structure shown in FIG. 14, with the cross-sectional view obtained from the plane containing line D-D as illustrated in FIG. 1. In FIGS. 14, 15A, and 15B, a first interlayer dielectric (ILD) 48 is deposited over the structure illustrated in FIGS. 11, 12A, and 12B. The first ILD 48 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 46 is disposed between the first ILD 48 and the epitaxial source/drain regions 42, the masks 36, and the gate spacers 38. The CESL 46 may comprise a dielectric material, such as, silicon nitride, silicon oxide, silicon oxynitride, or the like, having a different etch rate than the material of the overlying the first ILD 48.

Figure 16:
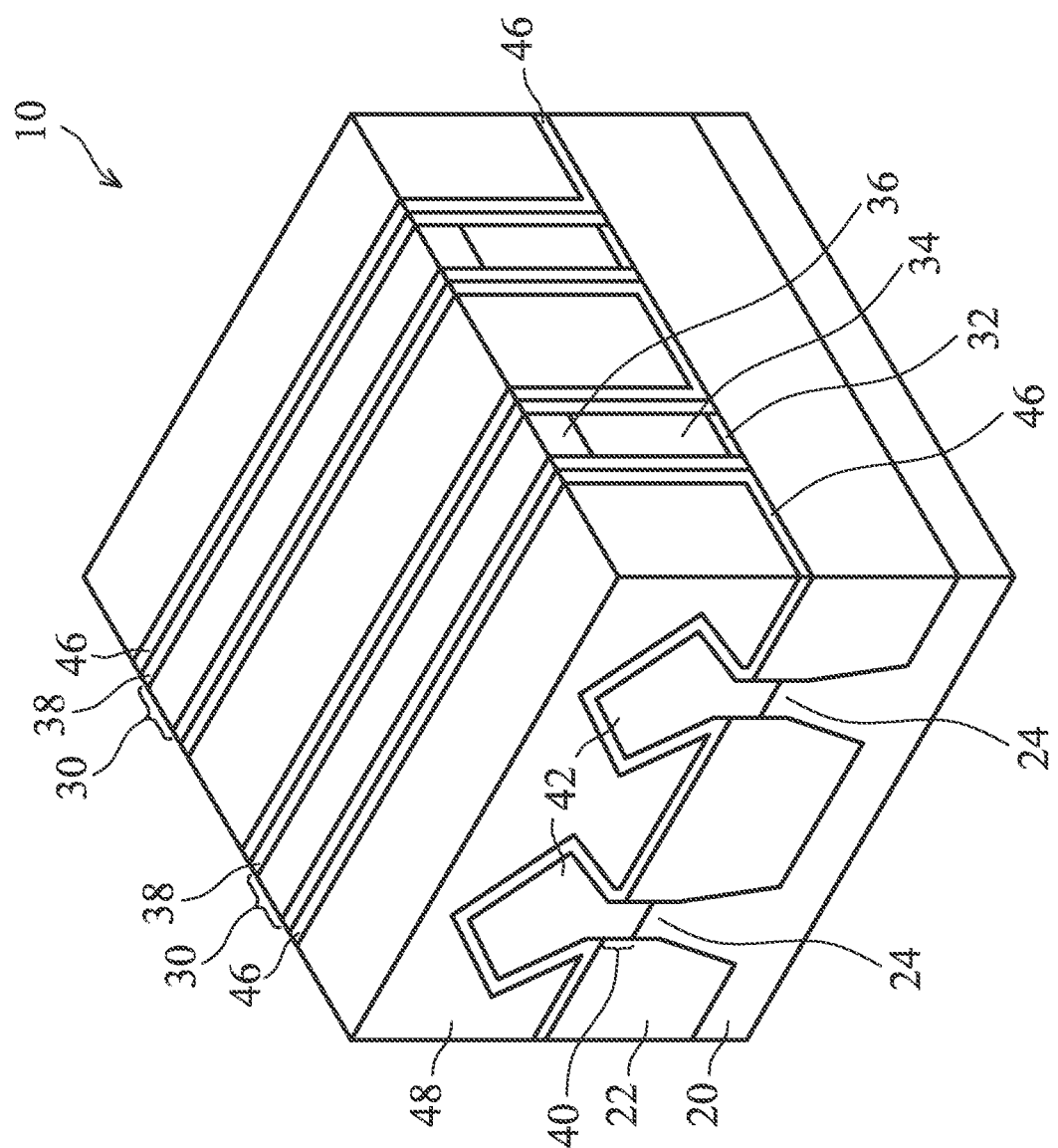
Figure 17B:
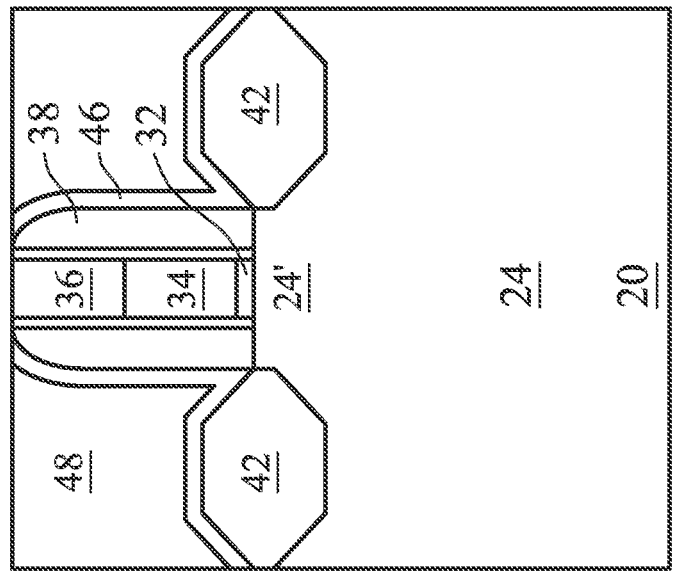
Figure 17A:
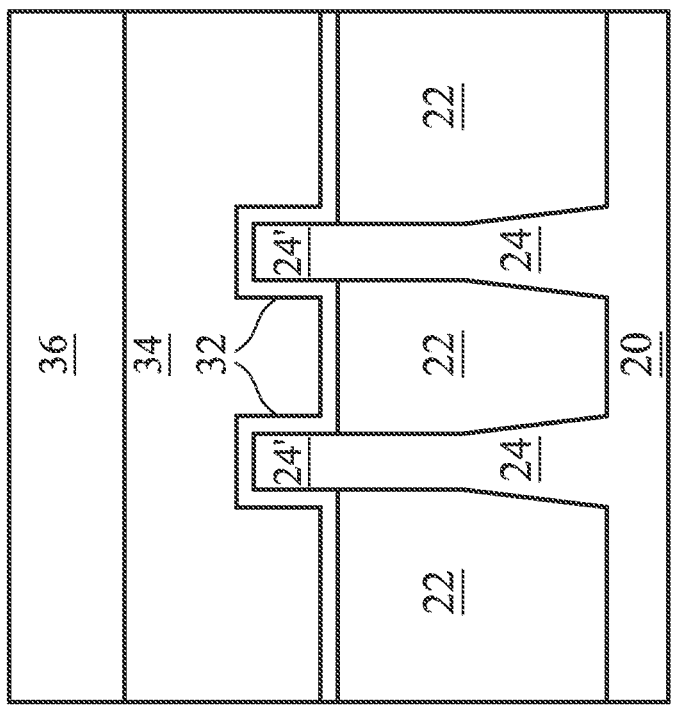

FIG. 17A illustrates a cross-sectional view of the structure shown in FIG. 16, with the cross-sectional view obtained from the plane containing line A-A as illustrated in FIG. 1. FIG. 17B illustrates a cross-sectional view of the structure shown in FIG. 16, with the cross-sectional view obtained from the plane containing line D-D as illustrated in FIG. 1. In FIGS. 16, 17A, and 17B, a planarization process, such as a CMP, may be performed to level the top surface of the first ILD 48 with the top surfaces of the dummy gate stacks 30 or the masks 36 (as shown, for example, in FIG. 17). The planarization process may also remove the masks 36 (or a portion thereof) on the dummy gate stacks 30, and portions of the gate spacers 38 along sidewalls of the masks 36. After the planarization process, the masks 36 may remain, in which case top surfaces of the masks 36, top surfaces of the gate spacers 38, and the top surface of the first ILD 48 are leveled with each other. In some embodiments, top surfaces of the dummy gate stacks 30, the gate spacers 38, and the first ILD 48 are levelled as a result of the planarization process. In such embodiments, the top surfaces of the dummy gates 72 are exposed through the first ILD 48.

Figure 18:
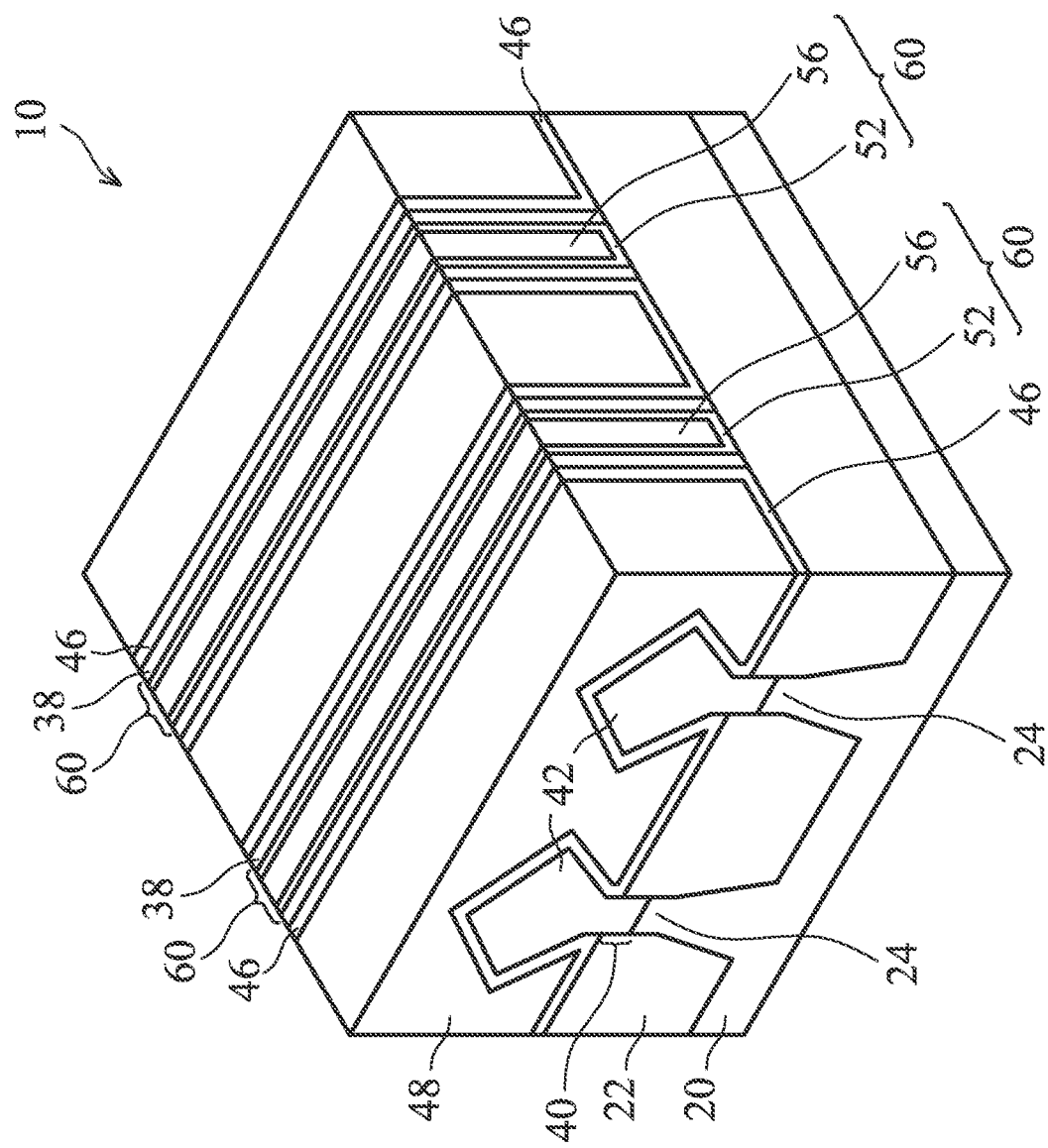
Figure 19B:
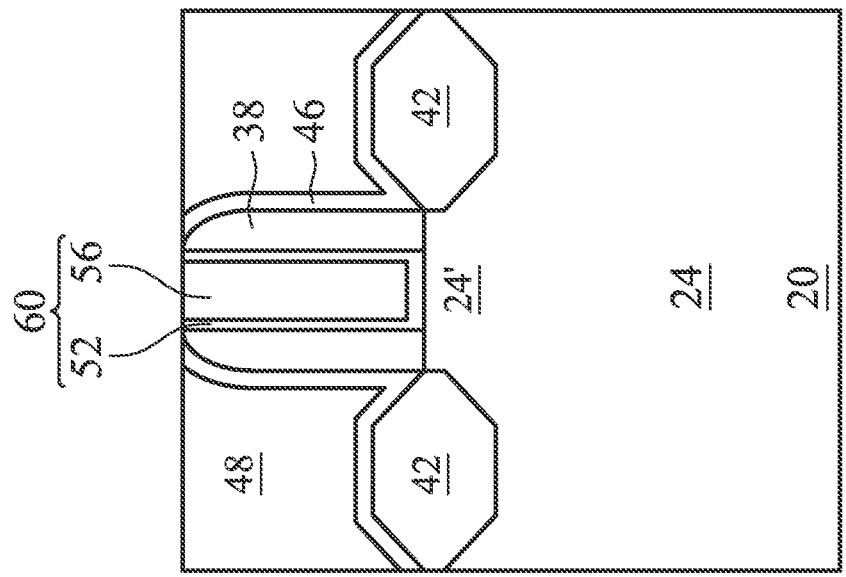
Figure 19A:
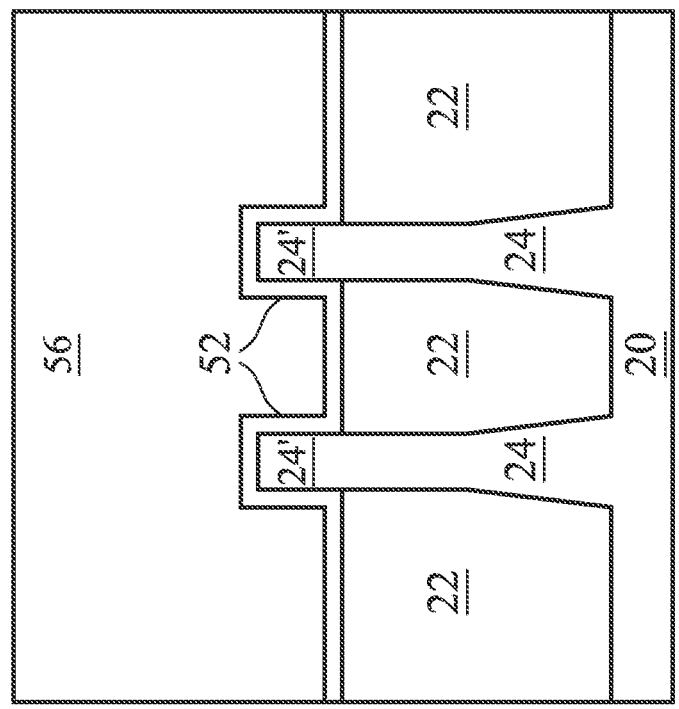

FIG. 19A illustrates a cross-sectional view of the structure shown in FIG. 18, with the cross-sectional view obtained from the plane containing line A-A as illustrated in FIG. 1. FIG. 19B illustrates a cross-sectional view of the structure shown in FIG. 18, with the cross-sectional view obtained from the plane containing line D-D as illustrated in FIG. 1. FIGS. 18, 19A, and 19B illustrate a gate replacement process. The dummy gates 34, the masks 36 if present, and optionally the gate dielectric layer 32, are removed in an etching step(s) and replaced with replacement gates. In some embodiments, the masks 36 if present and dummy gates 34 are removed by an anisotropic dry etch process. For example, the etching process may include a dry etch process using reaction gas(es) that selectively etch the masks 36 and then the dummy gates 34 without etching the first ILD 48 or the gate spacers 38. Each recess exposes and/or overlies a channel region 24' of a respective fin 24 (the upper portion of the fin 24). Each channel region 24' is disposed between neighboring pairs of the epitaxial source/drain regions 42. During the removal, the gate dielectric layer 32 may be used as an etch stop layer when the dummy gates 34 are etched. The gate dielectric layer 32 may then be optionally removed after the removal of the dummy gates 34.

Next, gate dielectric layers 52 and gate electrodes 56 are formed for replacement gates 60. Gate dielectric layers 52 are deposited conformally in the recesses, such as on the top surfaces and the sidewalls of the fins 24 and on sidewalls of the gate spacers 38. The gate dielectric layers 52 may also be formed on the top surface of the first ILD 48. In accordance with some embodiments, the gate dielectric layers 52 comprise silicon oxide, silicon nitride, or multi-layers thereof. In some embodiments, the gate dielectric layers 52 may include a high-k dielectric material, and in these embodiments, the gate dielectric layers 52 may have a k value greater than about 7.0, and may include a metal oxide or a silicate of hafnium, aluminum, zirconium, lanthanum, manganese, barium, titanium, lead, and combinations thereof. The formation methods of the gate dielectric layers 52 may include Molecular-Beam Deposition (MBD), ALD, PECVD, and the like. In embodiments where portions of the gate dielectric layer 32 remains in the recesses, the gate dielectric layers 52 include a material of the gate dielectric layer 32 (e.g., silicon oxide).

The gate electrodes 56 are deposited over the gate dielectric layers 52, respectively, and fill the remaining portions of the recesses. The gate electrodes 56 may include a metal-containing material such as titanium nitride, titanium oxide, tantalum nitride, tantalum carbide, cobalt, ruthenium, aluminum, tungsten, combinations thereof, or multi-layers thereof. For example, although the gate electrode 56 is illustrated in FIG. 19 as having a single layer, the gate electrode 56 may comprise any number of liner layers, any number of work function tuning layers, and a fill material, all together illustrated as gate electrode 56. After the filling of the recesses, a planarization process, such as a CMP, may be performed to remove the excess portions of the gate dielectric layers 52 and the material of the gate electrodes 56, which excess portions are over the top surface of the first ILD 48. The remaining portions of material of the gate dielectric layers 52 and the gate electrodes 56 thus form replacement gates of the resulting FinFETs. The gate electrodes 56 and the gate dielectric layers 52 of the replacement gates may be collectively referred to as gate stack 60. The gate stacks may extend along sidewalls of a channel region 24' of the fins 24.

The formation of the gate dielectric layers 52 in the region 20N and the region 20P may occur simultaneously such that the gate dielectric layers 52 in each region are formed from the same materials, and the formation of the gate electrodes 56 may occur simultaneously such that the gate electrodes 56 in each region are formed from the same materials. In some embodiments, the gate dielectric layers 52 in each region may be formed by distinct processes, such that the gate dielectric layers 52 may be different materials, and/or the gate electrodes 56 in each region may be formed by distinct processes, such that the gate electrodes 56 may be different materials. Various masking steps may be used to mask and expose appropriate regions when using distinct processes. Gate electrodes 56 may include a plurality of layers including, and not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal. Some of these layers define the work function of the respective FinFET. Furthermore, the metal layers of a p-type FinFET and the metal layers of an n-type FinFET may be different from each other, so that the work functions of the metal layers are suitable for the respective p-type or n-type Fin-FETs. The fill material may include aluminum, tungsten, or cobalt.

Figure 20:
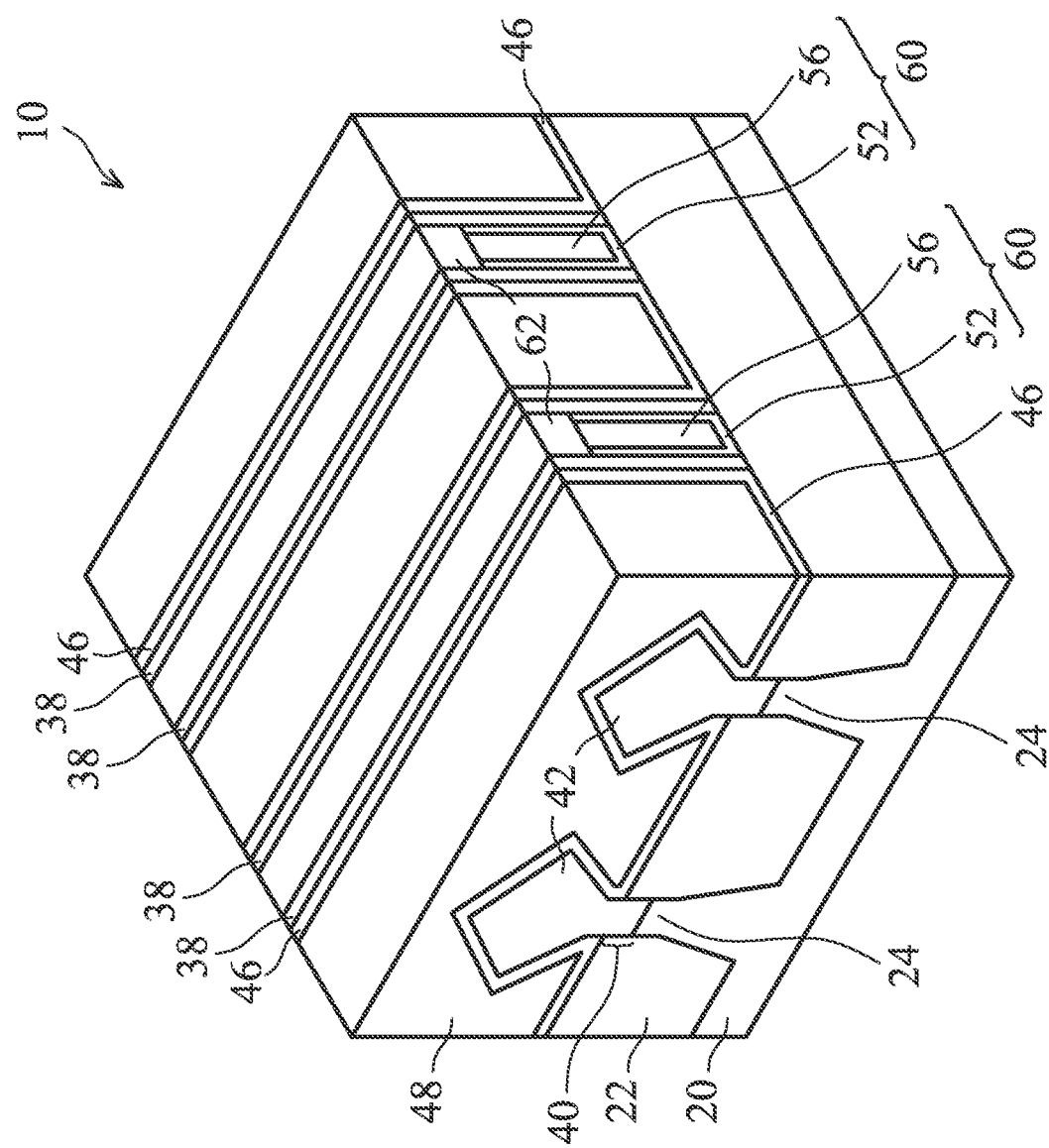
Figure 21B:
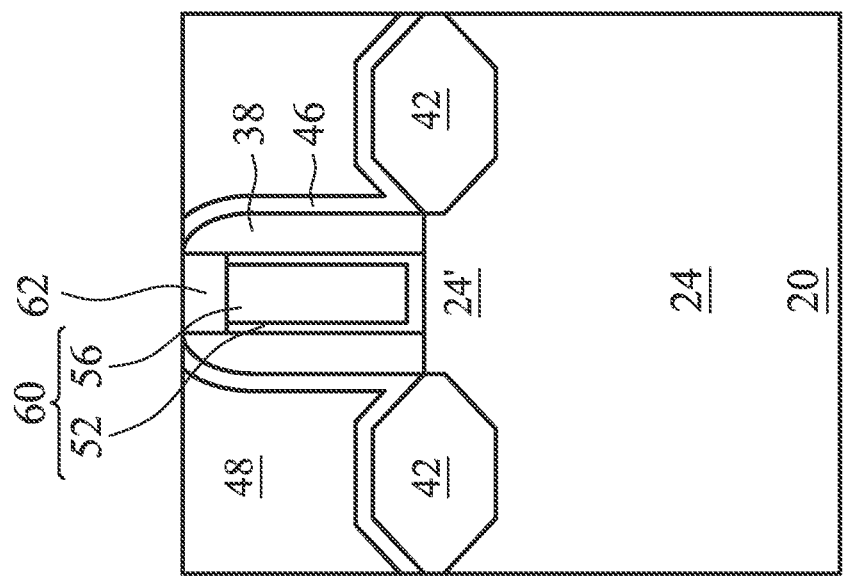
Figure 21A:
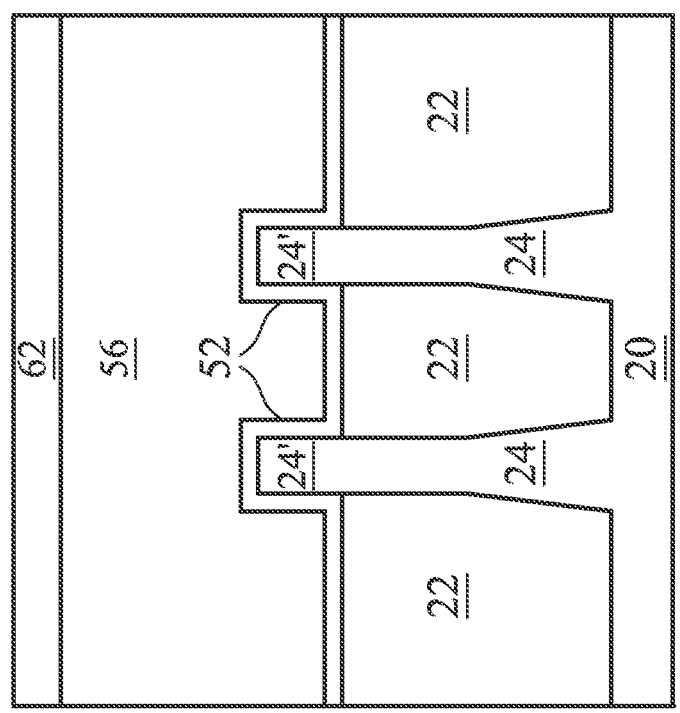

FIG. 21A illustrates a cross-sectional view of the structure shown in FIG. 20, with the cross-sectional view obtained from the plane containing line A-A as illustrated in FIG. 1. FIG. 21B illustrates a cross-sectional view of the structure shown in FIG. 20, with the cross-sectional view obtained from the plane containing line D-D as illustrated in FIG. 1. As shown in FIGS. 20, 21A, and 21B, hard masks 62 are formed. The material of hard masks 62 may be the same as or different from the materials of some of CESL 46, the first ILD 48, and/or gate spacers 38. In accordance with some embodiments, hard masks 62 are formed of silicon nitride, silicon oxynitride, silicon oxy-carbide, silicon oxy carbonitride, or the like. The formation of hard masks 62 may include recessing the gate stacks 60 through etching to form recesses, filling a dielectric material into the recesses, and performing a planarization to remove the excess portions of the dielectric material. The remaining portions of the dielectric material are hard masks 62.

Figure 22:
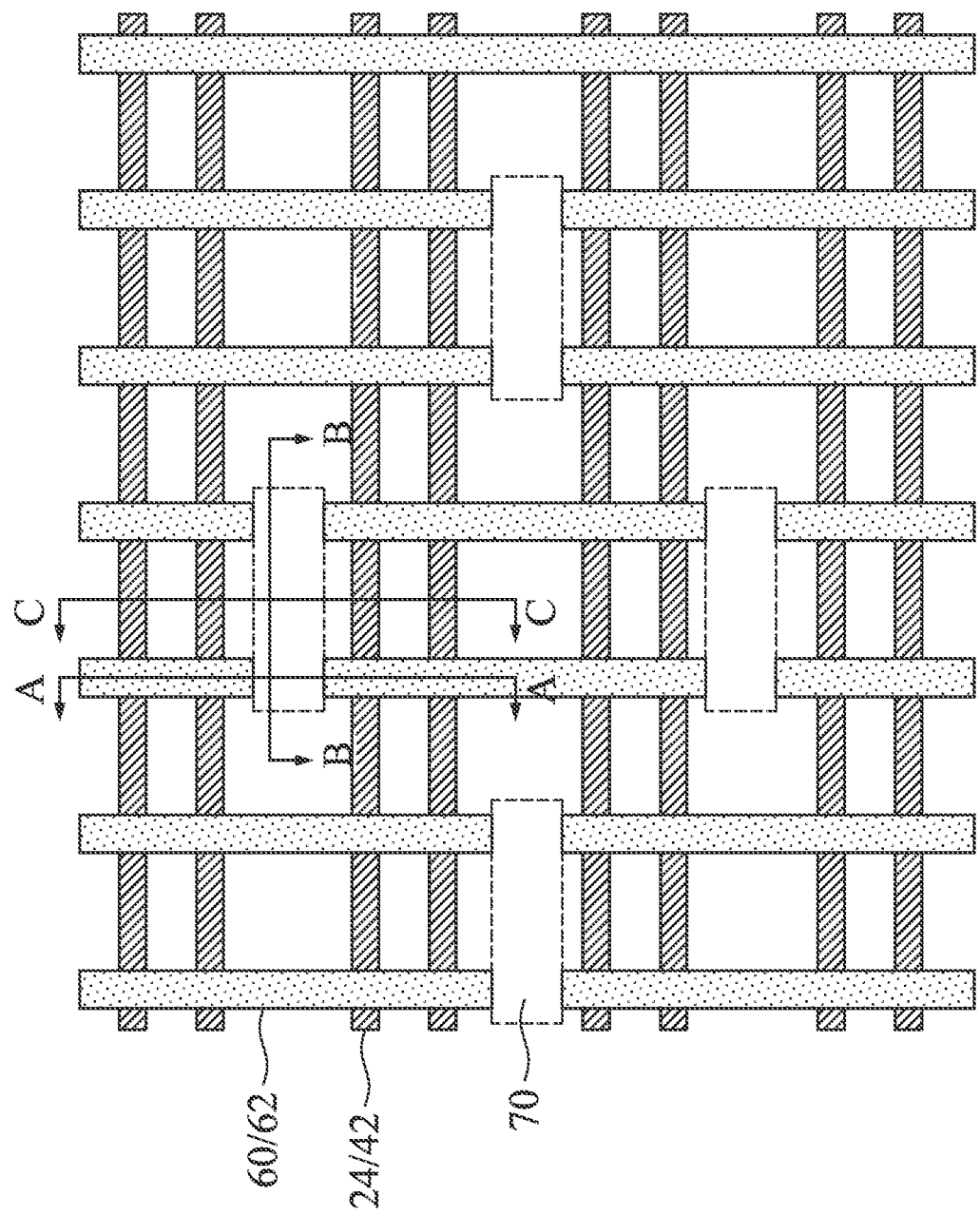

FIG. 22 illustrates a top down view of an example portion of a layout of FinFETs, in accordance with some embodiments. In this view, the ILD 48 is not shown so as to illustrate the gate stacks 60 with hard masks 62 and the fins 24 with the source/drain regions 42 more clearly. The vertical lines correspond to the gate stacks 60 with the hard masks 62. The horizontal lines correspond to the fins 24 with the source/drain regions 42 formed therein. The dashed areas correspond to openings 70 which are discussed below which are areas where one or more gates are cut. In the example embodiment below two gates are simultaneously cut in one opening 70, however, in some embodiments, multiple openings 70 may be made which each cut any number of gates, such as only one gate or ten gates. Other values may be used. The lines A-A, B-B, and C-C correspond to the lines in FIG. 1, each one representing a cross-sectional view obtained from the plane containing each respective line.

FIGS. 22, 23, 24A, 24B, 24C, 25A, 25B, 25C, 26A, 26B, 26C, 27A, 27B, 27C, 28, 29A, 29B, 29C, 30A, 30B, 30C, 30D, 31B, 31C, 32, 33, and 24 illustrate a cut-metal gate process followed by a process for forming contacts. The figure numbers of the subsequent processes may include the letter "A," "B," "C," or "D." Unless specified otherwise (for example, as with FIG. 26D), the figures whose numbers having the letter "A" are obtained from the vertical plane same as the vertical plane containing line A-A in FIG. 1. The figures whose numbers having the letter "B" are obtained from the vertical plane same the vertical plane containing line B-B in FIG. 1. The figures whose numbers having the letter "C" are obtained from the vertical plane same as the vertical plane containing line C-C in FIG. 1. The figures whose numbers having the letter "D" are obtained from the vertical plane same as the vertical plane containing line D-D in FIG. 1.

Figure 23:
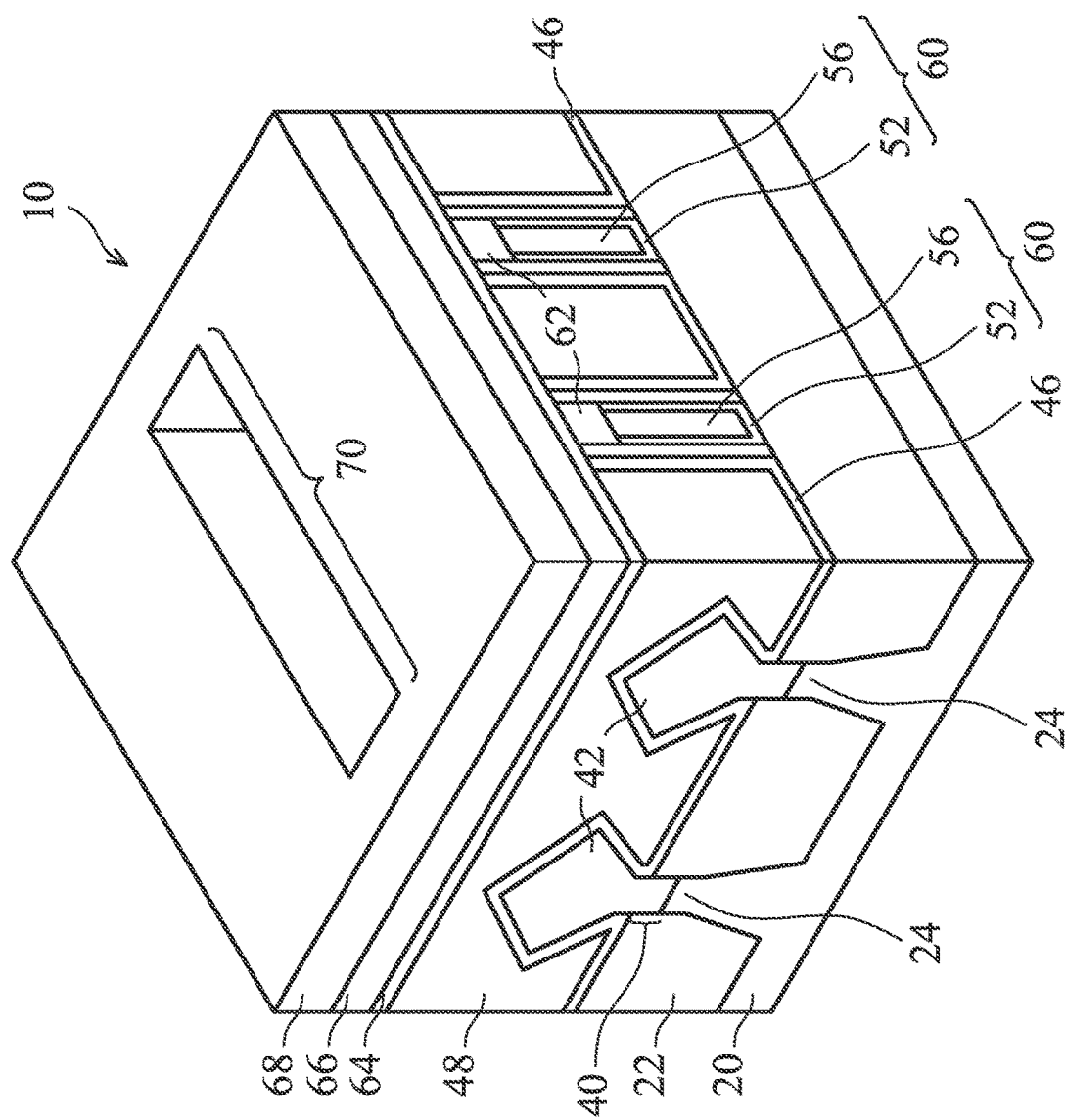
Figure 24A:
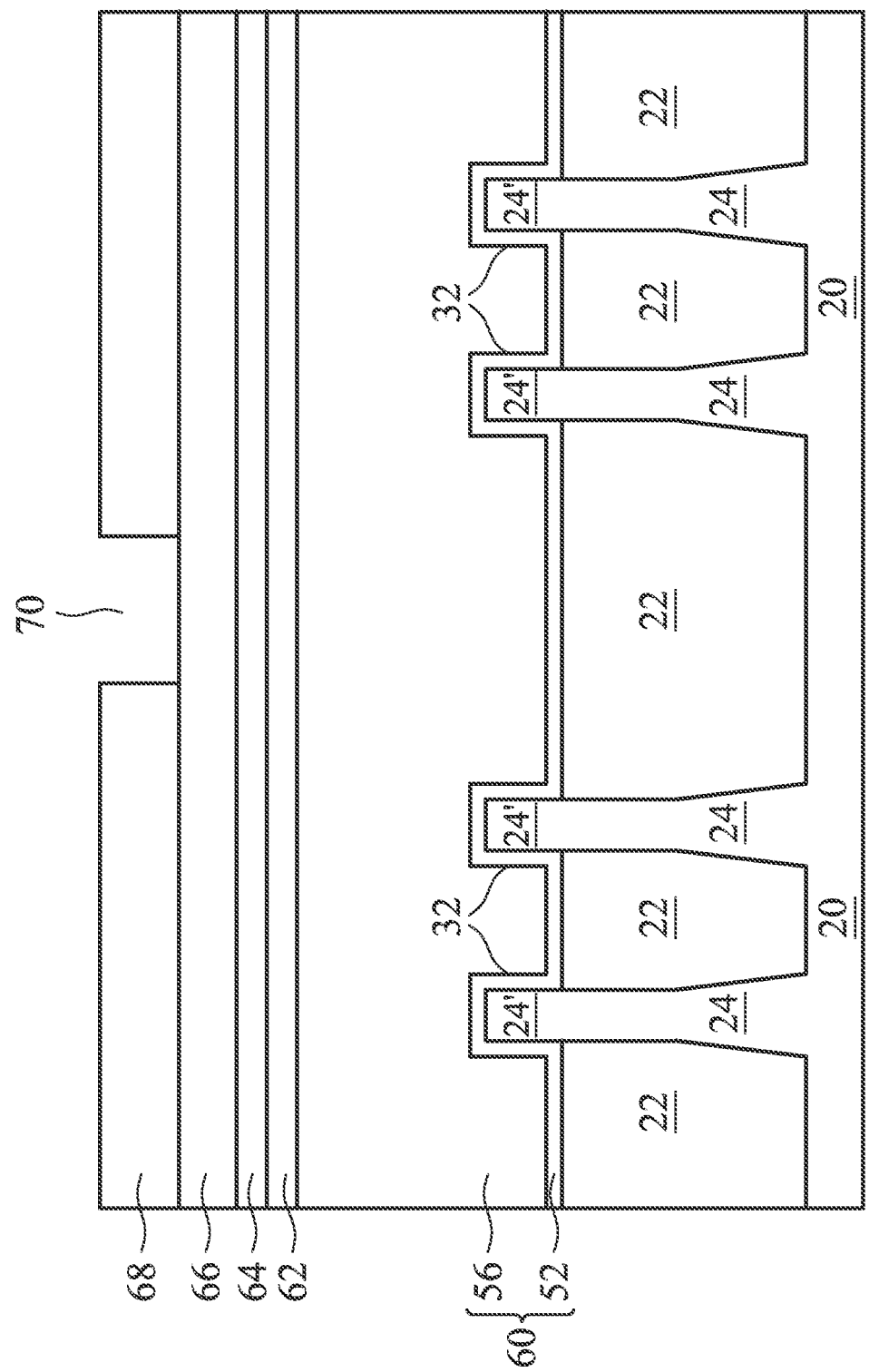
Figure 24B:
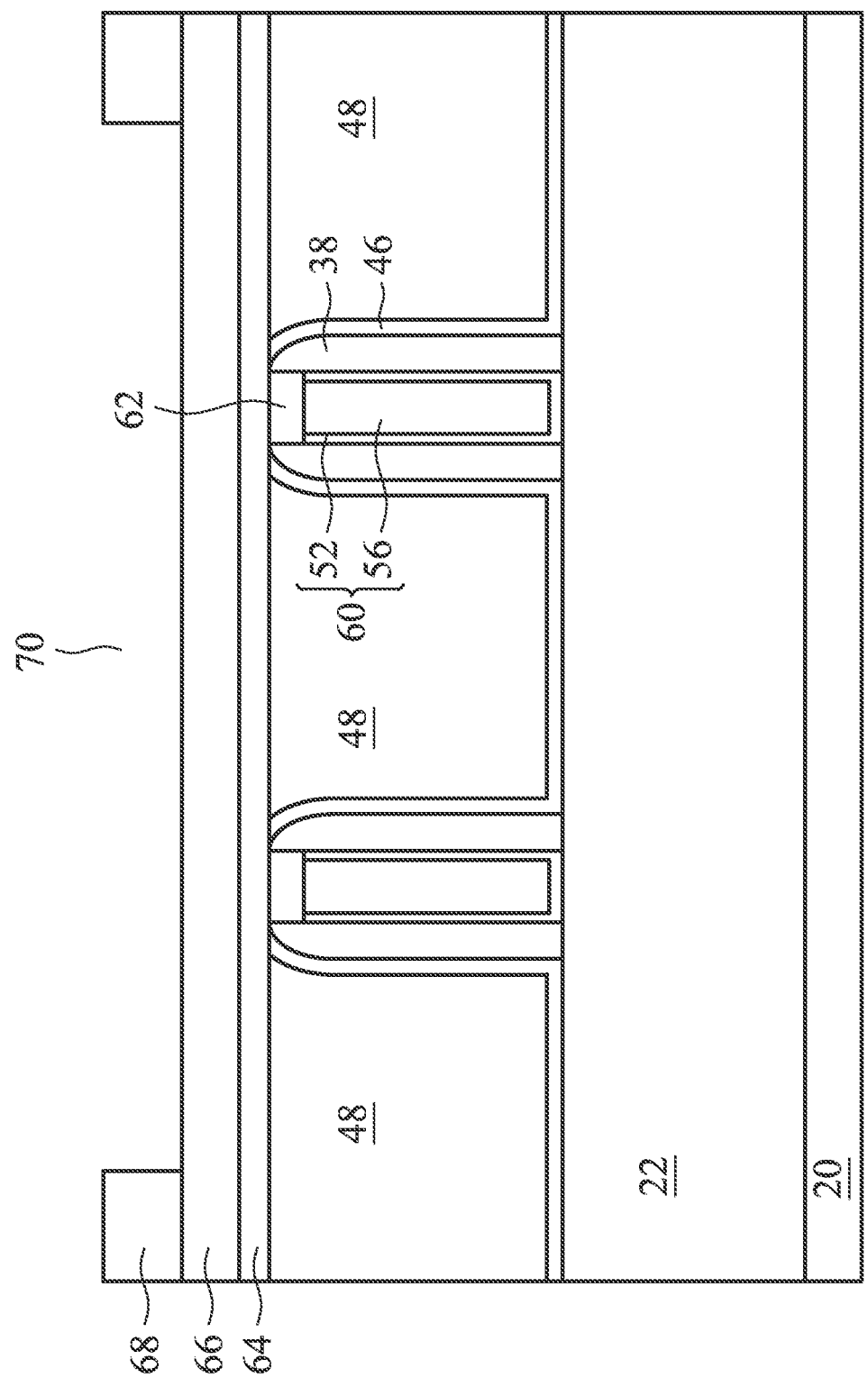
Figure 24C:
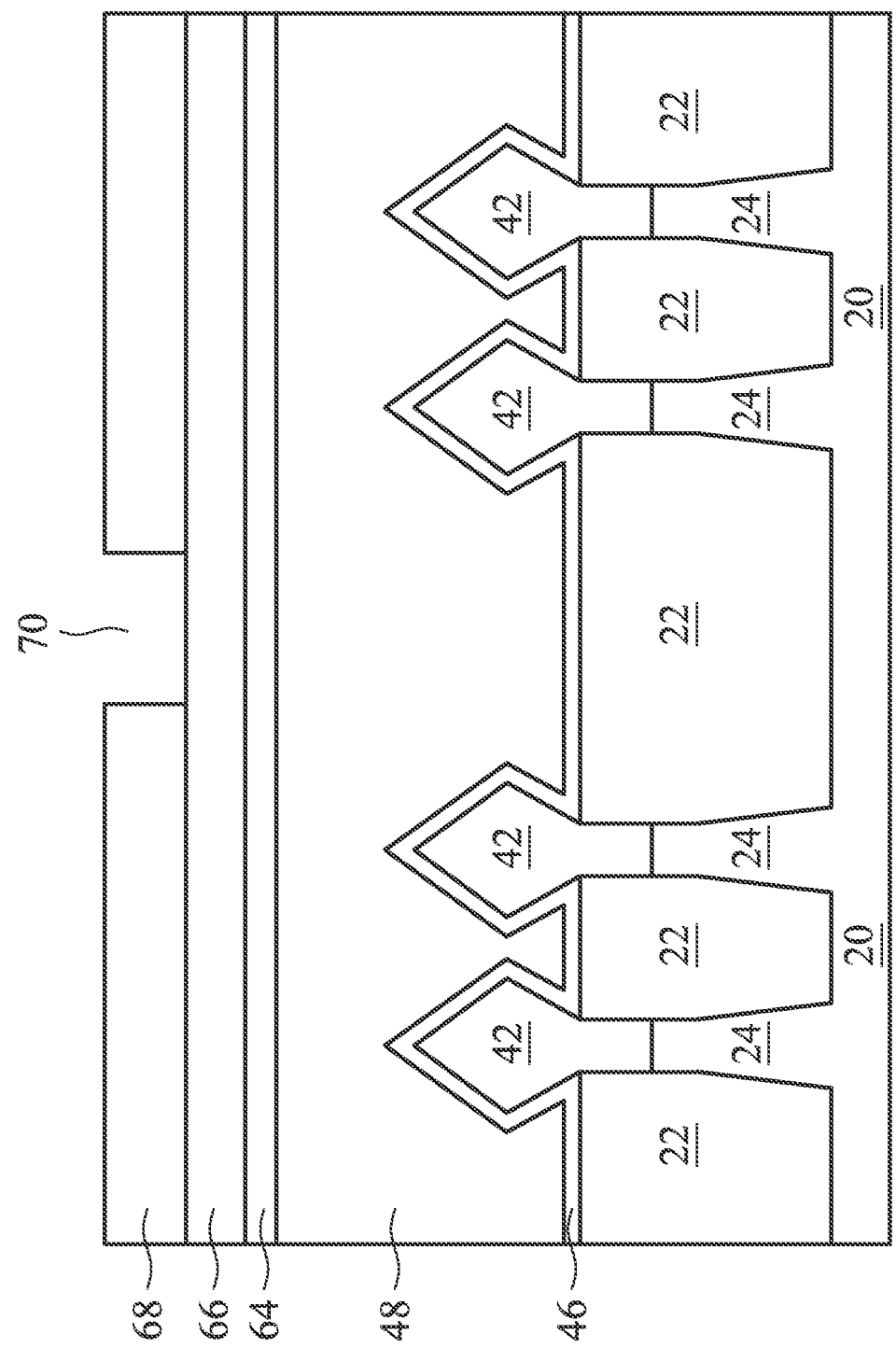

FIGS. 23, 24A, 24B, and 24C illustrate the formation of pad layer 64, hard mask layer 66, and patterned photo resist 68. A Bottom Anti-Reflective Coating (BARC, not shown) may also be formed between hard mask layer 66 and the patterned photo resist 68. In accordance with some embodiments, pad layer 64 is formed of a metal-containing material such as TiN, TaN, or the like. Pad layer 64 may also be formed of a dielectric material such as silicon oxide. Hard mask layer 66 may be formed of SiN, SiON, SiCN, SiOCN, or the like. The formation may include ALD, PECVD, or the like. Photo resist 68 is coated over hard mask layer 66, and opening 70 is formed in photo resist 68. Opening 70 has a lengthwise direction (viewed from top) perpendicular to the lengthwise direction of the gate stack 60, and a portion of gate stack 60 is directly underlying a portion of opening 70, as illustrated in FIGS. 22, 23A, and 23B. Opening 70 may also extend to some portions of the first ILD 48, as shown in FIGS. 23, 24B, and 24C.

Figure 25A:
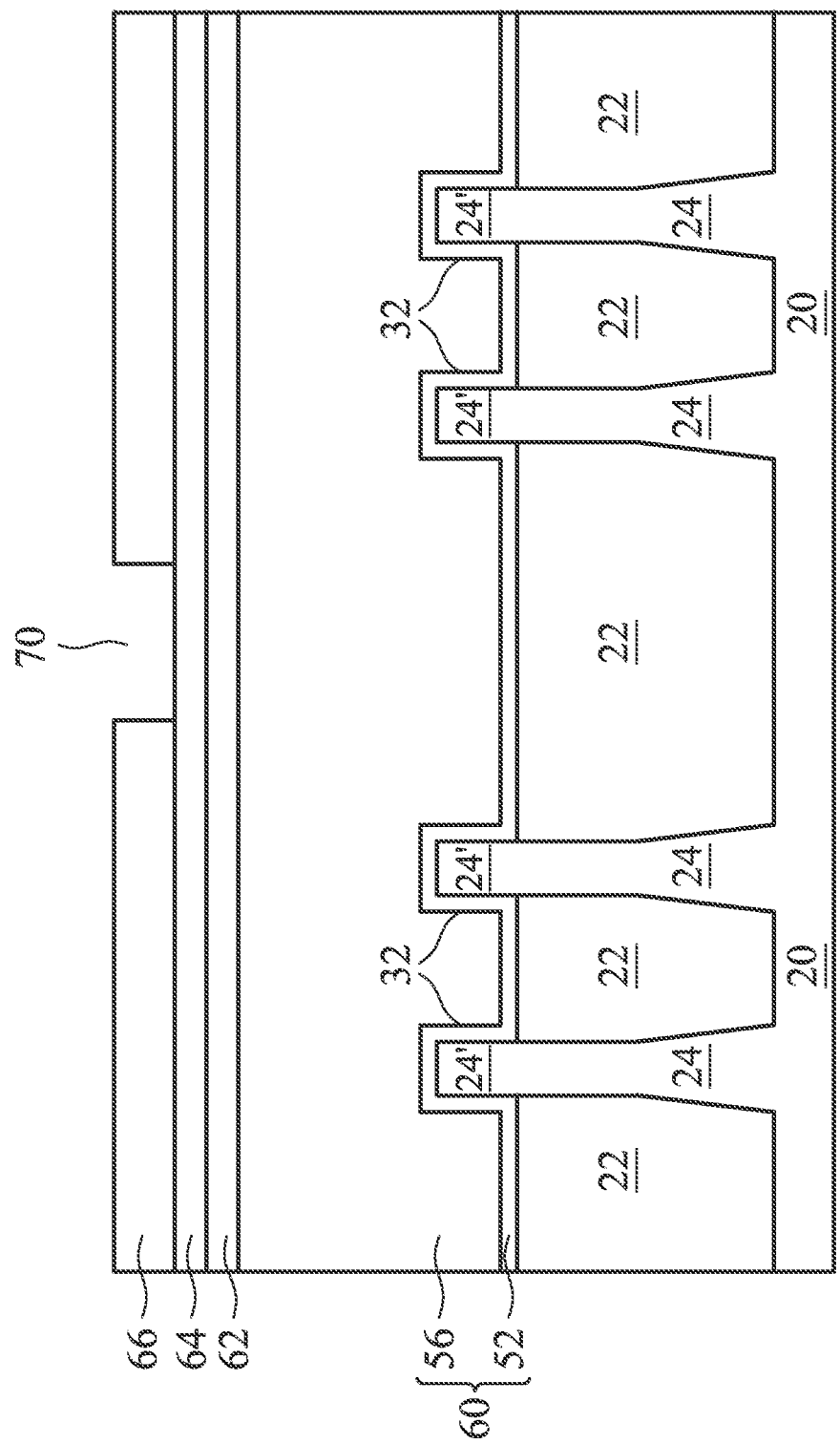
Figure 25B:
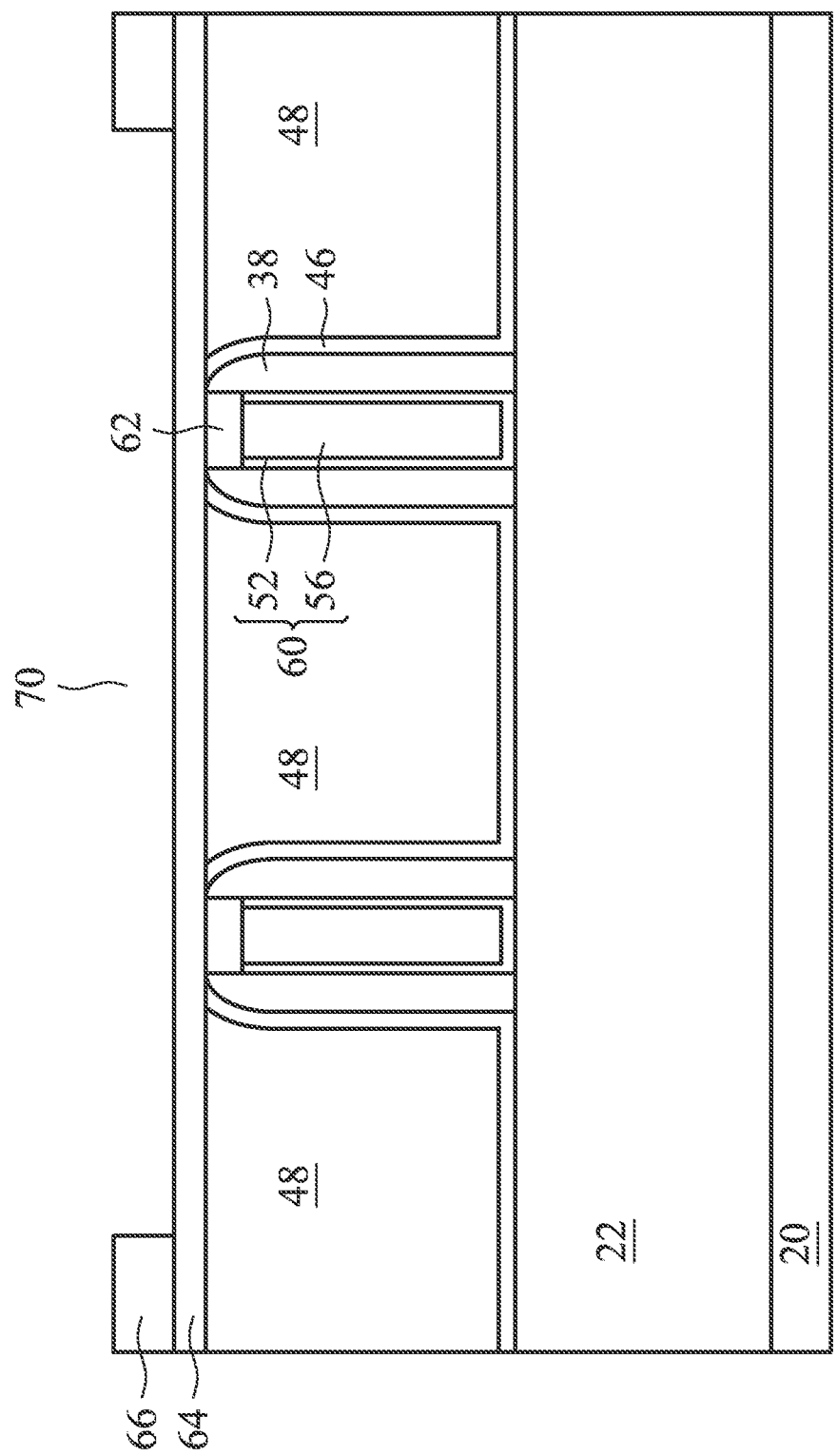
Figure 25C:
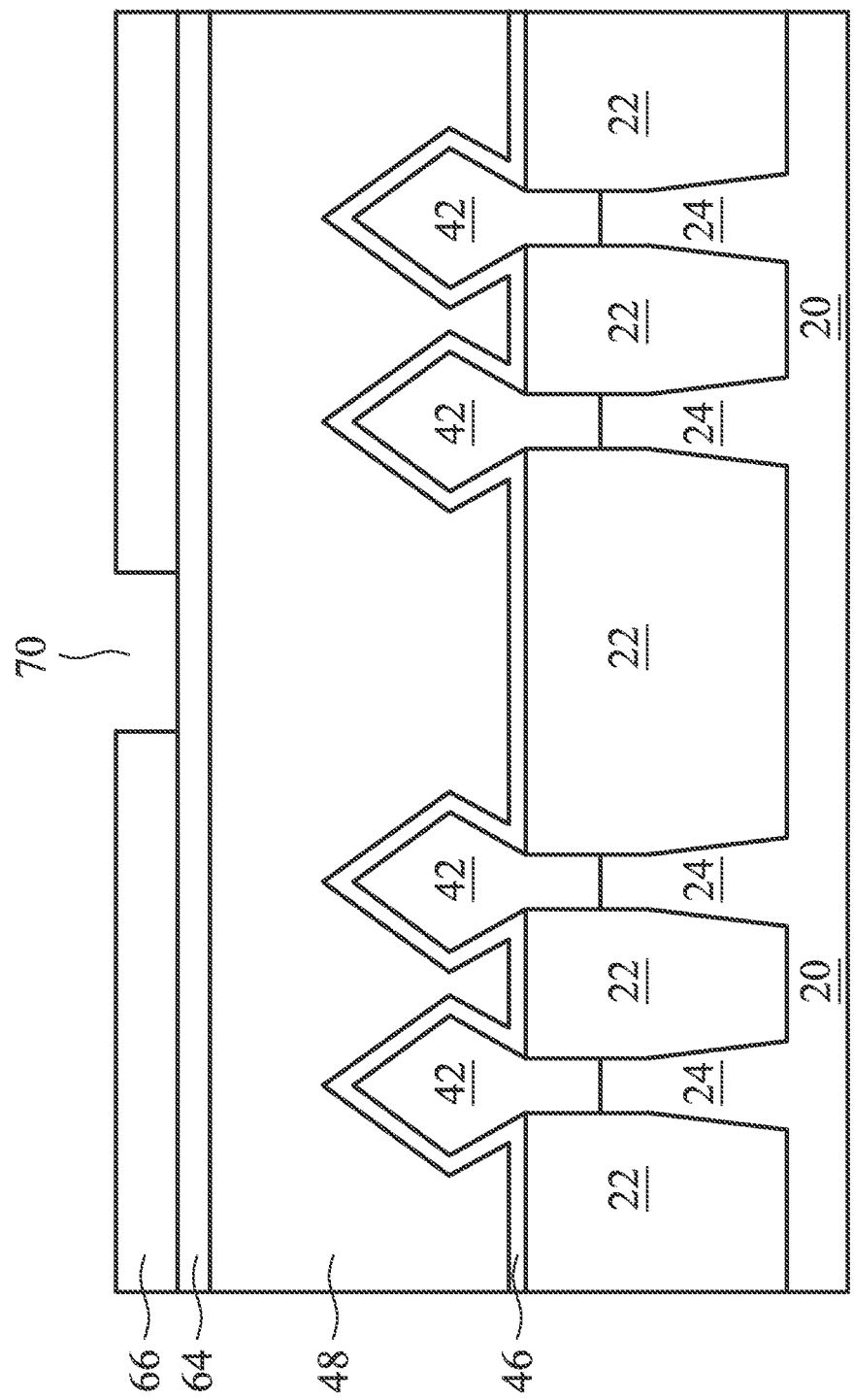

FIGS. 25A, 25B, and 25C illustrate the etching of hard mask layer 66, in which the patterned photo resist 68 (see FIGS. 23A, 23B, and 23C) is used as an etching mask. Opening 70 thus extends into hard mask layer 66. The top surface of pad layer 64 is thus exposed to opening 70. Photo resist 68 is then removed.

FIGS. 26A, 26B, 26C, and 26D illustrate the cutting of the gate stack 60, in accordance with some embodiments. After cutting the gate stack 60, the gate stack 60 will be separated into two separate and electrically isolated gate stacks, each one comprising a portion of the gate stack 60. It should be understood that the gate stack 60 may be separated into multiple portions of the gate stack 60 by additional simultaneous cutting processes. Pad layer 64 and the underlying hard mask 62 and gate electrode 56 are etched to form trench 74, which extends through the gate electrode 56 to expose the gate dielectric layer 52. Exposed portions of the gate spacers 38 and the exposed portions of the first ILD 48 are also etched. The etching is continued until the now exposed gate dielectric layer 52 is removed, thereby exposing a portion of the isolation regions 22. In some embodiments, the etching may be continued still until at least a portion of the now exposed isolation regions 22 are removed. In some embodiments, the etching may be continued until the isolation regions 22 are removed until a portion of the substrate 20 is exposed. In some embodiments, the etching may be continued further still until a portion of the substrate 20 is removed. The etching may include multiple cycles using various etchants effective for the removal of the different materials in the gate stack 60. In some embodiment, the bottom of the trench 74 may be disposed in the isolation regions 22 and may not penetrate the substrate 20.

In accordance with some embodiments of the present disclosure, the etching is performed using process gases selected from, and not limited to, $Cl_2$, $BCl_3$, Ar, $CH_4$, $CF_4$, and combinations thereof. The etching of gate electrode 56 may be performed with a pressure in the range between about 2.5 mTorr and about 25 mTorr. An RF power is applied in the main etching, and the RF power may be in the range between about 250 Watts and about 2,500 Watts. A bias voltage in the range between about 25 volts and about 750 volts may also be applied.

Figure 26A:
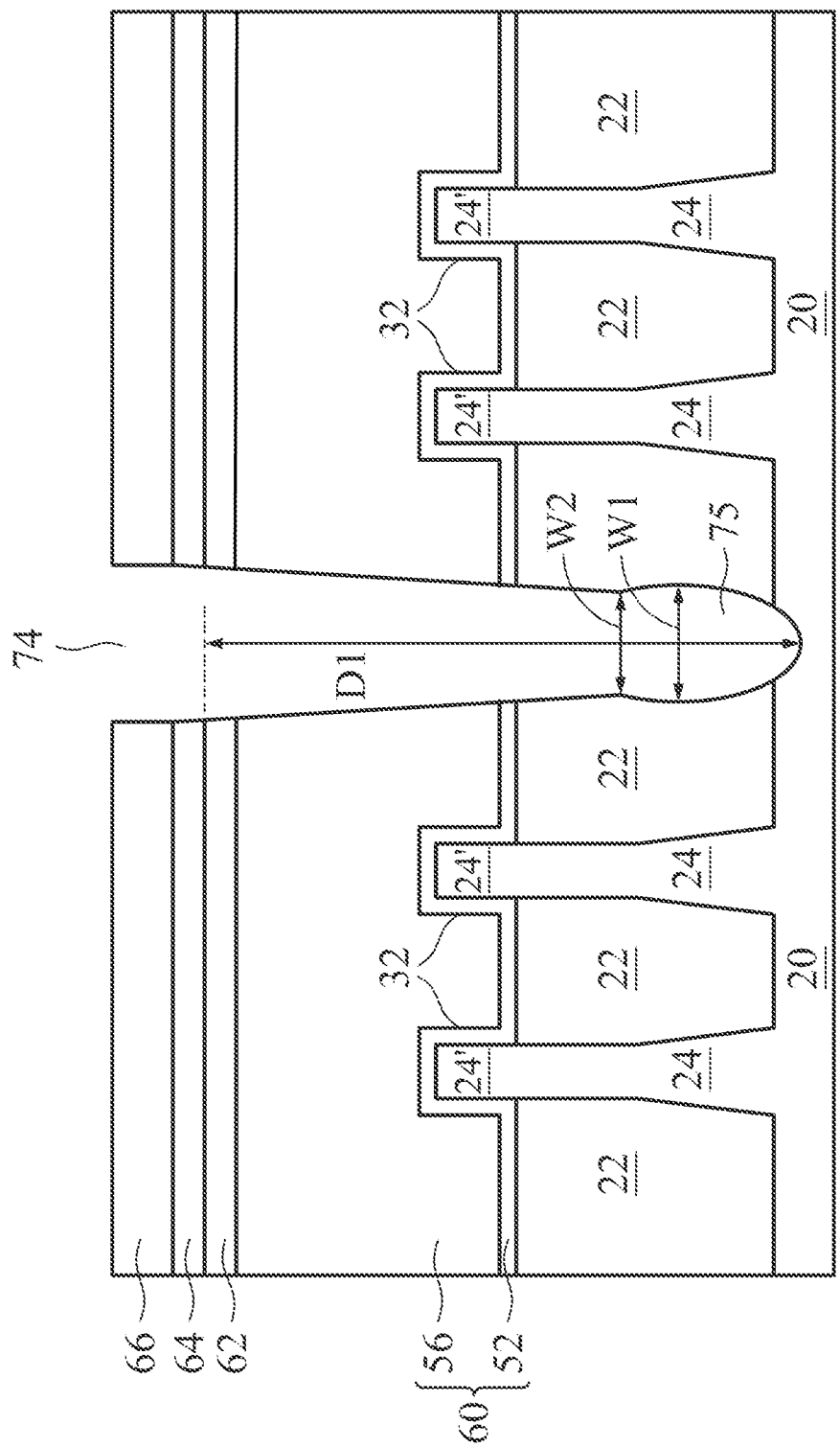
Figure 26C:
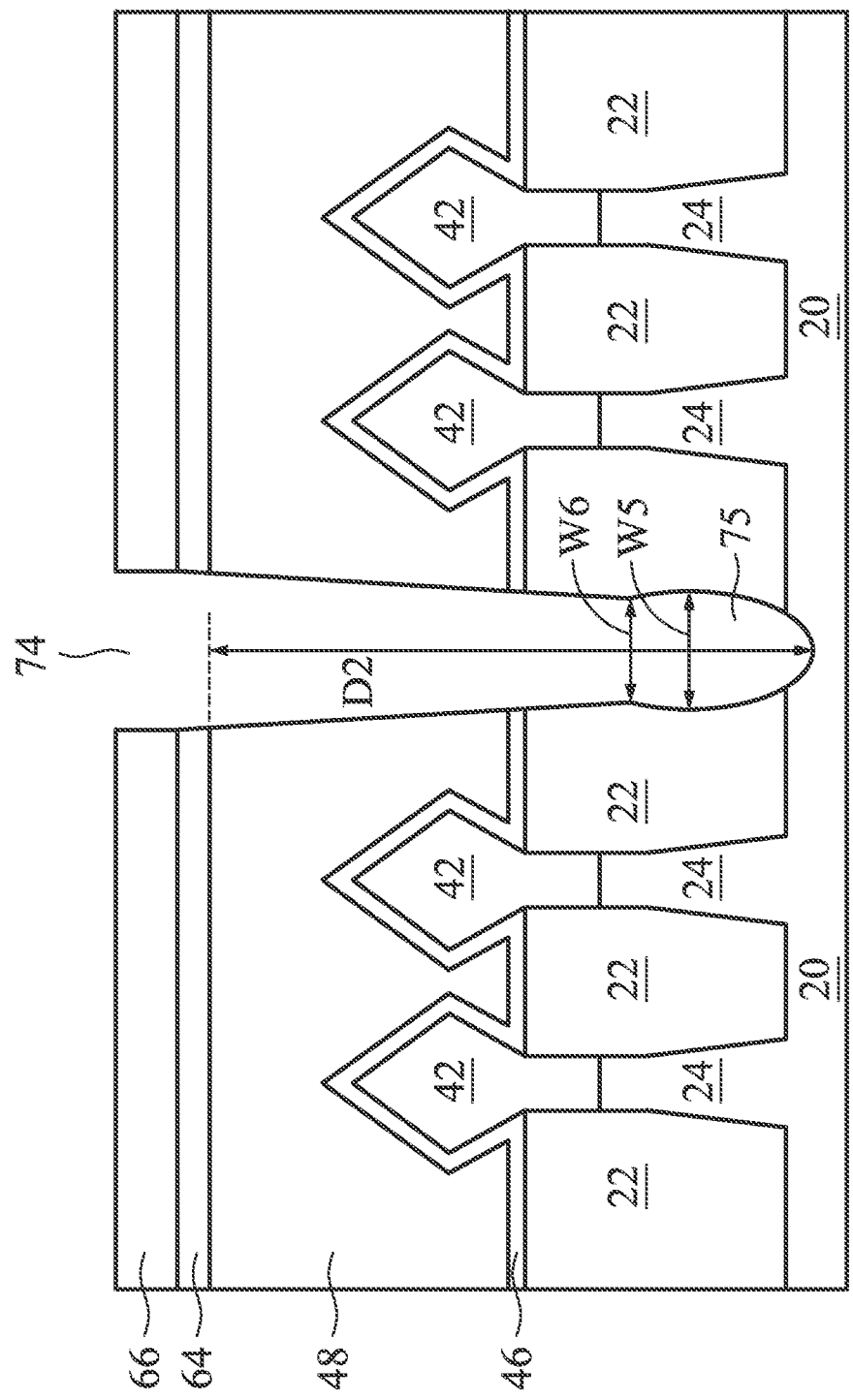

As illustrated in FIGS. 26A, 26B, and 26C, in embodiments which etch through the isolation regions 22, a bulb-shaped depression 75 is formed through the layer of the isolation regions 22. For example, referring to FIG. 26A, in such embodiments, as the isolation regions 22 are being etched, the walls of the gate electrode 56 in the trench 74 may have a much lower etch rate than the isolation regions 22. As a result of the varying etch rates, the etchant can cause the bulb-shaped depression 75 to form in the isolation regions 22 with an upper trapezoidal portion formed over the bulb-shaped depression 75. A width W1 in the bulb-shaped depression 75 is greater than the width W2 at a neck formed between the gate electrode 56 and the isolation regions 22. In some embodiments, the width W1 may be between about 5 nm and about 30 nm, such as about 18 nm, and the width W2 may be between about 80% to about 99% of the width W1, and may be between about 5 nm and about 30 nm, such as about 16 nm, though other values are contemplated and may be used. In some embodiments, the bulb-shaped depression 75 can be achieved by employing additional etching techniques, such as a wet etch, dry etch, or combination thereof.

Referring to FIG. 26B, the bottom of trench 74 may be curved, having a depth D1 at a center of the trench 74 between about 100 nm and about 300 nm, such as about 230 nm, though other values are contemplated and may be used. Because the bottom of the trench 74 may be curved, the bottom of the trench 74 at the ends may be in a different layer than the bottom of the trench 74 at the middle. For example, the bottom of the trench at the depth D2, toward the end of the trench 74, may be in the isolation regions 22 while the bottom of the trench 74 is in the substrate 20. The depth D2 may be between about 100 nm and about 300 nm, such as about 230 nm, though other values are contemplated and may be used. In some embodiments, the depth D2 may be between about 90% and 99% of the depth D1. It should be noted that the sidewalls of the trench 74 may be slanted, where the width W3 at the top of the trench 74 is greater than the width W4 at the bottom of the trench 74. In some embodiments, the width W3 may be between about 100 nm and about 500 nm, such as between about 100 nm and about 200 nm, such as about 130 nm, and the width W4 may be between about 100 nm and about 500 nm, such as between about 100 nm and about 200 nm, such as about 100 nm, though other values are contemplated and may be used. In some embodiments, the width W4 may be between about 85% and 99% of the width W3.

In some embodiments, the depth D1 may coincide with the upper surface of the substrate 20 (and not extend into the substrate). In other embodiments the depth D1 may terminate in an intermediate depth of the isolation regions 22, that is, between the upper surface of the isolation regions 22 and the lower surface of the isolation regions 22. In yet other embodiments, the depth D1 may terminate at the top surface of the isolation regions 22 or at the gate dielectric layer 52 (see FIG. 24B).

Referring to FIG. 26C, in some embodiments, near the end of the trench 74, the bulb-shaped depression 75 can extend upward into the first ILD 48. Because the etch rate of the first ILD 48 (which is exposed at the ends of the trench 74) may be closer to the etch rate of the isolation regions 22, the bulb-shaped depression 75 can overlap the first ILD 48. In other embodiments, the bulb-shaped depression 75 in the cross-section of FIG. 26C may become less defined as a bulb-shape. Where the bulb-shape is maintained, a width W5 in the bulb-shaped depression 75 is greater than the width W6 at a neck formed between in the first ILD 48. Where the bulb-shape is not maintained, the width W6 may be greater than or equal to the width W5. In some embodiments, the width W5 may be between about 5 nm and about 30 nm, such as about 18 nm, and the width W6 may be between about 60% to about 95% of the width W5, and may be between about 5 nm and 30 nm, such as about 16 nm, though other values are contemplated and may be used.

Figure 26D:
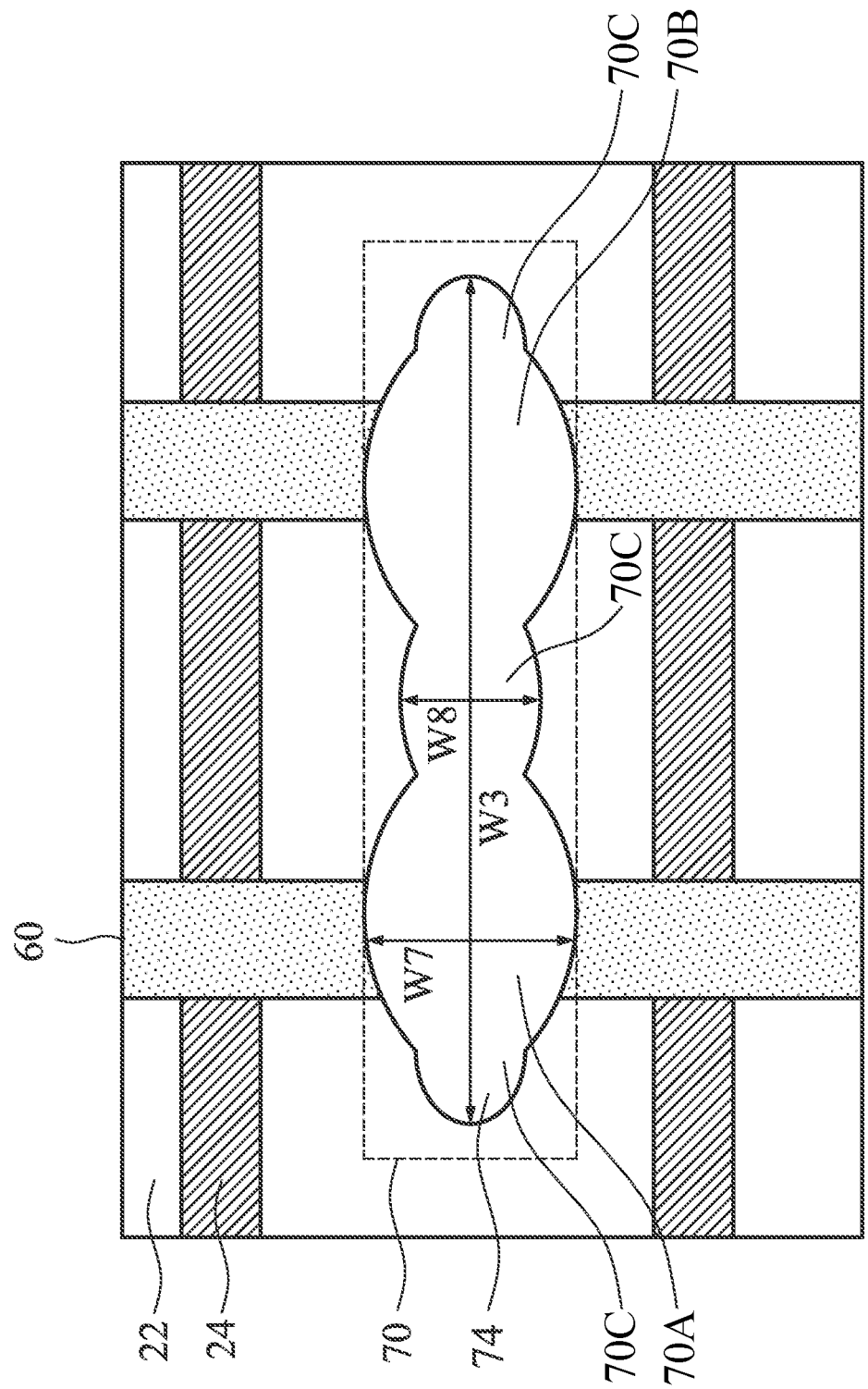

FIG. 26D illustrates a top down view of the opening 70, in accordance with some embodiments. The opening 70 may have a uniform shape, such as an oval or rectangle, in some embodiments. In other embodiments, the opening 70 may develop a non-uniform shape due to the different etch rates of the materials of the gate stack 60 and surrounding ILD 48 and ILD 22. FIG. 26D illustrates one possible non-uniform shape where two gate stacks 60 are cut. Over each of the gate stacks 60, the opening 70 may have an opening 70A and an opening 70B. In some embodiments, the opening 70A and opening 70B may be oval shaped or rhombus shaped (or a combination where a rhombus has rounded sides). In some embodiments, between each of the openings 70A and 70B and adjacent each of the openings 70A and 70B, an opening 70C may be formed which may also be oval shaped or rhombus shaped (or a combination). Each of the openings 70A, 70B, and 70C may merge together to form a bow-tie shaped opening, a dog-bone shaped opening, or a peanut shaped opening. Each of the openings 70A and 70B may have a width W7 which corresponds to the width between the gate ends adjacent the opening 70. In some embodiments, the width W7 may be between about 5 nm and about 50 nm, such as about 20 nm. The openings 70C may have a width W8 in the same direction as the width W7 which is about half the width of W7, such as between 30% and 70% of the width of W7. In some embodiments, the openings 70C may have a width W8 between about 60% and 90% of the width W7, though other values are contemplated and may be used.

In some embodiments, as the cutting of the gate stack 60 is performed, residues and byproducts of the etching can develop. Accordingly, in some embodiments, such residues and byproducts may be cleaned during the gate stack 60 cutting. For example, in some embodiments a polymer residue such as $C_xH_y$ (with X and Y being integers) may be formed which can be removed with an oxygen treatment.

Figure 27A:
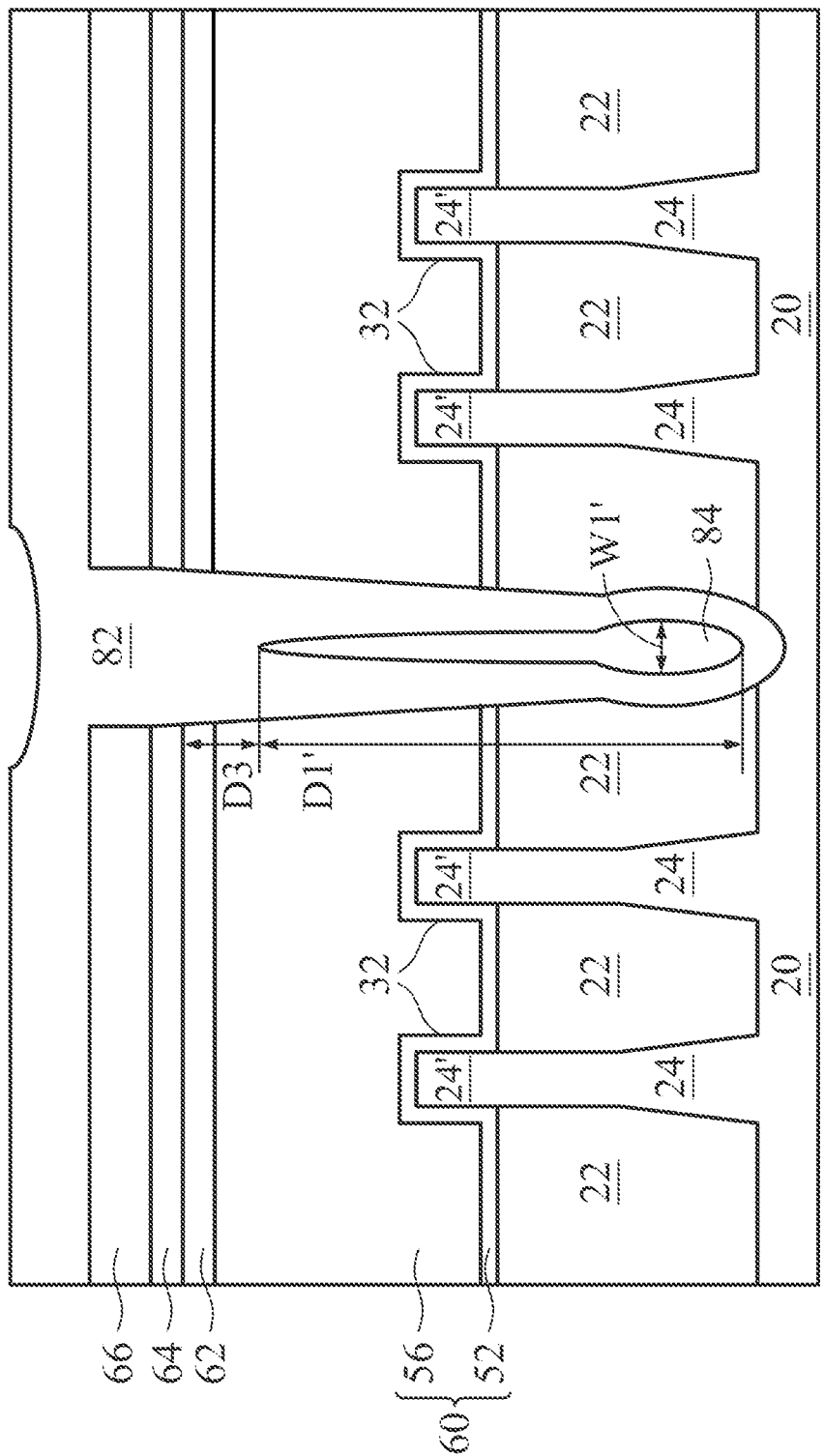
Figure 27B:
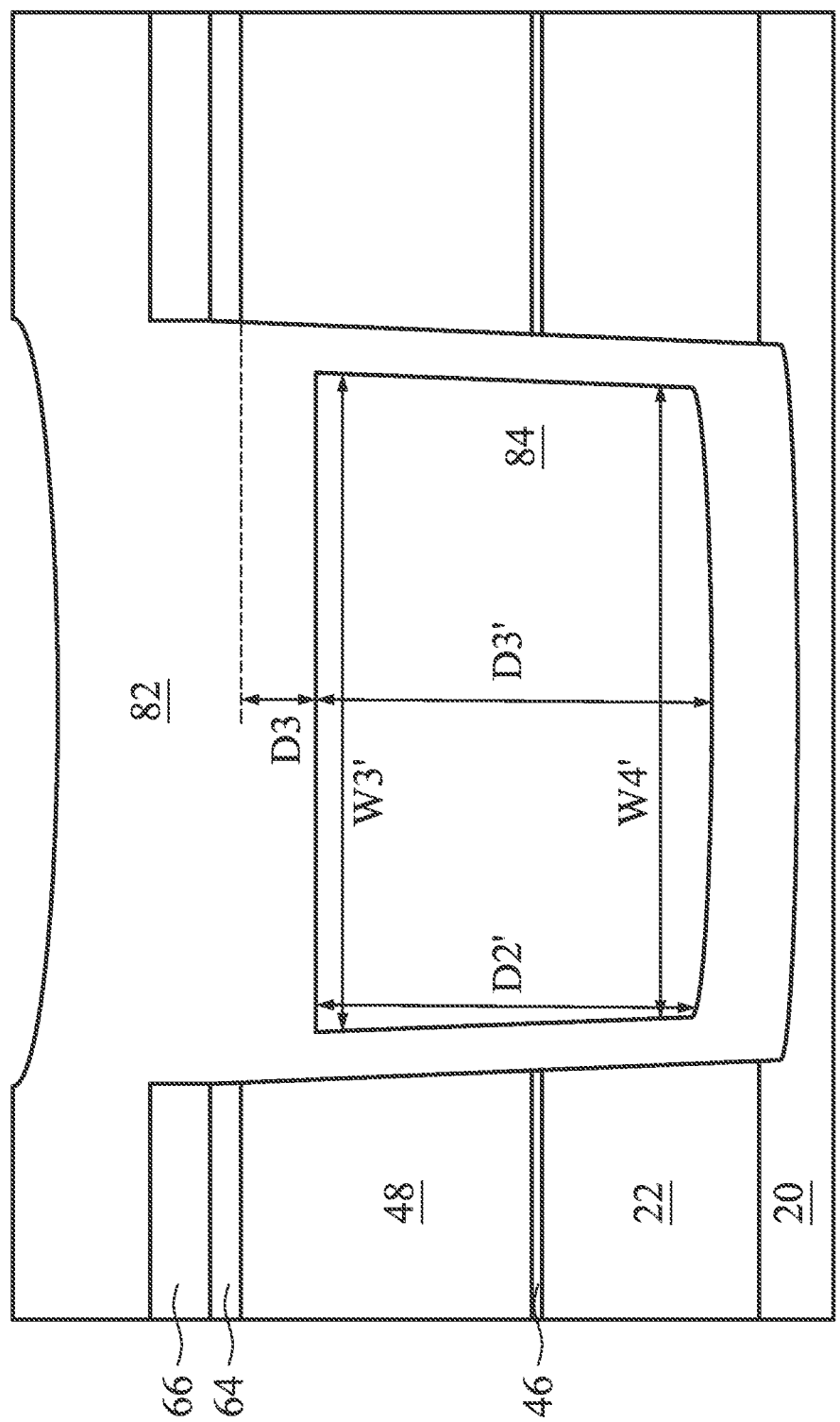
Figure 27C:
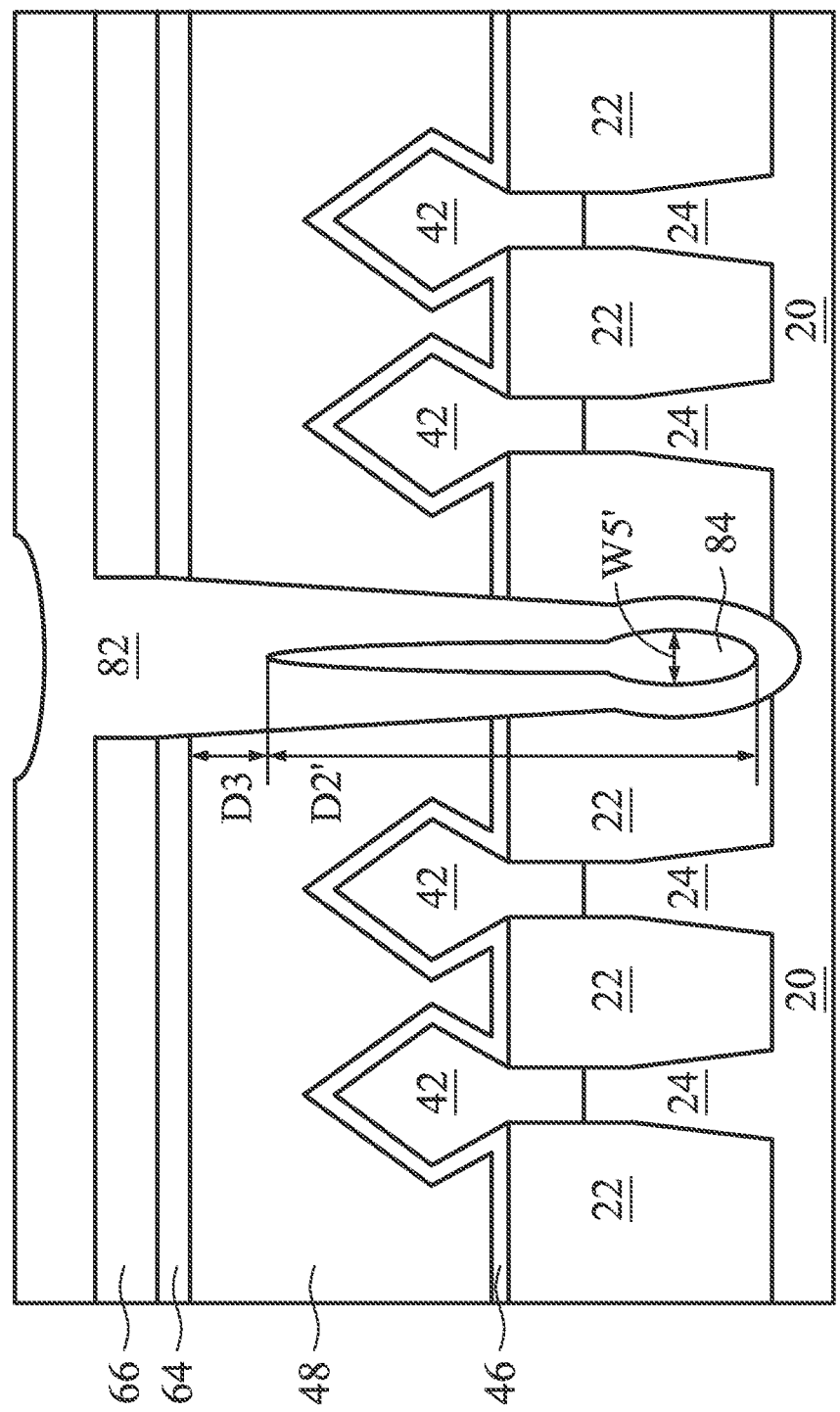
Figure 28:
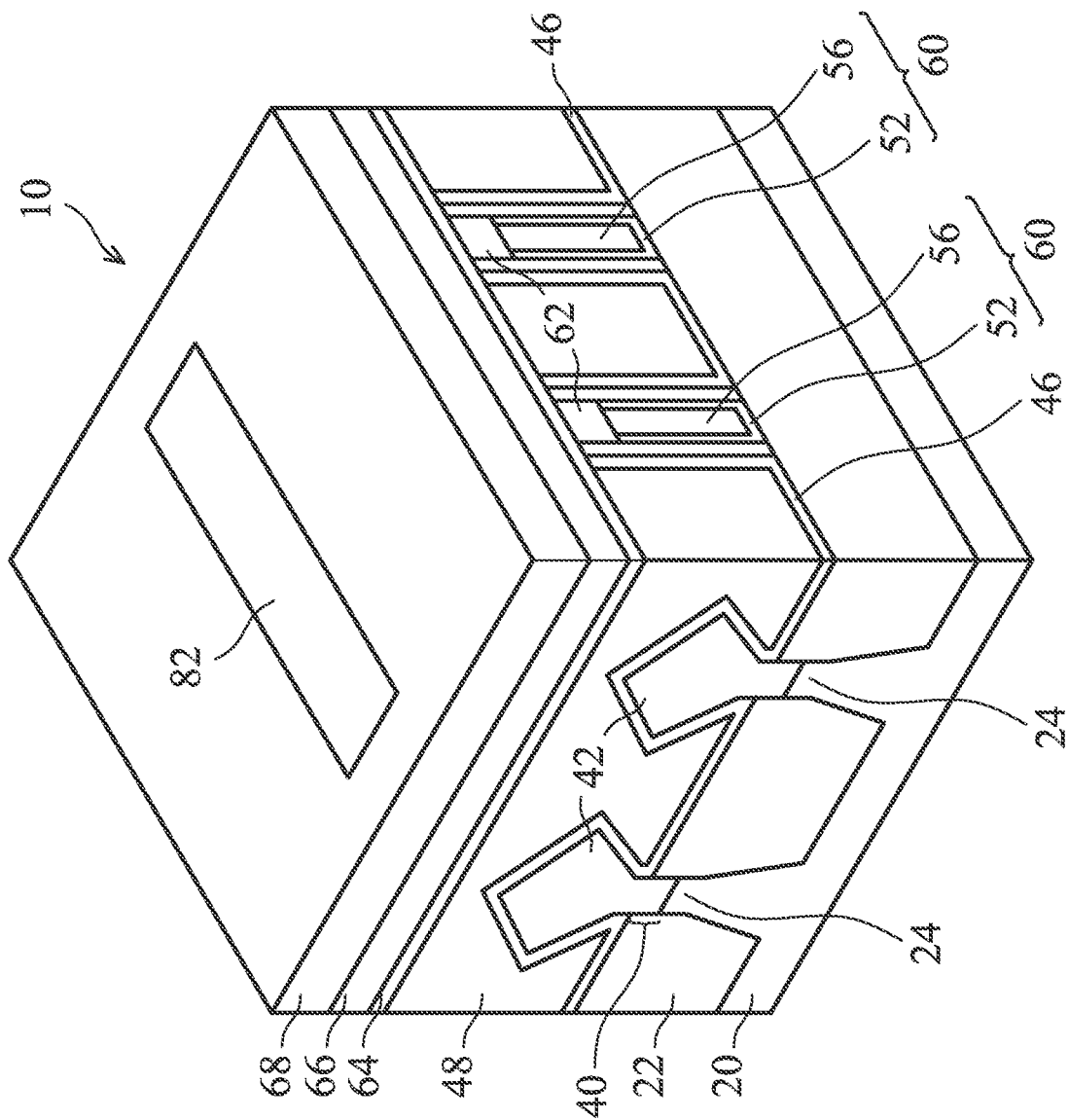
Figure 29A:
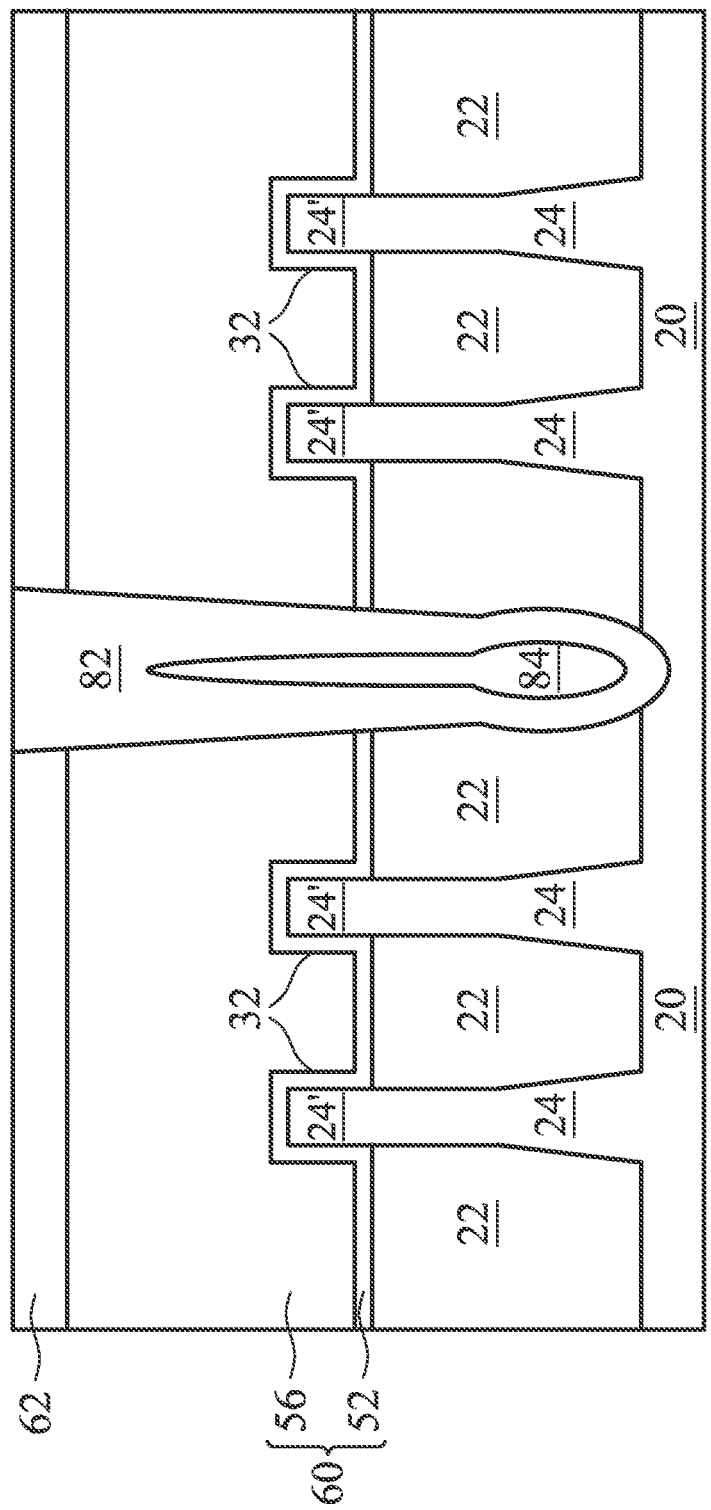
Figure 29B:
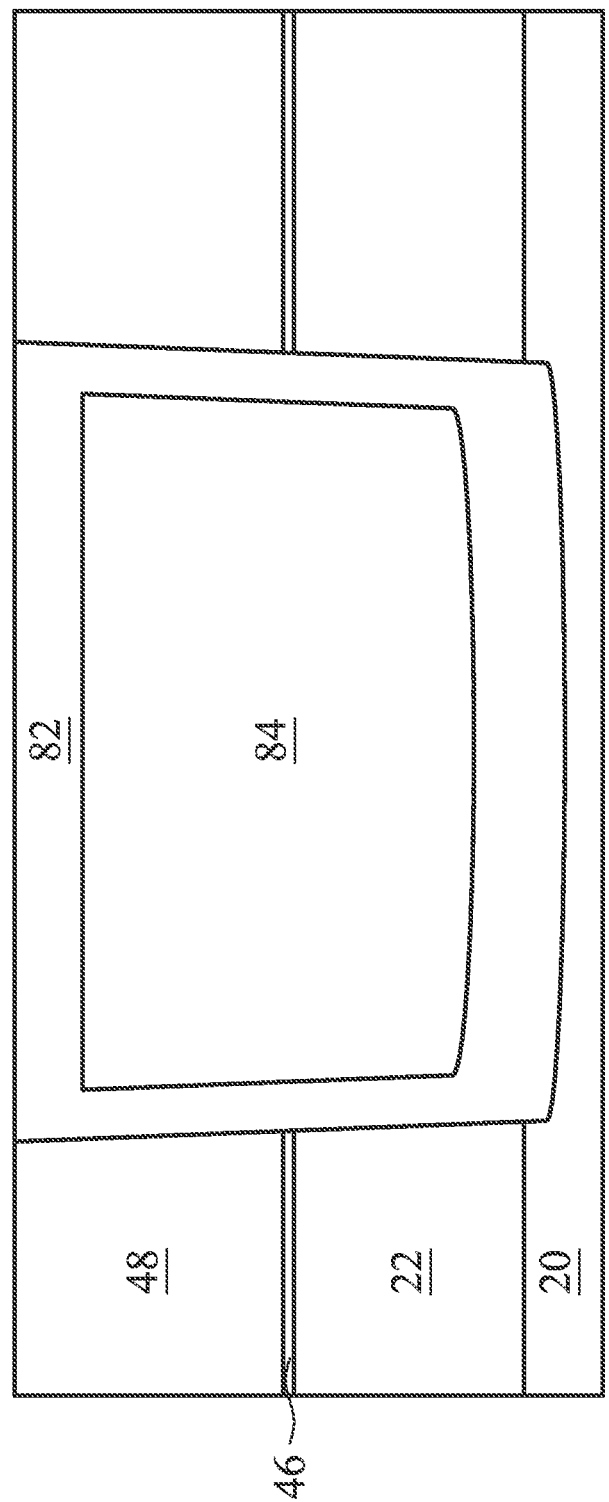
Figure 29C:
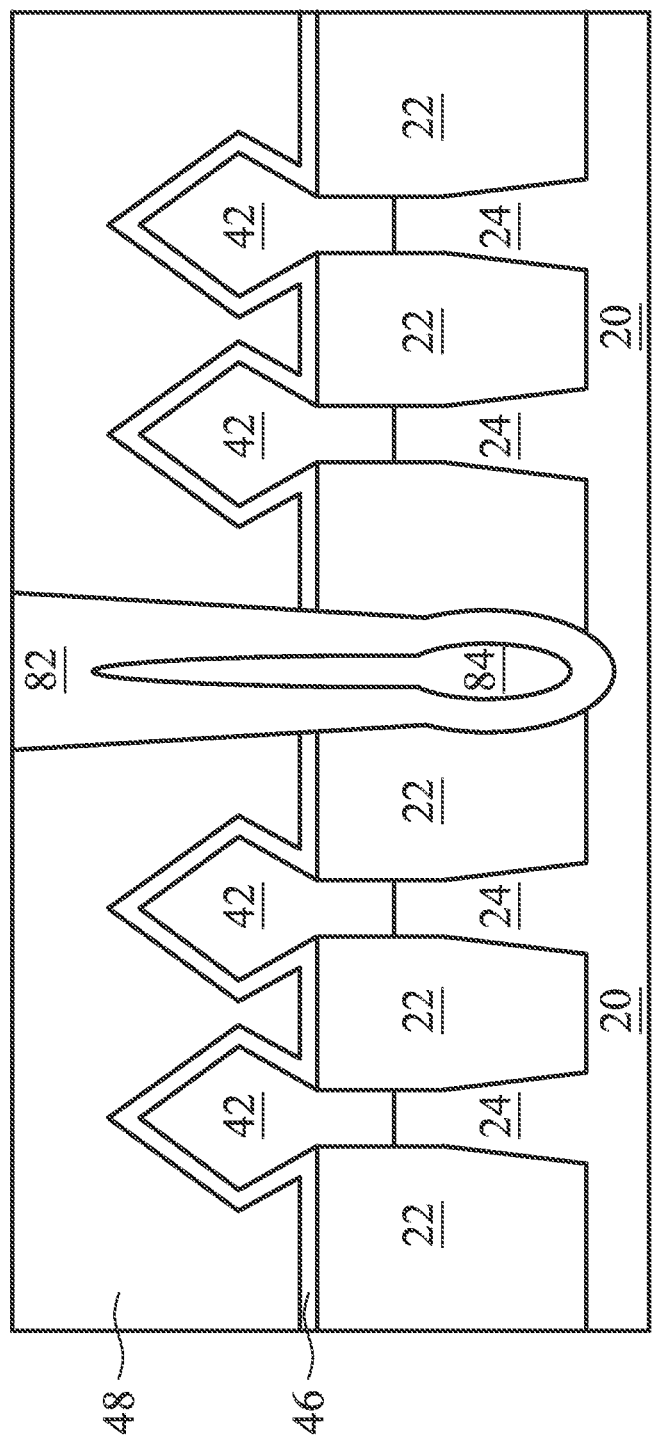

FIGS. 27A, 27B, and 27C illustrate the formation of dielectric (or isolation) region 82. The formation of dielectric region 82 may include depositing a dielectric material into trench 74 (see FIGS. 26A, 26B, and 26C). The dielectric regions 82 in the cross sections of FIGS. 27A and 27C include a lower bulb-shaped portion corresponding to the bulb-shaped portion 75 of the trench 74 (see FIGS. 26A and 26C) and an upper trapezoidal portion over the lower bulb-shaped portion. Due to the deposition method process conditions and the bulb-shaped depression 75, a void or air gap 84 is formed within the dielectric region 82. The air gap 84 reduces current leakage from one part of the gate electrode 56 which is now cut to the other part of the gate electrode 56 which is now cut, especially as the width between the cut gates decreases with technology iterations. The filling method may include ALD, PECVD, CVD, spin-on coating, or the like. The filling material may include silicon nitride, silicon oxide, silicon carbide, silicon oxynitride, silicon oxy-carbide, and the like. The filling material may include other oxides, BPSG, USG, FSG, low-k dielectrics (having k values lower than 3.9) such as carbon doped oxides, extremely low-k dielectrics such as porous carbon doped silicon dioxide, a polymer such as polyimide, the like, or a combination thereof.

The volumes of the air gap 84 may be between about 1% and about 80% the volumes of the trench 74, where a larger percentage volume air gap 84 provides better insulating capability and reduces leakage between cut gates. The air gap 84 may either be a vacuumed void (which is for simplicity may still be referred to as an "air gap") or filled with air, which may contain the chemical species of the ambient during deposition of the dielectric region 82. The shape of the air gap 84 in the A-A or C-C cross-section may be tear dropped or oval shaped with a tail extending upward. The shape of the air gap 84 may have a bulb-shaped portion with a narrow portion extending vertically from the bulb-shaped portion. In some embodiments, the sidewall of the air gap 84 may be non-linear, having a narrowing coinciding with the neck as discussed above with respect to FIG. 26A or FIG. 26C.

The height Dr of the air gaps 84 may be between about 10% and about 90% of the depth D1 of the trench 74 (see FIGS. 26A and 26B) and the width W1' of the air gap 84 at the widest point along the A-A cross-section (see FIG. 1) may be between about 10% and about 90% of the width W1 of the trench 74 (see FIG. 26A), and may be between about 1 nm and about 28 nm, such as about 4 nm. The height D2' of the air gaps 84 may be between about 10% and about 90% of the depth D2 of the trench 74 (see FIGS. 26B and 26C). The width W5' of the air gap 84 at the widest point along the C-C cross-section (see FIG. 1) may be between about 10% and about 90% of the width W5 of the trench 74 (see FIG. 26C), and may be between about 1 nm and about 28 nm, such as about 4 nm. Other values are contemplated and may be used. The height of the bulb-shaped portion of the air gap 84 may be between about 30 nm and about 75 nm, such as between about 40 nm and about 60 nm, though other values are contemplated and may be used.

The shape of the air gap 84 along the B-B cross-section (see FIG. 1) may be trapezoidal with rounded top and bottom surfaces. The width W3' at the top of the air gap 84 along the B-B cross-section may be between about 10% and about 90% of the width W3 (see FIG. 26B). The width W4' at the bottom of the air gap 84 along the B-B cross-section may be between about 10% and about 90% of the width W4 (see FIG. 26B). Other values are contemplated and may be used.

The top ends of air gaps 154 may be lower than the upper surface of the hard mask 62 by a distance D3 between about 10 nm and about 200 nm. The dielectric constant (k value) of air gap 84 is equal to 1.0, and hence the formation of air gap 84 helps reduce the parasitic capacitance or leakage between the parts of the gate electrodes 56 which are now cut.

In FIGS. 27, 28A, 28B, and 28C, a planarization is performed such as a CMP process or a mechanical grinding process to remove the excess portions of the dielectric material of the dielectric region 82, and to level the top surface of the dielectric region 82 with the top surface of the first ILD 48 and the top surface of the hard mask 62.

In FIGS. 30A, 30B, 30C, and 30D a second ILD 108 is deposited over the first ILD 48. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD.

Figure 30A:
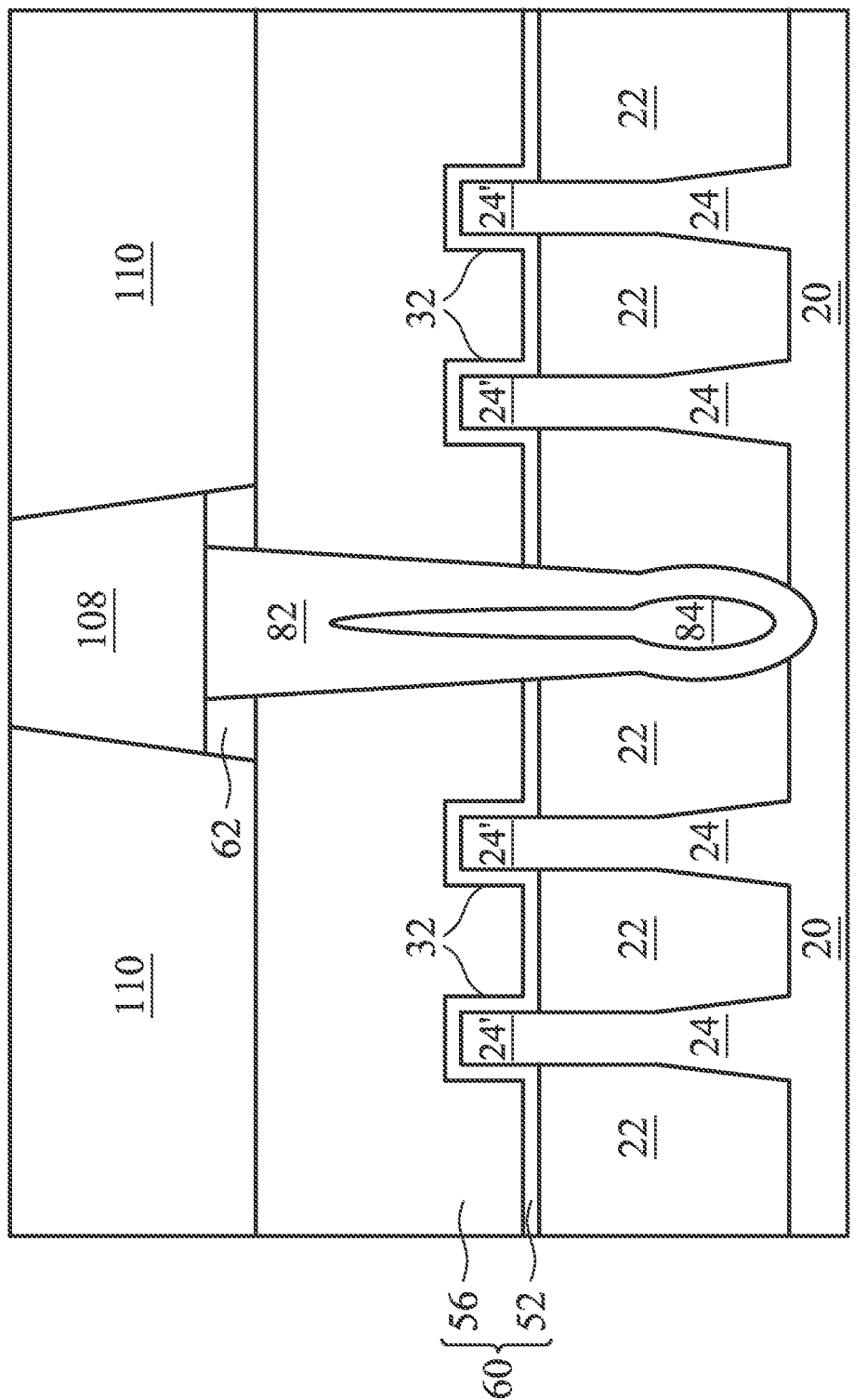
Figure 30B:
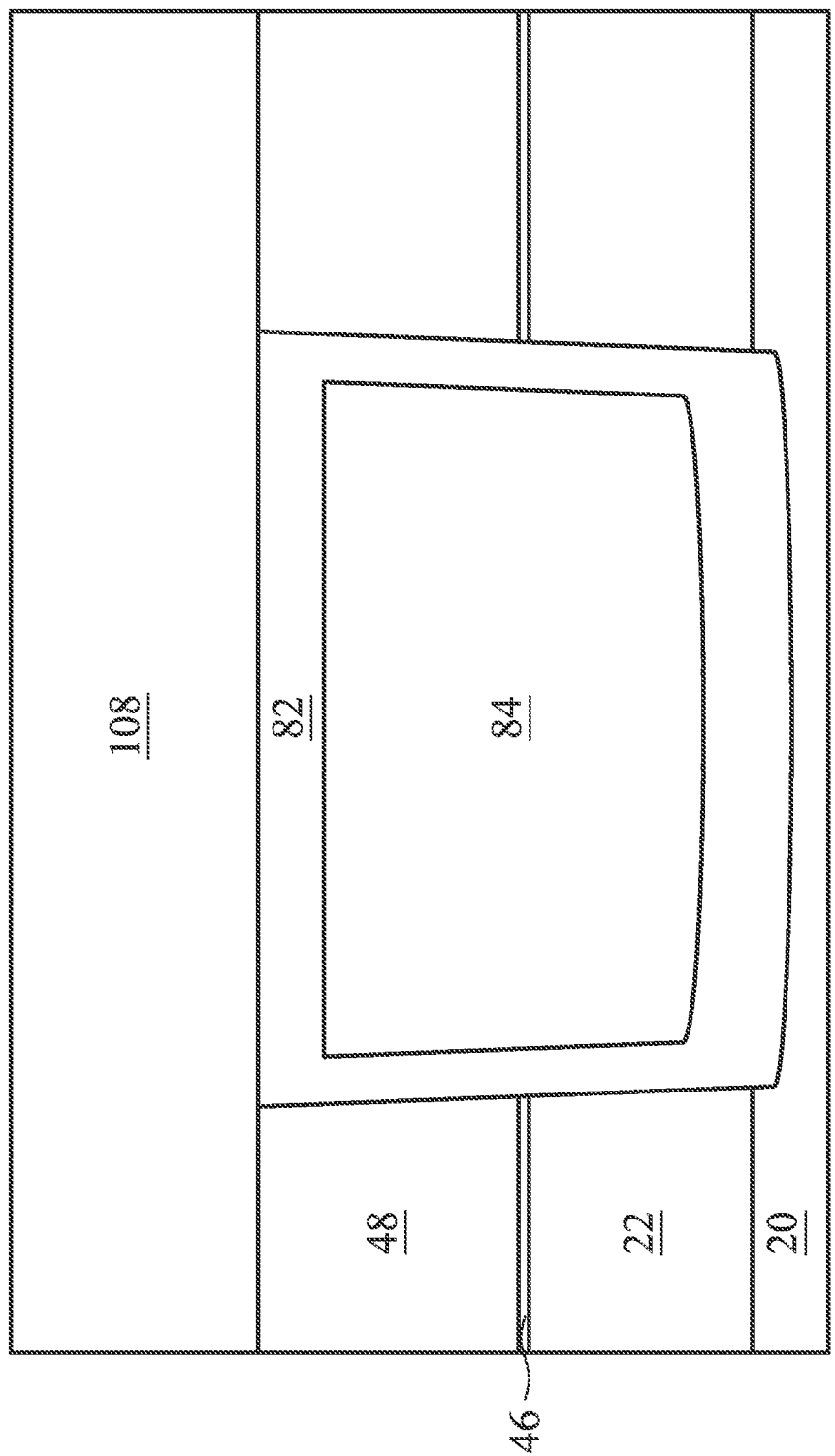
Figure 30C:
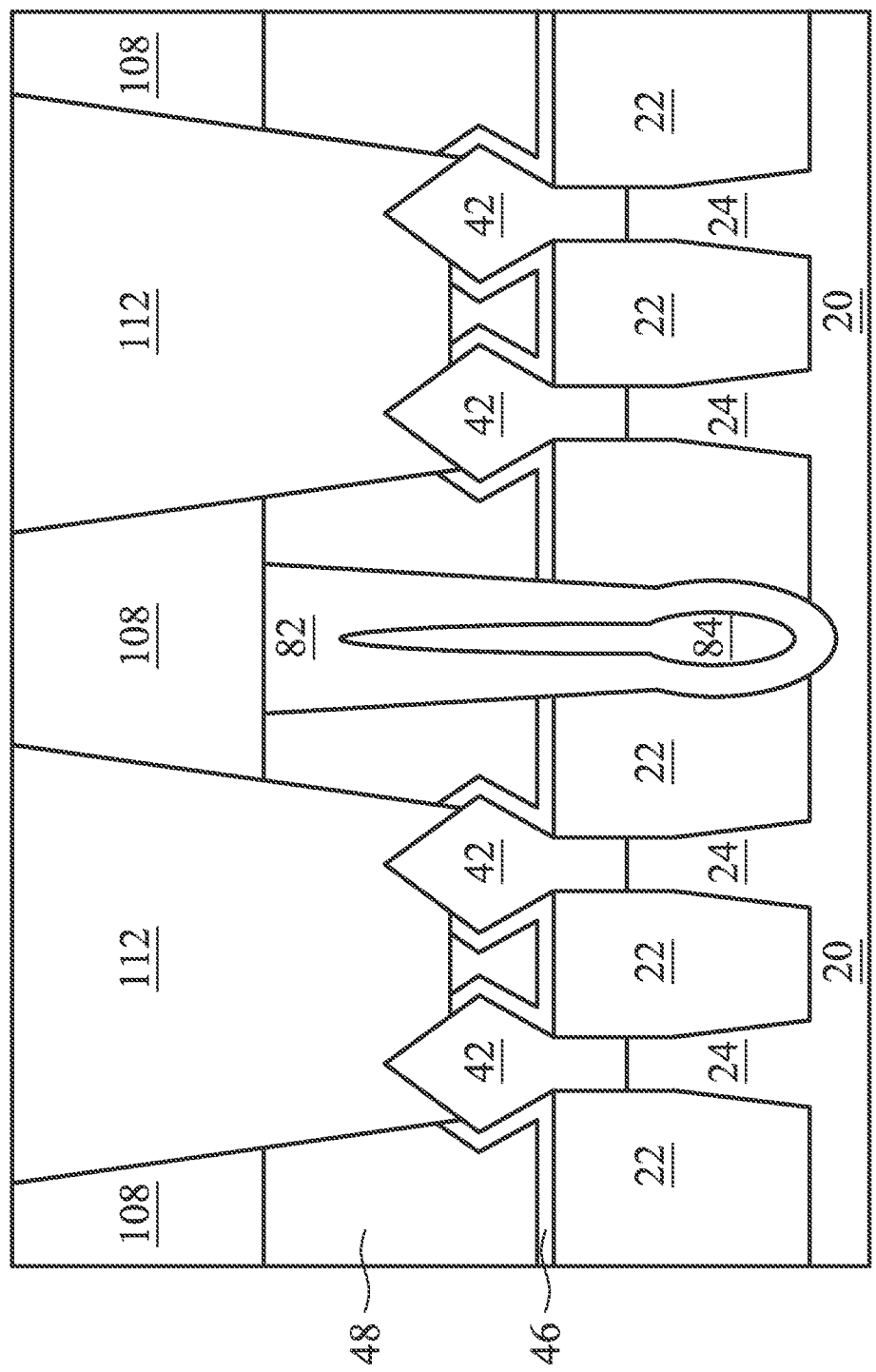
Figure 30D:
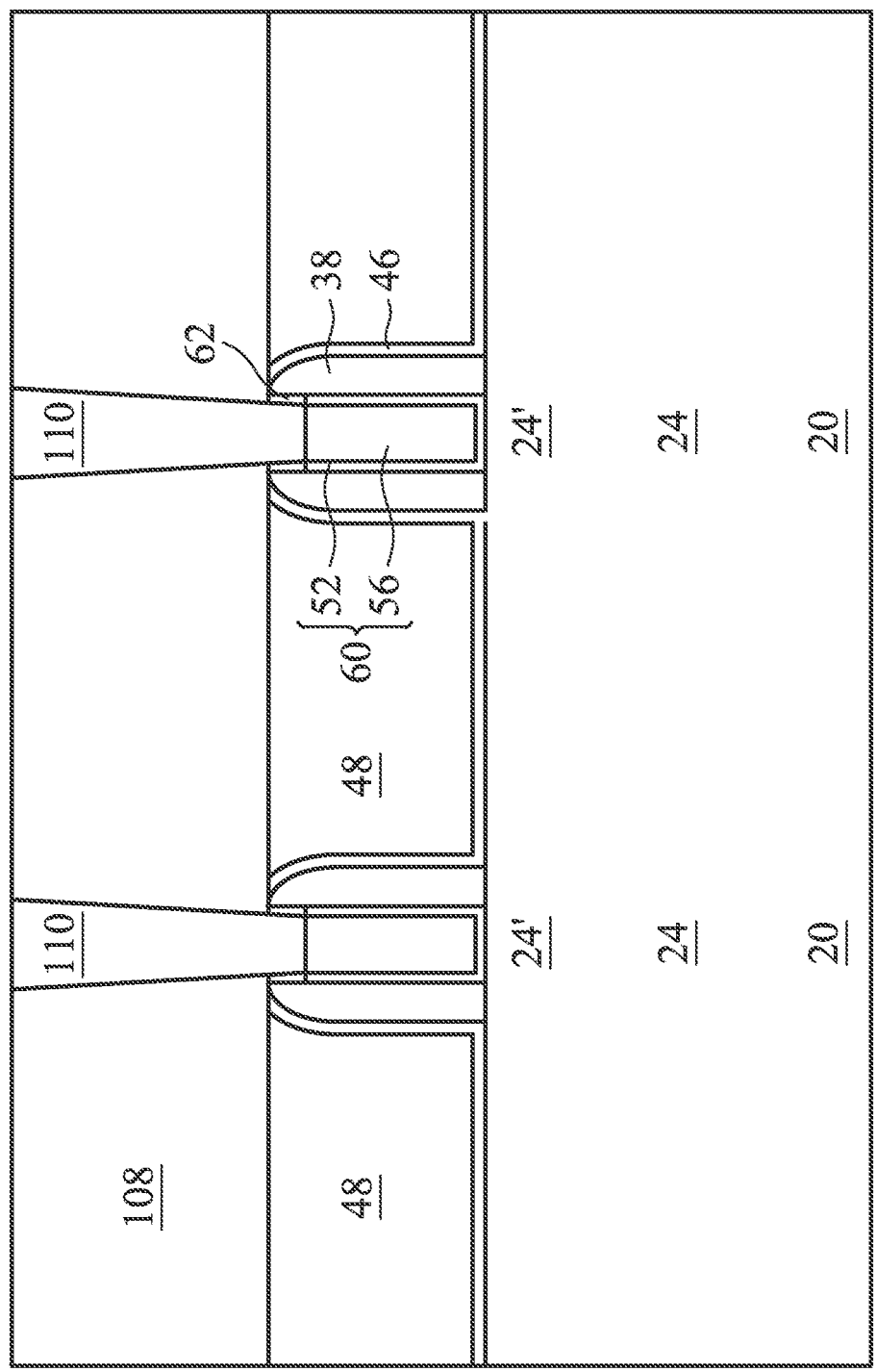

Also in FIGS. 30A, 30B, 30C, and 30D, gate contacts 110 and source/drain contacts 112 are formed through the second ILD 108 and the first ILD 48 in accordance with some embodiments. Openings for the source/drain contacts 112 are formed through the first ILD 48 and the second ILD 108, and openings for the gate contact 110 are formed through the second ILD 108 and the hard masks 62. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 42 and the source/drain contacts 112. The source/drain contacts 112 are physically and electrically coupled to the epitaxial source/drain regions 42, and the gate contacts 110 are physically and electrically coupled to the gate electrodes 106. However, gate contacts 110 coupled to one cut portion of the gates stacks 60 are electrically isolated from the gate contacts 110 coupled to another cut portion of the gate stacks 60 due to the dielectric region 82 and air gap 84. The source/drain contacts 112 and gate contacts 110 may be formed in different processes, or may be formed in the same process. Although shown as being formed in the same cross-section in FIG. 30D, it should be appreciated that each of the source/drain contacts 112 and gate contacts 110 may be formed in different cross-sections as illustrated in FIGS. 30A, 30B, and 30C, which may avoid shorting of the contacts.

Figure 31B:
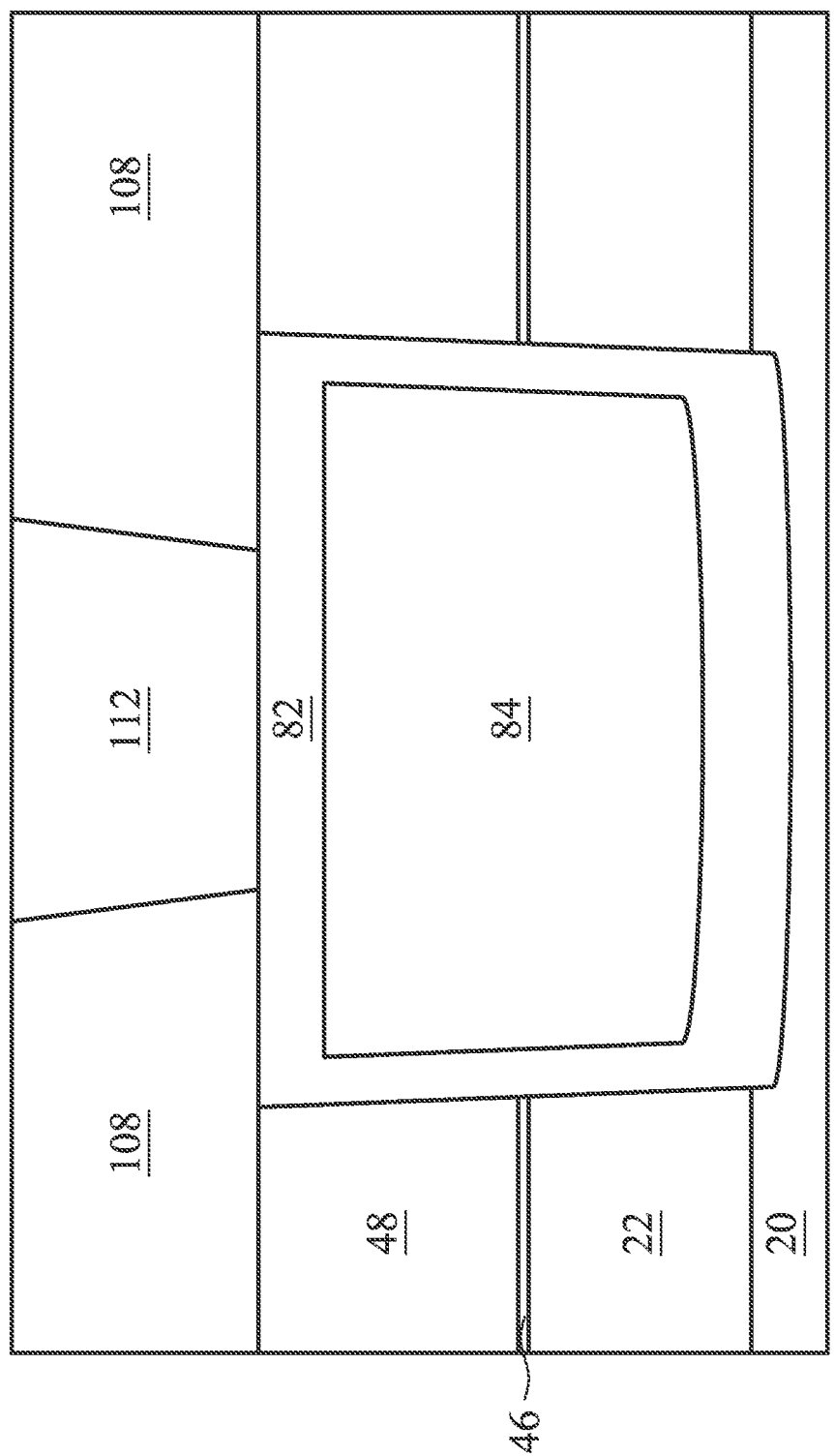
Figure 31C:
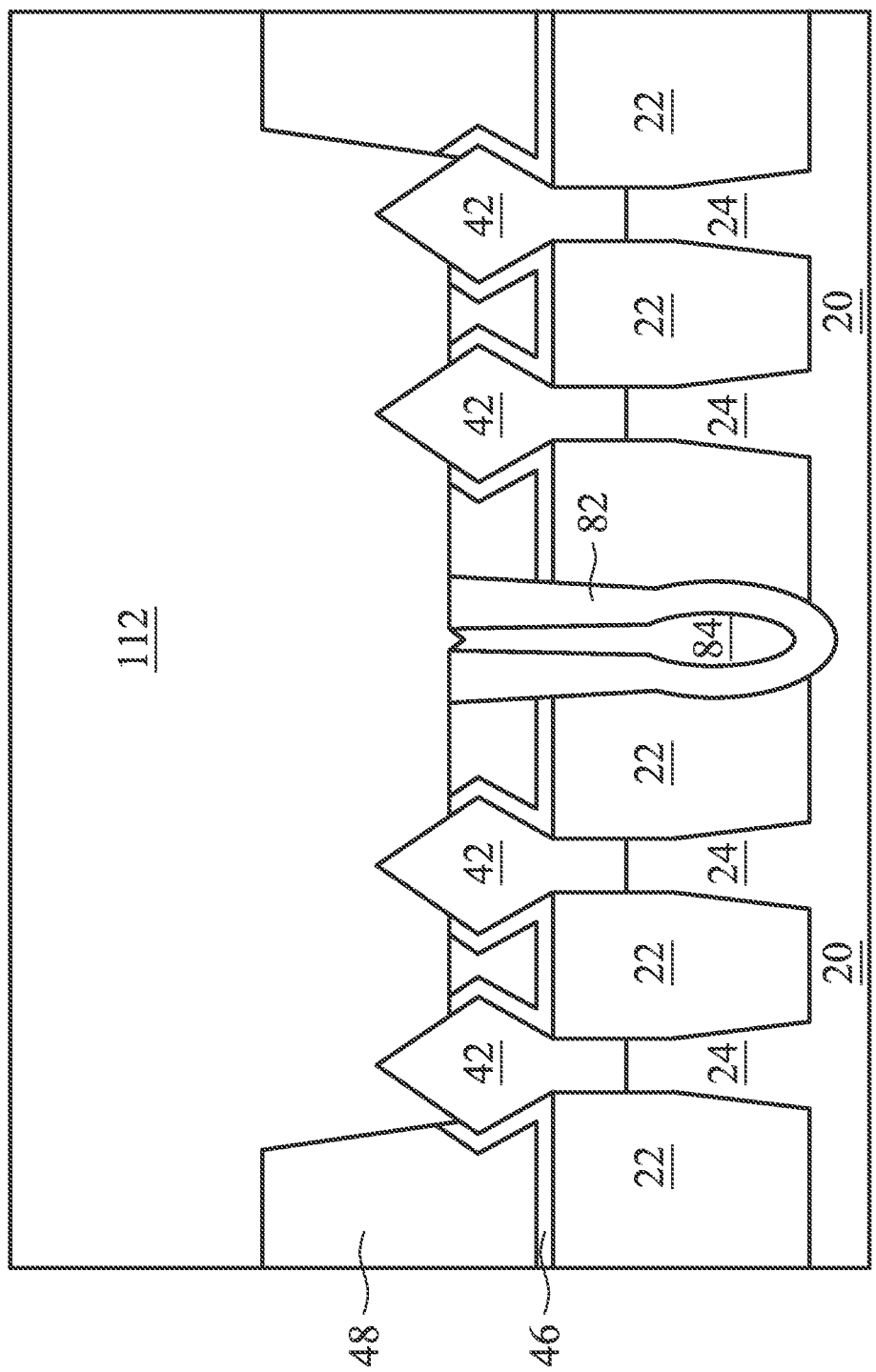

In FIGS. 31B and 31C, in some embodiments, the source/drain contacts 112 are formed to extend over the dielectric regions 82. In particular, in FIG. 31B the source/drain contacts 112 may run in a line over the dielectric regions 82, in some embodiments. Forming the source/drain contacts to run in a line may provide a simplification in the patterning and filling processes, such as discussed above with respect to FIGS. 30A, 30B, and 30C. In FIG. 31C, a lower portion of the source/drain contacts 112 extends through the ILD 48. An upper portion of the source/drain contacts 112 runs in a line over the dielectric regions 82. In some embodiments, the upper portion and lower portions of the source/drain contacts 112 may be formed in different processes, for example, by forming the lower portion of the source/drain contacts 112 prior to depositing the ILD 108. In other embodiments, the upper portion and lower portions of the source/drain contacts 112 may be formed in the same process. As illustrated in FIG. 31C, the lower portion of the source/drain contacts 112 (including the liner and/or conductive material of the source/drain contacts 112) may extend partially into the air gap 84.

Figure 32:
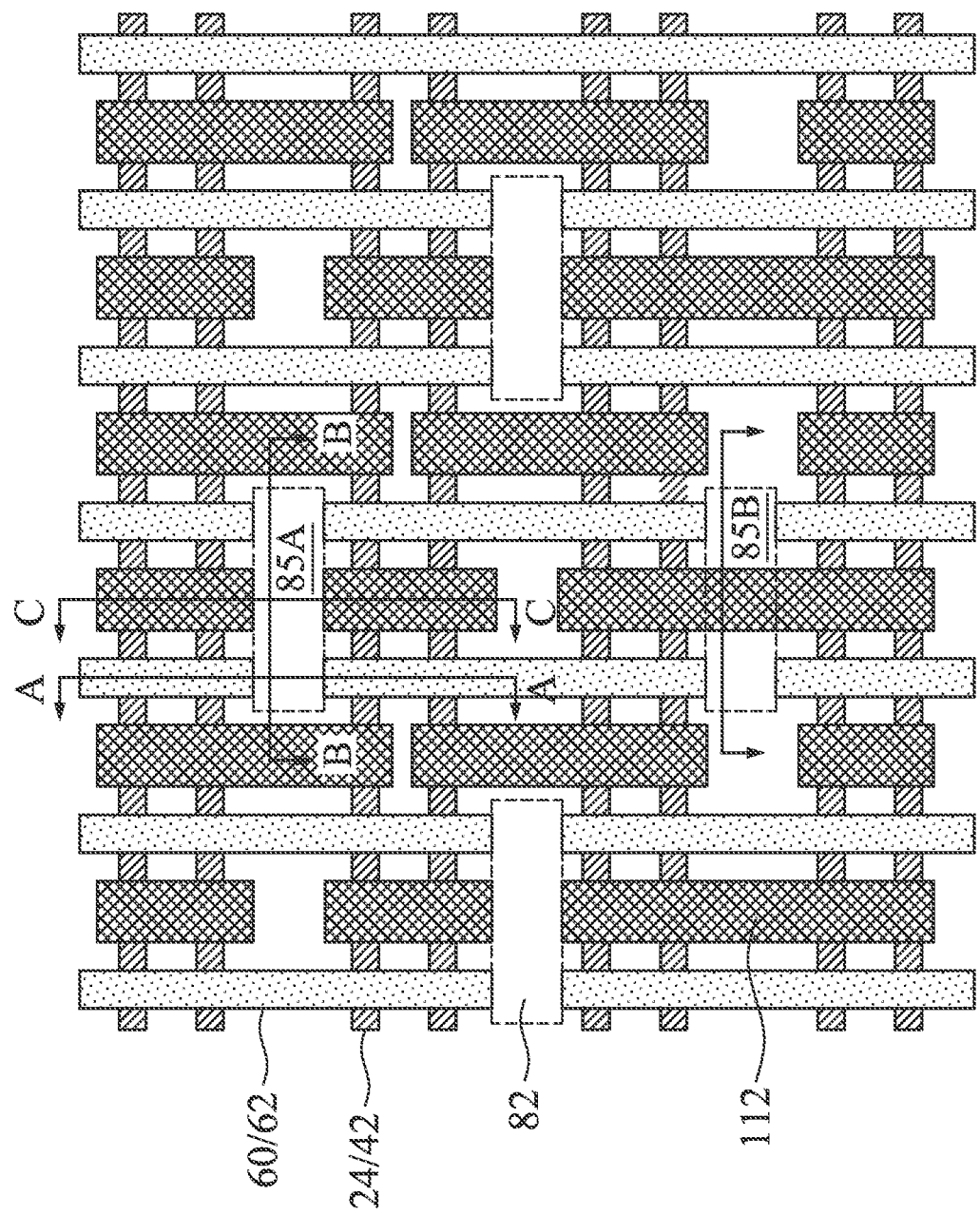

FIG. 32 illustrates a top down view of an example portion of a layout of FinFETs, in accordance with some embodiments. FIG. 32 is similar to FIG. 22, but it also illustrates the source/drain contacts 112. In this view, the ILD 48 and the ILD 108 are not shown so as to illustrate the gate stacks 60 and the fins 24 more clearly. A first set of vertical lines corresponds to the gate stacks 60 and/or hard masks 62 and a second set of vertical lines corresponds to the source/drain contacts 112. The horizontal lines correspond to the fins 24 and/or source/drain regions 42. The dashed areas correspond to the dielectric regions 82 which were filled into the corresponding openings 70 after the gate stacks 60 were cut (see FIGS. 27A, 27B, and 27C). The boxes marked 85A and 85B are each a gate cut region of the FinFETs. In the box marked 85A, the source/drain contacts 112 do not extend over the cut portion (see, e.g., FIG. 30B). In the box marked 85B, the source/drain contacts 112 extend over the cut portion (see, e.g., FIG. 31B).

Figure 33:
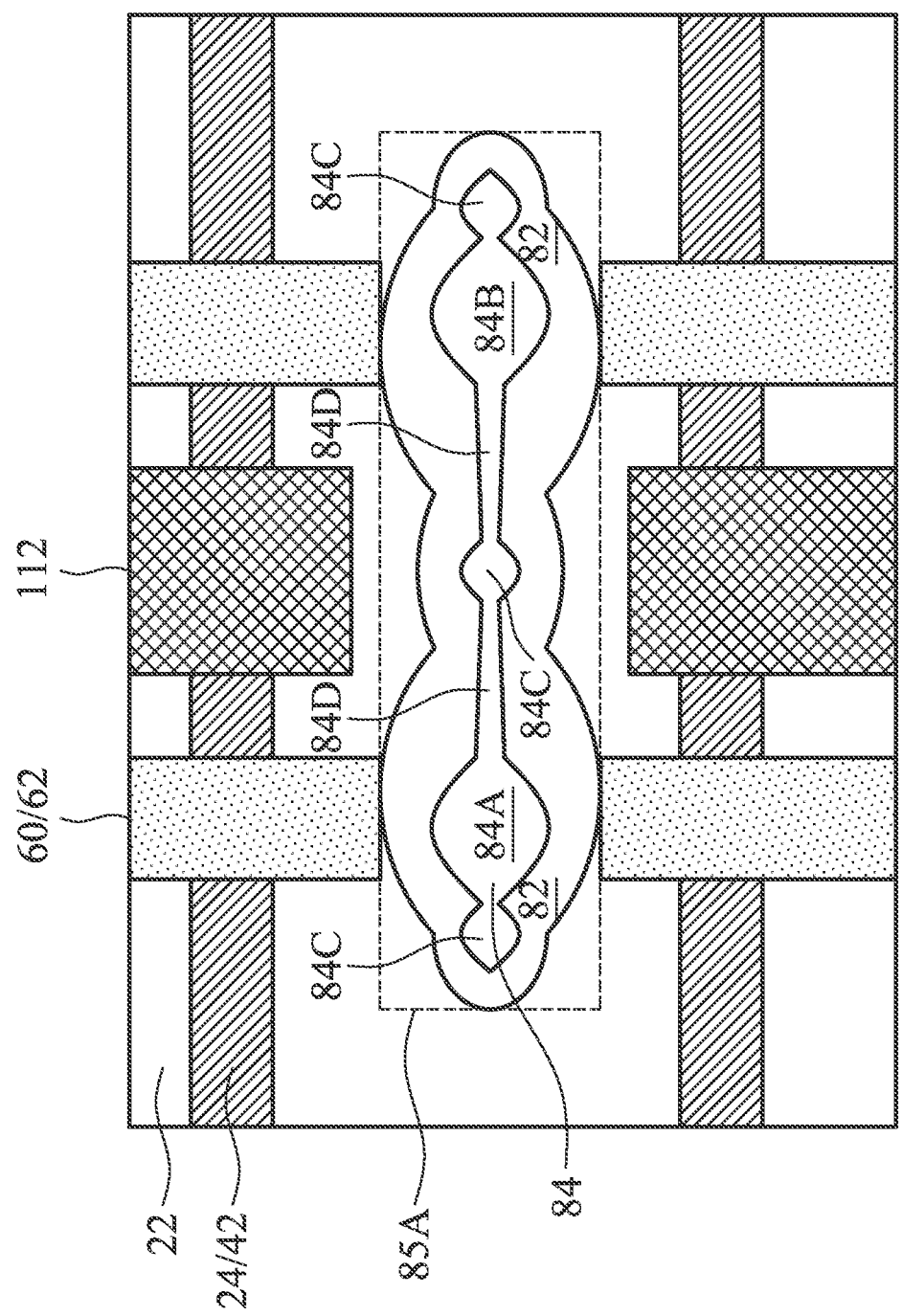
Figure 34:
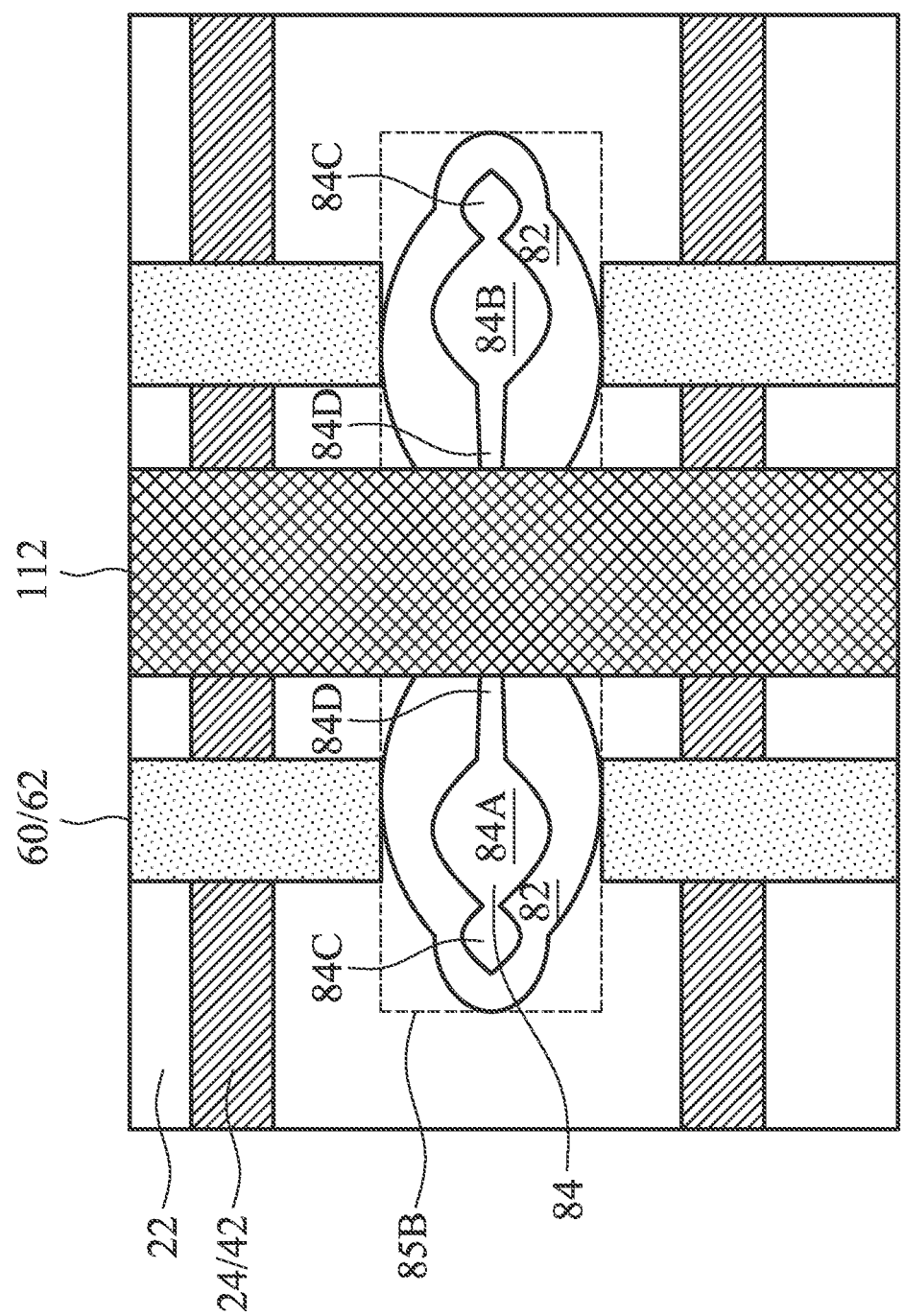

FIGS. 32 and 33 each illustrate a top down view of an enlarged portion of FIG. 31. FIG. 32 illustrates a top down view of the box marked 85A in FIG. 31. A portion of the dielectric region 82 is removed in this view to illustrate the air gap 84. This view is similar to the view illustrated in FIG. 26D, after the dielectric region 82 has been formed to fill in the opening 70. As illustrated in FIG. 33, the air gap 84 has a similar shape to the outline of the dielectric region 82. In some embodiments, the air gap 84A and air gap 84B may be oval shaped or rhombus shaped (or a combination where a rhombus has rounded sides). In some embodiments, between and adjacent to each of the air gaps 84A and 84B, another air gap 84C may be formed which may also be oval shaped or rhombus shaped (or a combination), where the air gap 84C is about half the width of the air gaps 84A. In some embodiments, such as illustrated in FIG. 33, each of the air gaps 84A, 84B, and 84C may merge together, connected by air gap 84D on either side of air gap 84C to form a continuous air gap 84 which may have a bow-tie shaped opening, a dog-bone shaped opening, or a peanut shaped opening. In some embodiments, the air gap 84D may pinch off on either side or both sides of the air gap 84C so that the air gap 84 is not continuous. FIG. 34 is similar to FIG. 33, illustrating a top down view of the box marked 85B in FIG. 31, illustrating an embodiment where source/drain contacts 112 continue over the dielectric regions 82 and air gap 84.

Embodiment processes and devices advantageously dispose an air gap or void between two cut ends of a replacement gate (e.g., metal gate) of adjacent FinFET devices, resulting from a replacement gate cutting process. The air gap or void provides better insulating properties over a dielectric material alone and as such, the leakage current from one metal gate to the adjacent metal gate (resulting from the cutting of a larger metal gate structure) is reduced. Additional advantages include that the air gap may have a bulb-shaped portion extending below a lower depth of the metal gate structure, with a tail extending upward between the cut gate ends.

A method includes etching a gate stack to form a trench extending through the gate stack, the gate stack including a metal gate electrode, a gate dielectric, and a pair of gate spacers, the trench removing a portion of the gate stack to separate the gate stack into a first gate stack portion and a second gate stack portion. The trench is extended into an isolation region under the gate stack. A dielectric material is deposited in the trench to form a dielectric region, the dielectric region having an air gap in the dielectric material. The air gap extends upward from a first depth corresponding to the isolation region to a second depth corresponding to a depth of the metal gate electrode of the first gate stack portion. A first contact is formed to the metal gate electrode of the first gate stack portion. A second contact is formed to the metal gate electrode of the second gate stack portion, the first contact being electrically isolated from the second contact. A third contact is formed to a source/drain region disposed adjacent to the first gate stack portion. In an embodiment, extending the trench into the isolation region forms a bulb-shaped cross-section at a bottom of the trench. In an embodiment, the air gap has a bulb-shaped cross-section at position corresponding to the bottom of the trench. In an embodiment, depositing the dielectric material includes forming a silicon nitride layer. In an embodiment, the method further includes patterning a substrate to form lengthwise semiconductor fins, forming the isolation region between the semiconductor fins, forming a dummy gate stack over the semiconductor fins and over the isolation region in a lengthwise direction perpendicular to the semiconductor fins, forming the source/drain region adjacent the dummy gate stack, replacing the dummy gate stack with the gate stack, forming a first inter-layer dielectric (ILD) over the source/drain region, and planarizing an upper surface of the first ILD until the upper surface of the first ILD is level with an upper surface of the gate stack. In an embodiment, the method further includes, when etching the gate stack, etching a portion of the first ILD on either side of the gate stack. In an embodiment, etching of the gate stack includes forming a hard mask layer over the gate stack, patterning the hard mask layer to form an opening in the hard mask layer over the gate stack and between two adjacent source/drain regions, and etching the gate stack through the opening in one or more etching cycles. In an embodiment, the method further includes extending the trench into a semiconductor substrate under the isolation region.

Another embodiment is a device including a first fin field effect transistor (FinFET) including a first fin extending from a substrate, a first source/drain region disposed in the first fin, a first isolation region surrounding a lower portion of the first fin, and a first gate electrode over and perpendicular to the first fin and over the first isolation region. The device also includes a second FinFET including a second fin extending from the substrate, a second source/drain region disposed in the second fin, a second isolation region surrounding a lower portion of the second fin, and a second gate electrode over and perpendicular to the second fin and over the second isolation region, the second FinFET being adjacent the first FinFET, the first gate electrode being in line with the second gate electrode. The device further includes a dielectric region disposed between the first gate electrode and the second gate electrode, the first gate electrode electrically isolated from the second gate electrode by the dielectric region, the dielectric region including a first dielectric material and an air gap disposed within the first dielectric material. In an embodiment, the first isolation region is continuous with the second isolation region and together include a third isolation region, where the dielectric region and the air gap disposed within the dielectric region extend into the third isolation region. In an embodiment, the dielectric region includes a lower portion and an upper portion where a neck between the lower portion and the upper portion is narrower than a width of the lower portion. In an embodiment, the air gap extends from a first depth upwards to a second depth, where the first depth is deeper than a lower surface of the first gate electrode, where the second depth is disposed at a depth between an upper surface of the first gate electrode and the lower surface of the first gate electrode. In an embodiment, the air gap includes a bulb-shaped portion at a depth substantially below the lower surface of the first gate electrode and a tail portion extending upward from the bulb-shaped portion. In an embodiment, the air gap includes a void at a vacuum. In an embodiment, the dielectric region extends at least halfway into the second isolation region.

Another embodiment is a device including a first metal gate corresponding to a first fin field effect transistor (FinFET), the first metal gate extending over a first fin perpendicular to the first fin and over an isolation material surrounding a bottom portion of the first fin. The device also includes a second metal gate corresponding to a second FinFET, the second metal gate extending over a second fin perpendicular to the second fin and over the isolation material, the isolation material surrounding a bottom portion of the second fin. The device further includes a dielectric material disposed between a first end of the first metal gate and a second end of the second metal gate. A void is disposed in the dielectric material, the void being between the first end of the first metal gate and the second end of the second metal gate. In an embodiment, the void extends laterally beyond a width of the first metal gate, where the void extends into a first inter-layer dielectric (ILD) disposed over the first fin. In an embodiment, a height of the void in the first ILD is less than a height of the void between the first end of the first metal gate and the second end of the second metal gate. In an embodiment, the void includes a first portion having a bulb shape and a second portion having a tail shape, the tail shape extending upward from the bulb shape. In an embodiment, the first portion of the void is disposed within a portion of the dielectric material contacting the isolation material, and the second portion of the void is disposed within a portion of the dielectric material between the first end of the first metal gate and the second end of the second metal gate. In an embodiment, the dielectric material includes a neck between a lower bulb shaped portion and an upper trapezoidal portion, the void extending through the neck. In an embodiment, outer walls of the dielectric material taper narrower from an upper surface of the dielectric material to a necking of the dielectric material, the outer walls of the dielectric material expand outwardly and having a curvilinear shape in cross-section below the necking.

Another embodiment is a device including a gate stack, the gate stack having a lengthwise direction transverse to a semiconductor fin, the gate stack including a gate electrode, a gate dielectric, a pair of gate spacers disposed on opposing sides of the gate electrode and a separation region between two sections of the gate electrode, the separation region dissecting the two sections of the gate electrode. The device also includes a first isolation region disposed underneath the two sections of the gate electrode, the separation region extending into the first isolation region. The device also includes a second isolation region laterally surrounding the pair of gate spacers, the separation region extending into the first isolation region. The device also includes the separation region including: a dielectric material defining outer boundaries of the separation region, the dielectric material having a first interface with the first isolation region and a second interface with the second isolation region, and an air gap surrounded by the dielectric material, the air gap extending upward from a first depth corresponding to the first isolation region to a second depth corresponding to a depth of the gate electrode of the gate stack. The device also includes a first contact physically coupled to the gate electrode of a first section of the two sections of the gate electrode. The device also includes a second contact physically coupled to the gate electrode of a second section of the two sections of the gate electrode. The device also includes a third contact physically coupled to a source/drain region disposed adjacent to the gate stack. In an embodiment, the air gap has a bulb shape portion surrounded by the first isolation region and a tail shape portion disposed immediately between the two sections of the gate electrode. In an embodiment, the air gap includes a neck between an upper portion of the air gap and a lower portion of the air gap. In an embodiment, the separation region extends completely through a thickness of the first isolation region. In an embodiment, the separation region extends into a substrate disposed underneath the first isolation region. In an embodiment, a material of the second isolation region is different than the dielectric material. In an embodiment, the air gap has an upper surface coinciding with a portion of the third contact. In an embodiment, in a plan view, the air gap includes a first enlarged portion disposed immediately between the two sections of the gate electrode, a second enlarged portion disposed on a first side of the gate stack, and a third enlarged portion disposed on a second side of the gate stack, the first enlarged portion being larger than the second and third enlarged portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first Fin Field Effect Transistor (FinFET) comprising a first fin extending from a substrate and having a longitudinal axis extending in a first direction, a first source/drain region disposed in the first fin, a first isolation region surrounding a lower portion of the first fin, and a first gate electrode over and perpendicular to the first fin and over the first isolation region;
   a second FinFET comprising a second fin extending from the substrate and having a longitudinal axis extending in the first direction, a second source/drain region disposed in the second fin, a second isolation region surrounding a lower portion of the second fin, and a second gate electrode over and perpendicular to the second fin and over the second isolation region, the second FinFET being adjacent the first FinFET, the first gate electrode being in line with the second gate electrode; and
   a dielectric region disposed between the first gate electrode and the second gate electrode, the first gate electrode electrically isolated from the second gate electrode by the dielectric region, the dielectric region comprising a first dielectric material and an air gap disposed within the first dielectric material, the dielectric region extending at least halfway into the second isolation region, wherein the dielectric region has a first width, in a second direction perpendicular to the first direction, at a first point above a topmost surface of the first isolation region, and the dielectric region has a second width greater than the first width in the second direction, at a second point below the topmost surface of the first isolation region.

2. The device of claim 1, wherein the first isolation region is continuous with the second isolation region and together comprise a third isolation region, wherein the dielectric region and the air gap disposed within the dielectric region extend into the third isolation region.

3. The device of claim 2, wherein the dielectric region comprises a lower portion and an upper portion wherein a neck between the lower portion and the upper portion is narrower than a width of the lower portion.

4. The device of claim 1, wherein the air gap extends from a first depth upwards to a second depth, wherein the first depth is deeper than a lower surface of the first gate electrode, wherein the second depth is disposed at a depth between an upper surface of the first gate electrode and the lower surface of the first gate electrode.

5. The device of claim 4, wherein the air gap comprises a bulb-shaped portion at a depth substantially below the lower surface of the first gate electrode and a tail portion extending upward from the bulb-shaped portion.

6. The device of claim 1, wherein the air gap comprises a void at a vacuum.

7. A device comprising:
a first metal gate corresponding to a first Fin Field Effect Transistor (FinFET), the first metal gate extending over a first fin perpendicular to the first fin and over an isolation material surrounding a bottom portion of the first fin;
a second metal gate corresponding to a second FinFET, the second metal gate extending over a second fin perpendicular to the second fin and over the isolation material, the isolation material surrounding a bottom portion of the second fin;
a dielectric material disposed between a first end of the first metal gate and a second end of the second metal gate, outer walls of the dielectric material tapering narrower from an upper surface of the dielectric material to a necking of the dielectric material, the outer walls of the dielectric material expanding outwardly and having a curvilinear shape in cross-section below the necking; and
a void disposed in the dielectric material, the void being between the first end of the first metal gate and the second end of the second metal gate;
wherein the void comprises a first portion having a bulb shape and a second portion having a tail shape, the tail shape extending upward from the bulb shape, wherein the first portion of the void is disposed within a portion of the dielectric material contacting the isolation material, and wherein the second portion of the void is disposed within a portion of the dielectric material between the first end of the first metal gate and the second end of the second metal gate.

8. The device of claim 7, wherein the void extends laterally beyond a width of the first metal gate, wherein the void extends into a first inter-layer dielectric (ILD) disposed over the first fin.

9. The device of claim 8, wherein a height of the void in the first ILD is less than a height of the void between the first end of the first metal gate and the second end of the second metal gate.

10. The device of claim 7, wherein the dielectric material comprises a neck between a lower bulb shaped portion and an upper trapezoidal portion, the void extending through the neck.

11. A device comprising:
a gate stack, the gate stack having a lengthwise direction transverse to a semiconductor fin, the gate stack comprising a gate electrode, a gate dielectric, a pair of gate spacers disposed on opposing sides of the gate electrode and a separation region between two sections of the gate electrode, the separation region dissecting the two sections of the metal gate electrode;
a first isolation region disposed underneath the two sections of the metal gate electrode, the separation region extending into the first isolation region;
a second isolation region laterally surrounding the pair of gate spacers, the separation region extending into the first isolation region;
the separation region comprising:
a dielectric material defining outer boundaries of the separation region, the dielectric material having a first interface with the first isolation region and a second interface with the second isolation region, and
an air gap surrounded by the dielectric material, the air gap extending upward from a first depth corresponding to the first isolation region to a second depth corresponding to a depth of the metal gate electrode of the gate stack;
a first contact physically coupled to the metal gate electrode of a first section of the two sections of the metal gate electrode;
a second contact physically coupled to the metal gate electrode of a second section of the two sections of the metal gate electrode; and
a third contact physically coupled to a source/drain region disposed adjacent to the gate stack.

12. The device of claim 11, wherein the air gap has a bulb shape portion surrounded by the first isolation region and a tail shape portion disposed immediately between the two sections of the gate electrode.

13. The device of claim 11, wherein the air gap includes a neck between an upper portion of the air gap and a lower portion of the air gap.

14. The device of claim 11, wherein the separation region extends completely through a thickness of the first isolation region.

15. The device of claim 11, wherein the separation region extends into a substrate disposed underneath the first isolation region.

16. The device of claim 11, wherein a material of the second isolation region is different than the dielectric material.

17. The device of claim 11, wherein the air gap has an upper surface coinciding with a portion of the third contact.

18. The device of claim 11, wherein in a plan view the air gap includes a first enlarged portion disposed immediately between the two sections of the gate electrode, a second enlarged portion disposed on a first side of the gate stack, and a third enlarged portion disposed on a second side of the gate stack, the first enlarged portion being larger than the second and third enlarged portions.

* * * * *